(12) United States Patent
Mann et al.

(10) Patent No.: US 7,682,031 B2
(45) Date of Patent: Mar. 23, 2010

(54) CATOPTRIC OBJECTIVES AND SYSTEMS USING CATOPTRIC OBJECTIVES

(75) Inventors: Hans-Jurgen Mann, Oberkochen (DE); David Shafer, Fairfield, CT (US); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/317,851

(22) Filed: Dec. 22, 2005

(65) Prior Publication Data

US 2006/0232867 A1 Oct. 19, 2006

Related U.S. Application Data

(60) Provisional application No. 60/665,036, filed on Mar. 24, 2005, provisional application No. 60/695,455, filed on Jun. 30, 2005, provisional application No. 60/698,909, filed on Jul. 13, 2005.

(30) Foreign Application Priority Data

Dec. 23, 2004 (DE) ............... 10 2004 063 313
Sep. 5, 2005 (DE) ............... 10 2005 042 005

(51) Int. Cl.
    *G02B 5/10* (2006.01)
(52) U.S. Cl. ............... 359/859; 359/857; 359/858; 359/861
(58) Field of Classification Search ............... 359/858, 359/857, 859, 861
See application file for complete search history.

(56) References Cited

U.S. PATENT DOCUMENTS

| 5,003,567 | A | 3/1991 | Hawryluk et al. |
| 5,212,588 | A | 5/1993 | Viswanathan et al. |
| 5,686,728 | A | 11/1997 | Shafer |
| 5,812,309 | A | 9/1998 | Thoma et al. |
| 5,815,310 | A | 9/1998 | Williamson |
| 6,033,079 | A | 3/2000 | Hudyma |
| 6,195,201 | B1 | 2/2001 | Koch et al. |
| 6,198,793 | B1 | 3/2001 | Schultz et al. |
| 6,240,158 | B1 | 5/2001 | Oshino |
| 6,244,717 | B1 | 6/2001 | Dinger |

(Continued)

FOREIGN PATENT DOCUMENTS

DE                33 43 868                6/1985

(Continued)

OTHER PUBLICATIONS

Hudyma, "An Overview of Optical Systems for 30 nm Resolution Lithography at EUV Wavelenghts," Proceedings of SPIE, vol. 4832, 2002.

(Continued)

*Primary Examiner*—Joshua L Pritchett
(74) *Attorney, Agent, or Firm*—Fish & Richardson P.C.

(57) ABSTRACT

In general, in one aspect, the invention features an objective arranged to image radiation from an object plane to an image plane, including a plurality of elements arranged to direct the radiation from the object plane to the image plane, wherein the objective has an image side numerical aperture of more than 0.55 and a maximum image side field dimension of more than 1 mm, and the objective is a catoptric objective.

49 Claims, 36 Drawing Sheets

U.S. PATENT DOCUMENTS

| | | |
|---|---|---|
| 6,359,678 B1 | 3/2002 | Ota |
| 6,452,661 B1 | 9/2002 | Komatsuda |
| 6,512,641 B2 | 1/2003 | Omura |
| 6,549,270 B1 | 4/2003 | Ota |
| 6,710,917 B2 | 3/2004 | Mann et al. |
| 6,750,948 B2 | 6/2004 | Omura |
| 6,867,913 B2 | 3/2005 | Mann et al. |
| 6,894,834 B2 * | 5/2005 | Mann et al. ............ 359/366 |
| 2001/0038446 A1 | 11/2001 | Takahashi |
| 2004/0114217 A1 | 6/2004 | Mann et al. |
| 2004/0165282 A1 | 8/2004 | Sunaga et al. |
| 2004/0252358 A1 | 12/2004 | Kawahara et al. |

FOREIGN PATENT DOCUMENTS

| | | |
|---|---|---|
| EP | 1069448 A1 | 1/2001 |
| EP | 1 093 021 | 4/2001 |
| EP | 1093021 | 4/2001 |
| EP | 11 99 590 | 4/2002 |
| EP | 1 225 481 | 7/2002 |
| EP | 1 434 093 | 6/2004 |
| EP | 1 450 196 | 8/2004 |
| EP | 1450196 | 8/2004 |
| JP | 3-041328 | 2/1991 |
| JP | 11-110791 | 4/1999 |
| JP | 2003114387 | 4/2003 |
| TW | 476943 | 2/2002 |
| TW | 226938 | 1/2005 |
| WO | WO 2004/010224 | 1/2004 |

OTHER PUBLICATIONS

H. Russell, "An Overview of Optical Systems for 30nm Resolution Lithography at EUV Wavelengths," Proceedings of SPIE, vol. 4832, Dec. 2002, pp. 137-148.

European Search Report.

Bal, Matthieu Frédéric, dissertation "Next-Generation Extreme Ultraviolet Lithographic Projection Systems", Feb. 10, 2003.

* cited by examiner

US 7,682,031 B2

CATOPTRIC OBJECTIVES AND SYSTEMS USING CATOPTRIC OBJECTIVES

CROSS-REFERENCE TO RELATED APPLICATIONS

Under 35 U.S.C. § 119(e)(1), this application claims benefit of U.S. Provisional Application No. 60/665,036, filed Mar. 24, 2005, U.S. Provisional Application No. 60/695,455, filed Jun. 30, 2005, and U.S. Provisional Application No. 60/698,909, filed Jul. 13, 2005. Under 35 U.S.C. § 119, this application claims priority to German Patent Application No. DE 10 2004 063 313.4, filed Dec. 23, 2004, and German Patent Application No. DE 10 2005 042 005.2, filed Sep. 5, 2005.

TECHNICAL FIELD

This disclosure relates to catoptric projection objectives and to systems that use catoptric projection objectives.

BACKGROUND

Projection objectives are widely used in microlithography to transfer a pattern from a reticle to a substrate by forming an image of the reticle on a layer of a photosensitive material disposed on the substrate. In general, projection objectives fall into three different classes: dioptric objectives; catoptric objectives; and catadioptric objectives. Dioptric objectives use refractive elements (e.g., lens elements) to image light from an object plane to an image plane. Catoptric objectives use reflective elements (e.g., mirror elements) to image light from an object plane to an image plane. Catadioptric objectives use both refractive and reflective elements to image light from an object plane to an image plane.

SUMMARY

In general, in one aspect, the invention features an objective arranged to image radiation from an object plane to an image plane. The objective includes a plurality of elements arranged to direct the radiation from the object plane to the image plane. The objective has an image side numerical aperture of more than 0.55 and a maximum image side field dimension of more than 1 mm, and the objective is a catoptric objective.

In general, in another aspect, the invention features an objective arranged to image radiation from an object plane to an image plane. The objective includes a plurality of elements arranged to direct the radiation from the object plane to the image plane. The objective has an image side numerical aperture of more than 0.55, a distance between the object plane and the image plane is less than 2 m, and the objective is a catoptric objective.

In general, in a further aspect, the invention features an objective arranged to image radiation of wavelength λ from an object plane to an image plane. The objective includes a plurality of mirrors arranged to direct the radiation from the object plane to the image plane. The objective has an image side numerical aperture of more than 0.55 and a maximum image side field dimension of more than 1 mm, and λ is about 100 nm or less.

In general, in another aspect, the invention features an objective arranged to image radiation from an object plane to an image plane. The objective includes a plurality of elements arranged to direct the radiation from the object plane to the image plane, the plurality of elements including a first element, a second element, and a third element, where each of the first, second, and third elements have an opening for passage of the radiation from the object plane to the image plane. The objective has an image side numerical aperture of more than 0.55 and the objective is a catoptric objective.

In general, in a further aspect, the invention features an objective arranged to image radiation from an object plane to an image plane. The objective includes a plurality of elements arranged to direct the radiation from the object plane to the image plane, the plurality of elements including a first element and the first element does not have an opening. The objective has an image side numerical aperture of more than 0.55, and the objective is a catoptric objective.

In general, in another aspect, the invention features an objective arranged to image radiation from an object plane to an image plane. The objective includes a plurality of elements arranged to direct the radiation from the object plane to the image plane, the plurality of elements including a first element and a second element, where the first element does not have an opening and the second element does have an opening for passage of the radiation from the object plane to the image plane. The objective has a field independent obscuration related to the opening that is less than 30% of an aperture radius at a pupil plane and has an image side numerical aperture of about 0.4 or more, and the objective is a catoptric objective.

In general, in a further aspect, the invention features an objective arranged to image radiation from an object plane to an image plane. The objective includes a plurality of elements arranged to direct the radiation from the object plane to the image plane where, for a meridional section of the objective, the radiation has a maximum angle of incidence on a surface of each of the elements of less than 22°. The objective has an image side numerical aperture of more than 0.4 and the objective is a catoptric objective.

In general, in another aspect, the invention features an objective arranged to image radiation from an object plane to an image plane. The objective includes a plurality of elements arranged to direct the radiation from the object plane to the image plane, the plurality of elements including a first element and the first element has an opening for passage of the radiation from the object plane to the image plane. The objective has an image side numerical aperture of more than 0.55 and the objective is a catoptric objective.

In general, in a further aspect, the invention features an objective arranged to image radiation of wavelength λ from an object plane to an image plane. The objective includes ten elements arranged to direct the radiation from the object plane to the image plane. The objective is a catoptric objective and λ is about 800 nm or less.

In general, in another aspect, the invention features an objective arranged to image radiation from an object plane to an image plane. The objective includes a plurality of elements arranged to direct the radiation from the object plane to the image plane, the plurality of elements comprising a first element, a second element, a third element, a fourth element, and a fifth element, where the first, second, third, and fourth elements each include an opening for passage of the radiation from the object plane to the image plane and the fifth element does not include an opening. The objective is a catoptric objective.

In general, in a further aspect, the invention features an objective arranged to image radiation from an object plane to an image plane. The objective includes a plurality of elements arranged to direct the radiation from the object plane to the image plane, the plurality of elements comprising a first element and a second element, where the first element does not include an opening and the second element has a concave surface and is arranged so that the radiation contacts the concave surface and the second element is the second to last element in a path of the radiation from the object plane to the image plane. The objective is a catoptric objective.

In general, in another aspect, the invention features an objective arranged to image radiation of wavelength λ from an object plane to an image plane. The objective includes a first group of mirrors arranged to image the radiation from the object plane to a first intermediate-image plane, the first group of mirrors comprising a first mirror where the first mirror does not include an opening for passage of the radiation from the object plane to the image plane; and a second group of mirrors arranged to image the radiation from the intermediate-image plane to the image plane, the second group of mirrors comprising a second mirror and a third mirror, where the second and third mirrors each include a concave surface and an opening for passage of the radiation from the object plane to the image plane, the second and third mirrors being arranged so that the radiation contacts the respective concave surfaces of the second and third mirrors, wherein λ is about 800 nm or less.

In general, in a further aspect, the invention features an objective arranged to image radiation of wavelength λ from an object plane to an image plane. The objective includes a first group of mirrors arranged to image the radiation from the object plane to a first intermediate-image plane, the first group of mirrors comprising a first mirror where the first mirror does not include an opening for passage of the radiation from the object plane to the image plane; and a second group of elements arranged to image the radiation from the intermediate-image plane to the image plane, the second group of elements comprising a second mirror, where the second mirror includes a concave surface and is the next-to-last mirror in a path of the radiation from the object plane to the image plane and the second mirror is arranged so that the radiation contacts the concave surface, wherein λ is about 800 nm or less.

In general, in another aspect, the invention features an objective arranged to image radiation from an object plane to an image plane. The objective includes a plurality of elements arranged to direct the radiation from the object plane to the image plane, the plurality of elements including a first element that includes an opening for passage of the radiation from the object plane to the image plane; and a stop positioned between the object plane and the image plane, the stop being separate from each of the plurality of elements. The opening in the first element results in an obscuration of an aperture of the objective at an exit pupil and the stop is configured to reduce variations of the obscuration as a function of a position with respect to the exit pupil, and wherein the objective is a catoptric objective.

In general, in a further aspect, the invention features an objective arranged to image radiation from an object plane to an image plane. The objective includes a plurality of elements arranged to direct the radiation from the object plane to the image plane; and a stop positioned substantially at a pupil plane of the objective, the stop being configured to substantially block radiation from the object plane, where the stop is separate from each of the plurality of elements. The objective is a catoptric objective.

In general, in another aspect, the invention features an objective arranged to image radiation from an object plane to an image plane. The objective includes a plurality of elements arranged to direct the radiation from the object plane to the image plane where, for a meridional section of the objective, the radiation has a maximum angle of incidence on the elements of less than 20°. The objective has an image side numerical aperture of about 0.4 or more and the objective is a catoptric objective.

Embodiments of the objectives may include one or more of the following features.

In some embodiments, the plurality of elements includes no more than six elements (e.g., five element, four elements, three elements, two elements, one element). Alternatively, in certain embodiments, the plurality of elements includes more than six elements (e.g., seven elements, eight elements, nine elements, 10 elements, 11 elements, 12 elements, 13 elements, 14 elements, 15 elements, 16 elements).

The plurality of elements can include at least one element that has an opening for passage of the radiation from the object plane to the image plane. The objective can have a field independent obscuration related to the opening that is less than about 40% (e.g., about 35% or less, about 30% or less, about 25% or less, about 20% or less, about 15% or less) of an aperture radius at a pupil plane of the objective. The plurality of elements can include two elements that have an opening for passage of the radiation from the object plane to the image plane. The plurality of elements can include at least one element that does not have an opening. In some embodiments, the plurality of elements includes six elements that do not have an opening.

The plurality of elements can include at least one element that has a concave surface, where the element is arranged so that the radiation contacts the concave surface. In certain embodiments, the plurality of elements includes four elements that each have a concave surface, where the four elements are arranged so that the radiation contacts each element's concave surface.

The plurality of elements can include at least one element that has a convex surface, where the element is arranged so that the radiation contacts the convex surface. In some embodiments, the plurality of elements includes four elements that each have a convex surface, where the four elements are arranged so that the radiation contacts each element's convex surface.

The plurality of elements can include a first group of elements and a second group of elements, the first group of elements being arranged to image the radiation from the object plane to a first intermediate-image plane, and the second group of elements being arranged to image the radiation from the intermediate-image plane to the image plane. In some embodiments, none of the elements in the first group of elements includes an opening. In certain embodiments, at least one of the elements in the second group of elements includes an opening for passage of the radiation from the object plane to the image plane. The second group of elements can include a first sub-group of elements and second sub-group of elements, the first sub-group of elements being arranged to image the radiation from the first intermediate-image plane to a second intermediate-image plane, and the second sub-group of elements being arranged to image the radiation from the second intermediate-image plane to the image plane.

The objective defines an optical axis and at least one of the elements can be rotationally symmetric with respect to the optical axis. In some embodiments, at least one of the elements is not rotationally symmetric with respect to the optical axis. The at least one element that is not rotationally symmetric with respect to the optical axis can correspond to a portion of a element that is rotationally symmetric about an axis.

The plurality of elements can include at least one aspherical element. In embodiments, each of the elements in the plurality of elements is an aspherical element.

For a meridional section of the objective, the radiation can have a maximum angle of incidence on a surface of each of the elements of about 20° or less (e.g., about 18° or less, about 17° or less, about 15° or less, about 12° or less, about 10° or less).

For a meridional section of the objective, the radiation can have a maximum range of incident angles on a surface of each of the elements of about 20° or less (e.g., about 18° or less, about 17° or less, about 15° or less, about 12° or less, about 10° or less, about 8° or less).

The objective can further include an aperture stop positioned substantially at a pupil plane of the objective. The objective can include a stop element positioned substantially at a pupil plane of the objective and the objective defines an optical axis that intersects the stop element. The stop element can obscure about 40% or less (e.g., about 35% or less, about 30% or less, about 25% or less, about 20% or less, about 15% or less) of an aperture radius at the pupil plane. The stop element can be a portion of one of the plurality of elements. In some embodiments, the stop element is remote from each of the plurality of elements. The stop element can reflect substantially no radiation directed by the elements from the object plane incident on the stop element. For example, the stop element can reflect about 5% or less (e.g., about 4% or less, about 3% or less, about 2% or less, about 1% or less, about 0.5% or less, 0.1% or less, 0.05% or less, 0.01% or less) of the radiation at 1 normally incident on the stop element. The stop element can include a substrate and a film on the substrate, the film being an anti-reflection film for radiation at $\lambda$.

The objective can image the radiation to at least one (e.g., two, three, four or more) intermediate-image plane in addition to the image plane.

A distance from the object plane to the image plane can be about 2,000 mm or less (e.g., about 1,800 mm or less, about 1,600 mm or less).

The radiation can have a wavelength $\lambda$ of about 200 nm or less (e.g., about 100 nm or less). In some embodiments, $\lambda$ is in a range from about 10 nm to about 20 nm.

The objective can have a maximum image side field dimension of about 5 mm or more (e.g., about 10 mm or more, about 12 mm or more).

The objective can have a maximum image side field radius of about 20 mm or less (e.g., about 15 mm or less, about 12 mm or less).

The objective can have a demagnification of about 8× or less (e.g., about 6× or less, about 4× or less).

The objective can have an image resolution of about 32 nm or less (e.g., about 25 nm or less, about 18 nm or less).

The objective can have an image-side root-mean-square wavefront error of about 0.1 $\lambda$ or less (e.g., about 0.07$\lambda$ or less, about 0.03$\lambda$ or less), where $\lambda$ is a wavelength of the radiation.

The objective can be telecentric with respect to the image plane.

A minimum distance between a surface of the elements and the image plane can be about 20 mm or more (e.g., about 25 mm or more, about 30 mm or more, about 35 mm or more).

Each element in the projection objective can reflect about 50% or more (e.g., about 60% or more, about 70% or more) of the radiation normally incident on a surface of the element.

At least some of the elements can include a plurality of layers of at least two different materials, wherein a thickness of each of the layers is about $\lambda$ or less, where $\lambda$ is a wavelength of the radiation. In some embodiments, one of the different materials includes silicon and another of the different materials comprises molybdenum. The thickness of each of the layers can be about $\lambda/4$. The plurality of layers can include about 20 or more layers.

In embodiments that include a stop (e.g., an obscuration stop), an optical axis of the objective can intersect the stop. The plurality of elements can include a first element and a second element and the stop can be positioned to block some of the radiation directed from the first element to the second element. The plurality of elements can include a first element, where the first element includes an opening for passage of the radiation from the object plane to the image plane. The stop can have a dimension corresponding to about 40% or less (e.g., about 30% or less) of a diameter of an aperture of the objective at the pupil plane.

In certain aspects, the invention features a lithography tool that can include any of the foregoing objectives.

Embodiments of the foregoing objectives can include any of the following advantages. For example, embodiments can include catoptric projection objectives that have a high image-side numerical aperture. A high image-side numerical aperture can provide high image resolution.

The projection objectives can have a high image-side numerical aperture and relatively little angular variation in the angle of incidence of rays on the reflective elements forming the projection objective. Accordingly, variations in the intensity of radiation reflected from the reflective elements can be reduced relative to projection objectives where radiation is incident on one or more reflective elements over a large range of incident angles. Reduced intensity variations can provide better image quality.

Projection objectives can have a high image-side numerical aperture and a relatively large image side working distance, providing sufficient space for accessing the image plane. For example, projection objectives can have an image-side working distance of about 15 mm or more.

In some embodiments, projection objectives are telecentric at the image plane. This can provide for constant or nearly constant image magnification over a range of image-side working distances.

In embodiments, projection objectives can include mirrors having openings for the passage of radiation, but with relatively low obscuration of the pupil. Low obscuration can provide better image quality.

In certain embodiments, projection objectives have extremely high resolution. For example, projection objectives can have the capability of resolving structures smaller than about 50 nm. High resolution can be achieved in projection objectives that have a high image-side numerical aperture that are designed for operation at short wavelengths (e.g., about 10 nm to about 30 nm).

Projection objectives can provide images with low aberrations. In certain embodiments, projection objectives are corrected for wavefront error of about 10 m$\lambda$ or less. In certain embodiments, projection objectives are corrected for distortion below values of about 1 nm.

Projection objectives can include one or more pupil planes that are accessible for positioning an aperture stop or an obscuration stop at the pupil plane.

Embodiments of projection objectives can be adapted for operation at a variety of different wavelengths, including visible and ultraviolet (UV) wavelengths. Embodiments can be adapted for operation at Extreme UV (EUV) wavelengths. Furthermore, embodiments can be adapted for use at more than one wavelength, or over a range of wavelengths.

In certain embodiments, projection objectives have relatively low ray angles at the reticle and have a relatively high image-side numerical aperture. For example, radiation from the illumination system can be incident on the reticle at angles of about 10° or less (e.g., about 7°) with respect to the optical axis, while the projection objective has an image-side numerical aperture of about 0.4 or more.

In certain embodiments, projection objective can include features that allow a reduction in the complexity of the illumination system. For example, the location of the entrance pupil of projection objectives may be in front of the object plane. In other words, chief rays starting at different field points are divergent with respect to each other and with respect to the optical axis. This can make the entrance pupil of the projection objective/exit pupil of the illumination system accessible without using a telescope in the illumination system to relay the illumination system's exit pupil to the location of the projection objective's entrance pupil.

In certain embodiments, the projection objective can include a relatively large working space close to the position where the optical axis intersects the object plane. This can allow convenient placement of components (e.g., components of the illumination system) close to the reticle. In some embodiments, this can be achieved by designing the projection objective so that the mirror physically closest to the object plane is positioned relatively far from the optical axis. In such cases, the bundle of rays that goes from the reticle to the first mirror of the projection objective can intersect a bundle that goes from the second mirror of the projection objective to third mirror.

Other features and advantages will be apparent from the description and drawings, and from the claims.

DETAILED DESCRIPTION

Figure 1:
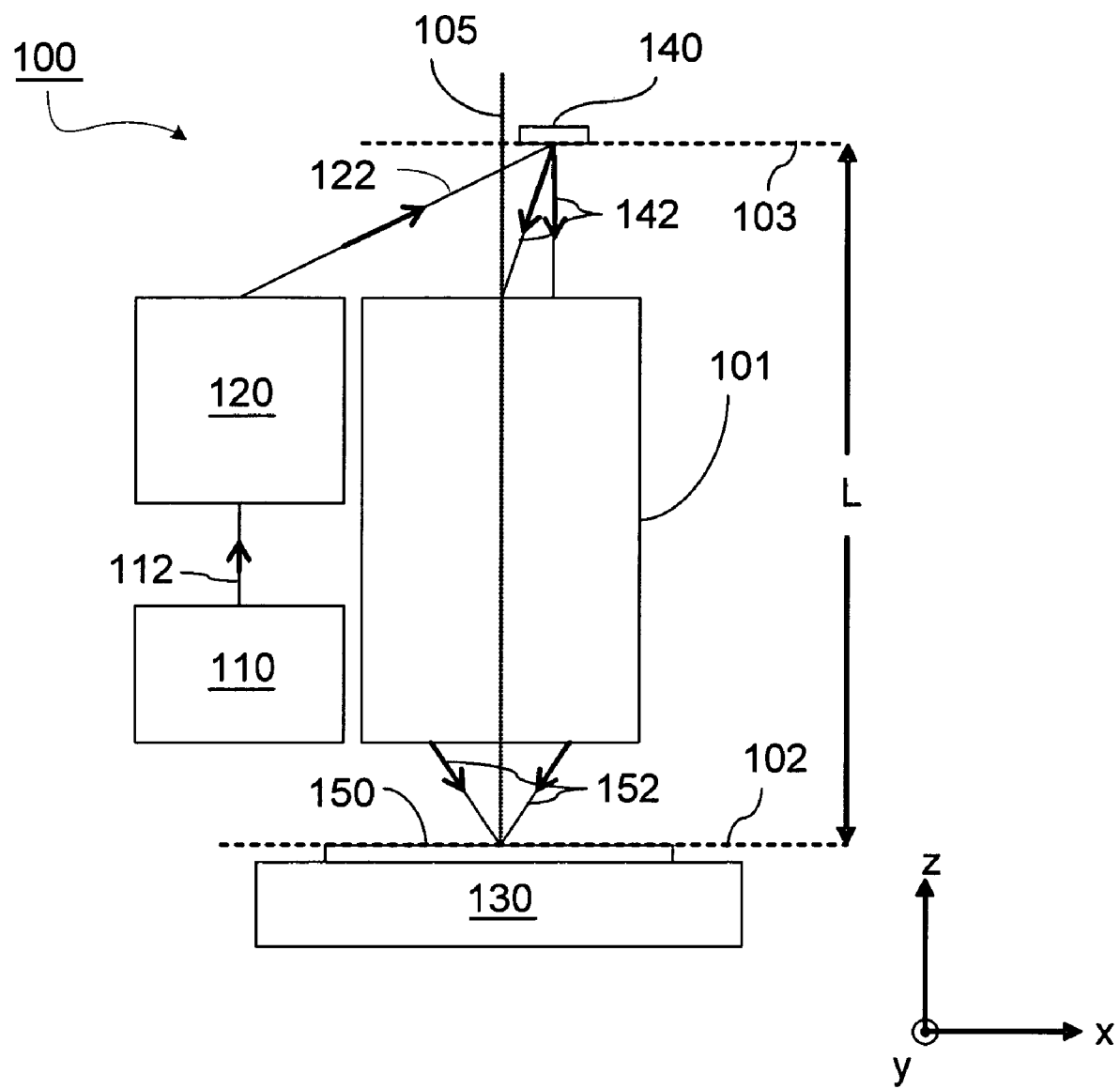
FIG. 1 is a schematic view of an embodiment of a microlithography tool.

In general, the disclosure relates to catoptric projection objectives that have a relatively high numerical aperture. Catoptric projection objectives with relatively high numerical apertures can be used in microlithography tools. Referring to FIG. 1, a microlithography tool 100 generally includes a light source 110, an illumination system 120, a projection objective 101, and a stage 130. A Cartesian co-ordinate system is shown for reference. Light source 110 produces radiation at a wavelength λ and directs a beam 112 of the radiation to illumination system 120. Illumination system 120 interacts with (e.g., expands and homogenizes) the radiation and directs a beam 122 of the radiation to a reticle 140 positioned at an object plane 103. Projection objective 101 images radiation 142 reflected from reticle 140 onto a surface of a substrate 150 positioned at an image plane 102. The radiation on the image-side of projection objective 101 is depicted as rays 152. Substrate 150 is supported by stage 130, which moves substrate 150 relative to projection objective 101 so that projection objective 101 images reticle 140 to different portions of substrate 150.

Projection objective 101 includes an optical axis 105. As depicted in FIG. 1, projection objective 101 images a portion of reticle 140 that is not coincident with optical axis 105 to image plane 102.

Light source 110 is selected to provide radiation at a desired operational wavelength, λ, of tool 100. In some embodiments, light source 110 is a laser light source, such as a KrF laser (e.g., having a wavelength of about 248 nm) or an ArF laser (e.g., having a wavelength of about 193 nm). Non-laser light sources that can be used include light-emitting diodes (LEDs), such as LEDs that emit radiation in the blue or UV portions of the electromagnetic spectrum, e.g., about 365 nm, about 280 nm or about 227 nm.

Typically, for projection objectives designed for operation in lithography tools, wavelength λ is in the ultraviolet portion of the electromagnetic spectrum. For example, λ can be about 400 nm or less (e.g., about 300 nm or less, about 200 nm or less, about 100 nm or less, about 50 nm or less, about 30 nm or less). λ can be more than about 2 nm (e.g., about 5 nm or more, about 10 nm or more). In embodiments, λ can be about 193 nm, about 157 nm, about 13 nm, or about 11 nm. Using a relatively short wavelength may be desirable because, in general, the resolution of a projection objective is approximately proportional to the wavelength. Therefore shorter wavelengths can allow a projection objective to resolve smaller features in an image than equivalent projection objectives that use longer wavelengths. In certain embodiments, however, λ can be in non-UV portions of the electromagnetic spectrum (e.g., the visible portion).

In general, radiation from light source 110 can be substantially monochromatic or can include radiation at a number of different wavelengths. In some embodiments, projection objective 101 can be designed for operation at a single wavelength or at multiple wavelengths. In some embodiments, projection objectives can be designed for operation at multiple wavelengths, such as over bands of wavelengths (e.g., from about 10 nm to about 30 nm, from about 200 nm to about 400 nm, from about 400 nm to about 700 nm).

Illumination system 120 includes optical components arranged to form a collimated radiation beam with a homogeneous intensity profile. Illumination system 120 typically also includes beam steering optics to direct beam 122 to reticle 140. In some embodiments, illumination system 120 also include components to provide a desired polarization profile for the radiation beam.

Image plane 103 is separated from object plane 102 by a distance L, which is also referred to as the lengthwise dimension of projection objective 101. In general, this distance depends on the specific design of projection objective 101 and the wavelength of operation of tool 100. In some embodiments, such as in tools designed for EUV lithography, L is in a range from about 1 m to about 3 m (e.g., in a range from about 1.5 m to about 2.5 m). In certain embodiments, L is less than 2 m, such as about 1.9 m or less (e.g., about 1.8 m or less, about 1.7 m or less, about 1.6 m or less, about 1.5 m or less). L can be more than about 0.2 m or more (e.g., about 0.3 m or more, about 0.4 m or more, about 0.5 m or more, about 0.6 m or more, about 0.7 m or more, about 0.8 m or more, about 0.9 m or more, about 1 m or more).

Projection objective 101 has a magnification ratio, which refers to the ratio of the dimensions of the field at object plane 103 to the corresponding dimensions of the field at image plane 102. Typically, projection objectives used in lithography tools are reduction projection objectives, meaning they reduce the dimensions of, or demagnify, the image. In some embodiments, therefore, projection objective 101 can produce a field at image plane 102 whose dimensions are reduced by about 2× or more (e.g., about 3× or more, about 4× or more, about 5× or more, about 6× or more, about 7× or more, about 8× or more, about 9× or more, about 10× or more) compared to the dimensions at object plane 103. In other words, projection objective 101 can have a demagnification of about 2× or more, (e.g., about 3× or more, about 4× or more, about 5× or more, about 6× or more, about 7× or more, about 8× or more, about 9× or more, about 10× or more). More generally, however, projection objectives can be designed to provide a magnified image or an image the same size as the object.

Figure 2:
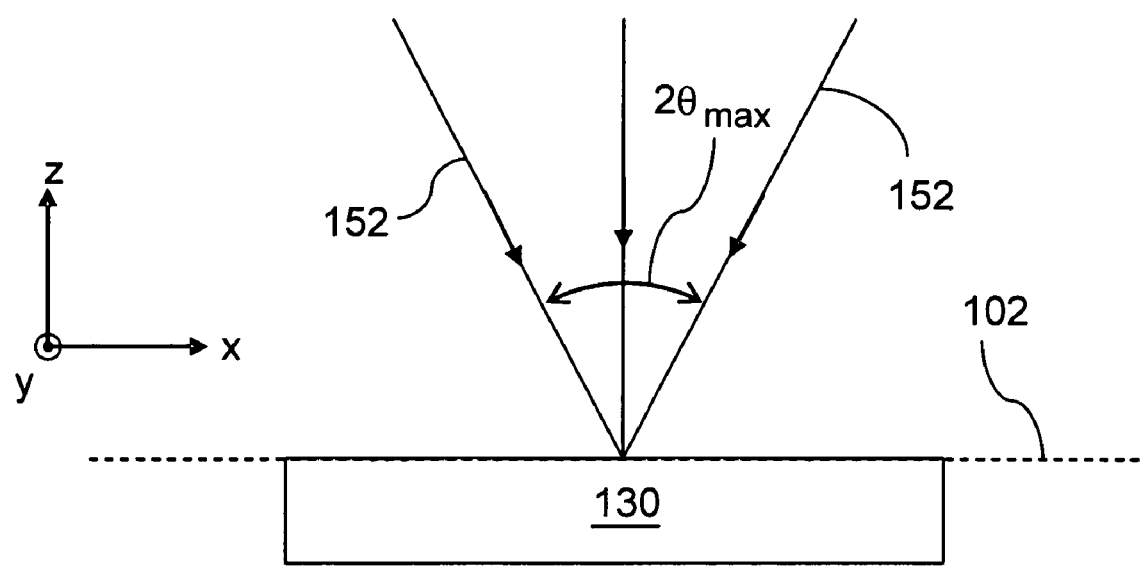
FIG. 2 is a schematic view showing a portion of the microlithography tool shown in FIG. 1.

Referring also to FIG. 2, rays 152 define a cone of light paths that form the reticle image at image plane 102. The angle of the cone of rays is related to the image-side numerical aperture (NA) of projection objective 101. Image-side NA can be expressed as $$NA = n_o \sin \theta_{max},$$

where $n_o$ refers to the refractive index of the immersing medium adjacent the surface of substrate 150 (e.g., air, nitrogen, water, or evacuated environment), and $\theta_{max}$ is the half-angle of the maximum cone of image forming rays from projection objective 101.

In general, projection objective 101 has a relatively high image-side NA. For example, in some embodiments, projection objective 101 has an image-side NA of more than 0.4 (e.g., about 0.45 or more, about 0.5 or more, about 0.55 or more, about 0.6 or more, about 0.65 or more, about 0.7 or more, about 0.75 or more, about 0.8 or more, about 0.85 or more, about 0.9 or more). In general, the resolution of projection objective 101 varies depending on wavelength λ and the image-side NA. Without wishing to be bound by theory, the resolution of a projection objective can be determined based on the wavelength and image-side NA based on the formula, $$R = k \frac{\lambda}{NA},$$

where R is the minimum dimension that can be printed and k is a dimensionless constant called the process factor. k varies depending on various factors associated with the radiation (e.g., the polarization properties), the illumination properties (e.g., partial coherence, annular illumination, dipole settings, quadrupole settings, etc.) and the resist material. Typically, k is in a range from about 0.4 to about 0.8, but can also be below 0.4 and higher than 0.8 for certain applications.

In some embodiments, projection objective 101 has a relatively high resolution (i.e., the value of R can be relatively small). For example, R can be about 150 nm or less (e.g., about 130 nm or less, about 100 nm or less, about 75 nm or less, about 50 nm or less, about 40 nm or less, about 35 nm or less, about 32 nm or less, about 30 nm or less, about 28 nm or less, about 25 nm or less, about 22 nm or less, about 20 nm or less, about 18 nm or less, about 17 nm or less, about 16 nm or less, about 15 nm or less, about 14 nm or less, about 13 nm or less, about 12 nm or less, about 11 nm or less, such as about 10 nm).

The quality of images formed by projection objective 101 can be quantified in a variety of different ways. For example, images can be characterized based on the measured or calculated departures of the image from idealized conditions associated with Gaussian optics. These departures are generally known as aberrations. One metric used to quantify the deviation of a wavefront from the ideal or desired shape is the root-mean-square wavefront error ($W_{rms}$). $W_{rms}$ is defined in the "Handbook of Optics," Vol. I, $2^{nd}$ Ed., edited by Michael Bass (McGraw-Hill, Inc., 1995), at page 35.3, which is incorporated herein by reference. In general, the lower the $W_{rms}$ value for an objective, less the wavefront deviates from its desired or ideal shape, and the better the quality of the image. In certain embodiments, projection objective 101 can have a relatively small $W_{rms}$ for images at image plane 102. For example, projection objective 101 can have a $W_{rms}$ of about $0.1\lambda$ or less (e.g., about $0.07\lambda$ or less, about $0.06\lambda$ or less, about $0.05\lambda$ or less, about $0.045\lambda$ or less, about $0.04\lambda$ or less, about $0.035\lambda$ or less, about $0.03\lambda$ or less, about $0.025\lambda$ or less, about $0.02\lambda$ or less, about $0.015\lambda$ or less, about $0.01\lambda$ or less, such as about $0.005\lambda$).

Another metric that can be used to evaluate the quality of the image is referred to as field curvature. Field curvature refers to the peak-to-valley distance for the field point dependent position of the focal plane. In some embodiments, projection objective 101 can have a relatively small field curvature for images at image plane 102. For example, projection objective 101 can have an image-side field curvature of about 20 nm or less (e.g., about 15 nm or less, about 12 nm or less, 10 nm or less, 9 nm or less, 8 nm or less, 7 nm or less, 6 nm or less, 5 nm or less, 4 nm or less, 3 nm or less, 2 nm or less, 1 nm or less, such as about 0.5 nm).

Another metric that can be used to evaluate the optical performance is referred to as distortion. Distortion refers to the maximum absolute value of the field point dependent deviation from the ideal image point position in the image plane. In some embodiments, projection objective 101 can have a relatively small distortion. For example, projection objective 101 can have a distortion of about 50 nm or less, (e.g. about 40 nm or less, about 30 nm or less, about 20 nm or less, about 15 nm or less, about 12 nm or less, 10 nm or less, 9 nm or less, 8 nm or less, 7 nm or less, 6 nm or less, 5 nm or less, 4 nm or less, 3 nm or less, 2 nm or less, such as 1 nm).

Being a catoptric system, projection objective 101 includes a number of mirrors arranged to direct radiation reflected from reticle 140 to substrate 150 in a way that forms an image of reticle 140 on the surface of substrate 150. Specific designs of projection objectives are described below. More generally, however, the number, size, and structure of the mirrors generally depends on the desired optical properties of projection objective 101 and the physical constraints of tool 100.

Projection objective 101 is also telecentric with respect to the image plane. Thus, projection objective 101 can provide substantially constant magnification over a range of image-size working distances.

In general, the number of mirrors in projection objective 101 may vary. Typically, the number of mirrors is related to various performance trade-offs associated with the optical performance characteristics of the objective, such as the desired throughput (e.g., the intensity of radiation from the object that forms the image at image plane 102), the desired image-side NA and related image resolution, and the desired maximum pupil obscuration.

In certain embodiments, projection objective 101 has at least four mirrors (e.g., five or more mirrors, six or more mirrors, seven or more mirrors, eight or more mirrors, nine or more mirrors, ten or more mirrors, eleven or more mirrors, twelve or more mirrors). In embodiments where it is desirable that all the mirrors of the objective are positioned between the object plane and the image plane, objective 101 will typically have an even number of mirrors (e.g., four mirrors, six mirrors, eight mirrors, ten mirrors).

Projection objective 101 generally includes one or more mirrors with positive optical power. In other words, the reflective portion of the mirror has a concave surface and is referred to as a concave mirror. Projection objective 101 can include two or more (e.g., three or more, four or more, five or more, six or more) concave mirrors. Projection objective 101 can also include one or more mirrors that have negative optical power. This means that one or more of the mirrors has a reflective portion with a convex surface (referred to as a convex mirror). In some embodiments, projection objective 101 includes two or more (e.g., three or more, four or more, five or more, six or more) convex mirrors.

In certain embodiments, the arrangement of mirrors in projection objective 101 images radiation from object plane 103 to one or more intermediate-image planes.

Embodiments that have one or more intermediate images, also include two or more pupil planes. In some embodiments, at least one of these pupil planes is physically accessible for the purposes of placing an aperture stop substantially at that pupil plane. An aperture stop is used to reduce the size of the projection objective's aperture.

In general, the mirrors are formed so that they reflect a substantial amount of radiation of wavelength $\lambda$ normally-incident thereon or incident thereon over a certain range of incident angles. Mirrors can be formed, for example, so that they reflect about 50% or more (e.g., about 60% or more, about 70% or more, about 80% or more, about 90% or more, about 95% or more, 98% or more) of normally incident radiation at $\lambda$.

In some embodiments, the mirrors include a multilayer stack of films of different materials arranged to substantially reflect normally incident radiation at $\lambda$. Each film in the stack can have an optical thickness of about $\lambda/4$. Multilayer stacks can include about 20 or more (e.g., about 30 or more, about 40 or more, about 50 or more) films. In general, the materials used to form the multilayer stacks are selected based on operational wavelength $\lambda$. For example, multiple alternating films of molybdenum and silicon or molybdenum and beryllium can be used to form mirrors for reflecting radiation in the 10 nm to 30 nm range (e.g., for $\lambda$ of about 13 nm or about 11 nm, respectively).

In certain embodiments, the mirrors are made of quartz glass coated with a single layer of aluminum and overcoated with one or more layers of dielectric materials, such as layers formed from $MgF_2$, $LaF_2$, or, $Al_2O_3$. Mirrors formed from aluminum with dielectric coatings can be used, for example, for radiation having a wavelength of about 193 nm.

Figure 3:
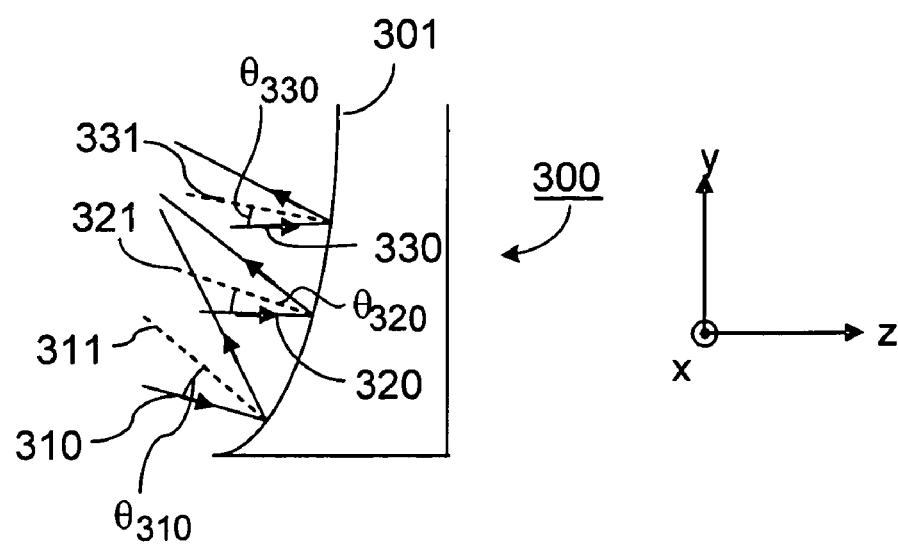
FIG. 3 is a cross-sectional view of a portion of a mirror from a projection objective shown in meridional section.

In general, the percentage of radiation at λ reflected by a mirror varies as a function of the angle of incidence of the radiation on the mirror surface. Because imaged radiation propagates through a catoptric projection objective along a number of different paths, the angle of incidence of the radiation on each mirror can vary. This effect is illustrated with reference to FIG. 3, which shows a portion of a mirror 300, in meridional section, that includes a concave reflective surface 301. Imaged radiation is incident on surface 301 along a number of different paths, including the paths shown by rays 310, 320, and 330. Rays 310, 320, and 330 are incident on portions of surface 301 where the surface normal is different. The direction of surface normal at these portions is shown by lines 311, 321, and 331, corresponding to rays 310, 320, and 330, respectively. Rays 310, 320, and 330 are incident on surface 301 at angles $\theta_{310}$, $\theta_{320}$, and $\theta_{330}$, respectively. In general, angles $\theta_{310}$, $\theta_{320}$, and $\theta_{330}$ may vary.

For each mirror in projection objective 101, the incident angles of imaged radiation can be characterized in a variety of ways. One characterization is the maximum angle of incidence of rays on each mirror in a meridional section of projection objective 101. In general, $\theta_{max}$ can vary for different mirrors in projection objective 101. In embodiments, the maximum value of $\theta_{max}$ for all the mirrors in projection objective 101 is about 75° or less (e.g., about 70° or less, about 65° or less, about 60° or less, about 55° or less, about 50° or less, about 45° or less). $\theta_{max}$ can be more than about 5° (e.g., about 10° or more, about 20° or more). In some embodiments, the maximum value of $\theta_{max}$ can be relatively low. For example, the maximum value of $\theta_{max}$ can be about 40° or less (e.g., about 35° or less, about 30° or less, about 25° or less, about 20° or less, about 15° or less, about 13° or less, about 10° or less).

Another characterization is the angle of incidence of the chief ray corresponding to the central field point on each mirror in a meridional section of projection objective 101. This angle is referred to as $\theta_{CR}$. In general, $\theta_{CR}$ can vary. In some embodiments the maximum value of $\theta_{CR}$, $\theta_{CR}(max)$, in projection objective 101 can be relatively low. For example, $\theta_{CR}(max)$ can be about 35° or less (e.g., about 30° or less, about 25° or less, about 20° or less, about 15° or less, about 13° or less, about 10° or less, about 8° or less, about 5° or less).

Each mirror in projection objective 101 can also be characterized by the range of angles of incidence, $\Delta\theta$, of rays for a meridional section of projection objective 101. For each mirror, $\Delta\theta$ corresponds to the difference between $\theta_{max}$ and $\theta_{min}$, where $\theta_{min}$ is the minimum angle of incidence of rays on each mirror in a meridional section of projection objective 101. In general, $\Delta\theta$ may vary for each mirror in projection objective 101. For some mirrors, $\Delta\theta$ can be relatively small. For example, $\Delta\theta$ can be about 20° or less (e.g., about 15° or less, about 12° or less, about 10° or less, about 8° or less, about 5° or less, about 3° or less, 2° or less). Alternatively, for some mirrors in projection objective 101, $\Delta\theta$ can be relatively large. For example, $\Delta\theta$ for some mirrors can be about 20° or more (e.g., about 25° or more, about 30° or more, about 35° or more, about 40° or more). In some embodiments, the maximum value for $\Delta\theta$, $\Delta\theta_{max}$, for all the mirrors in projection objective 101 can be relatively small. For example, $\Delta\theta_{max}$ can be about 25° or less (e.g., about 20° or less, about 15° or less, about 12° or less, about 10° or less, about 9° or less, about 8° or less, about 7° or less, about 6° or less, about 5° or less, such as 3°).

In general, catoptric projection objectives are designed to account for the obscuration of ray paths caused by the reflective elements, as opposed to transmissive elements used in a dioptric system. The mirrors are designed and arranged so that radiation imaged by the projection objective follows a path through a transmissive opening (e.g., a hole) in the mirror, or passes the edge of the mirror. Thus, mirrors in projection objective 101 can be categorized as being in one of two groups: mirrors in the first group include an opening for the passage of radiation and mirrors in the second group do not.

Figure 4A:
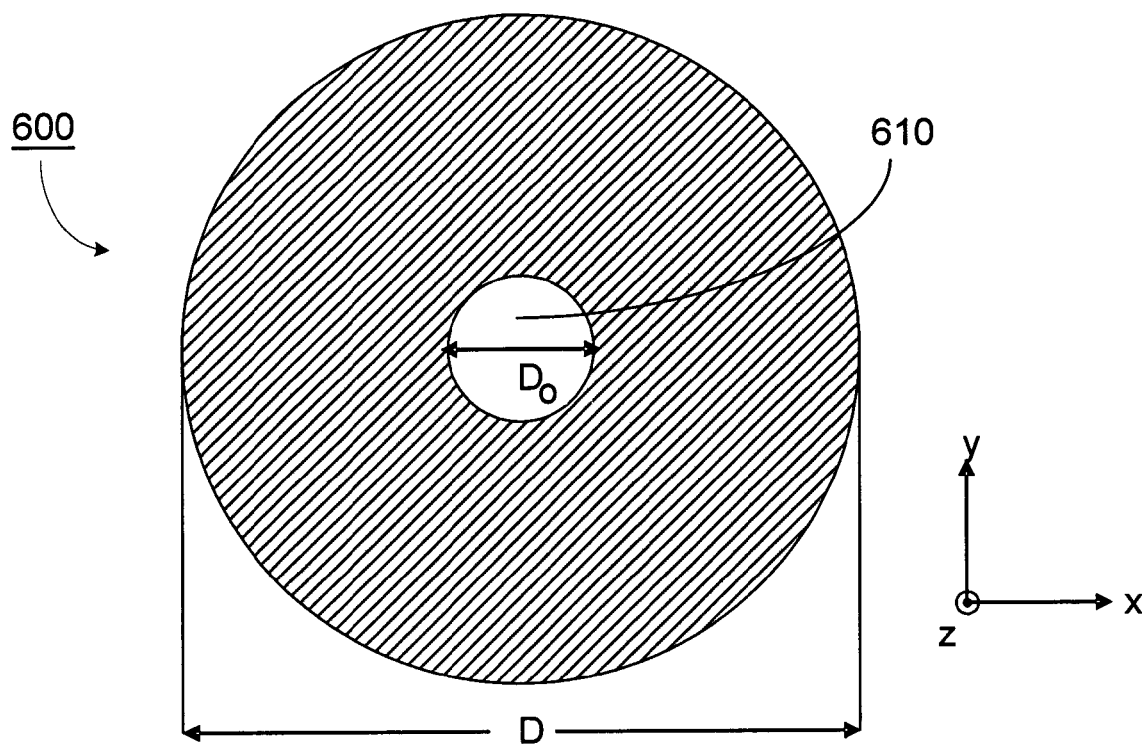
FIG. 4A is a plan view of an embodiment of a mirror from a projection objective that includes an opening.

An example of a mirror 600 that includes an opening is shown in FIG. 4A. Mirror 600 includes an opening 610. Mirror 600 can be arranged in projection objective 101 so that optical axis 105 intersects opening 610. Mirror 600 is circular in shape with diameter D. Generally, D is selected based on the design of projection objective 101. In some embodiments, D is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less). D may be more than about 10 mm (e.g., about 20 mm or more, about 50 mm or more).

In general, mirrors in projection objective 101 that include an opening can be circular or non-circular in shape. Examples of non-circular openings include polygonal openings (e.g., square openings, rectangular openings, hexagonal openings, octagonal openings, irregular polygonal openings) and non-circular, curved openings (e.g., elliptical openings, irregular curved openings).

Mirrors that are non-circular in shape can have a maximum dimension that is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less.) Non-circular mirrors may have a maximum dimension that is more than about 10 mm (e.g., about 20 mm or more, about 50 mm or more).

Opening 610 is circular in shape with diameter $D_o$. $D_o$ depends on the design of projection objective 101 and is generally sized to allow a sufficiently large opening for the passage of radiation from object plane 103 to image plane 102.

In general, mirror openings can be circular or non-circular in shape. Examples of non-circular openings include polygonal openings (e.g., square openings, rectangular openings, hexagonal openings, octagonal openings) and non-circular, curved openings (e.g., elliptical openings, irregular curved openings).

Openings that are non-circular in shape can have a maximum dimension that is about 0.75 D or less (e.g., about 0.5 D or less, about 0.4 D or less, about 0.3 D or less, about 0.2 D or less, about 0.1 D or less, about 0.05 D or less). The maximum opening of a non-circular opening can be more than about 0.01 D (e.g., about 0.02 D or more, about 0.03 D or more, about 0.04 D or more, about 0.05 D or more). In some embodiments, a mirror includes a non-circular opening that has a maximum dimension of about 50 mm or less (e.g., about 45 mm or less, about 40 mm or less, about 35 mm or less, about 30 mm or less, about 25 mm or less, about 20 mm or less, about 15 mm or less, about 10 mm or less, such as about 5 mm).

In embodiments where projection objective 101 includes more than one mirror with an opening, the openings in different mirrors can have the same shape or can have different shapes. Furthermore, the openings in different mirrors can have the same maximum dimension or can have different maximum dimensions.

Figure 4B:
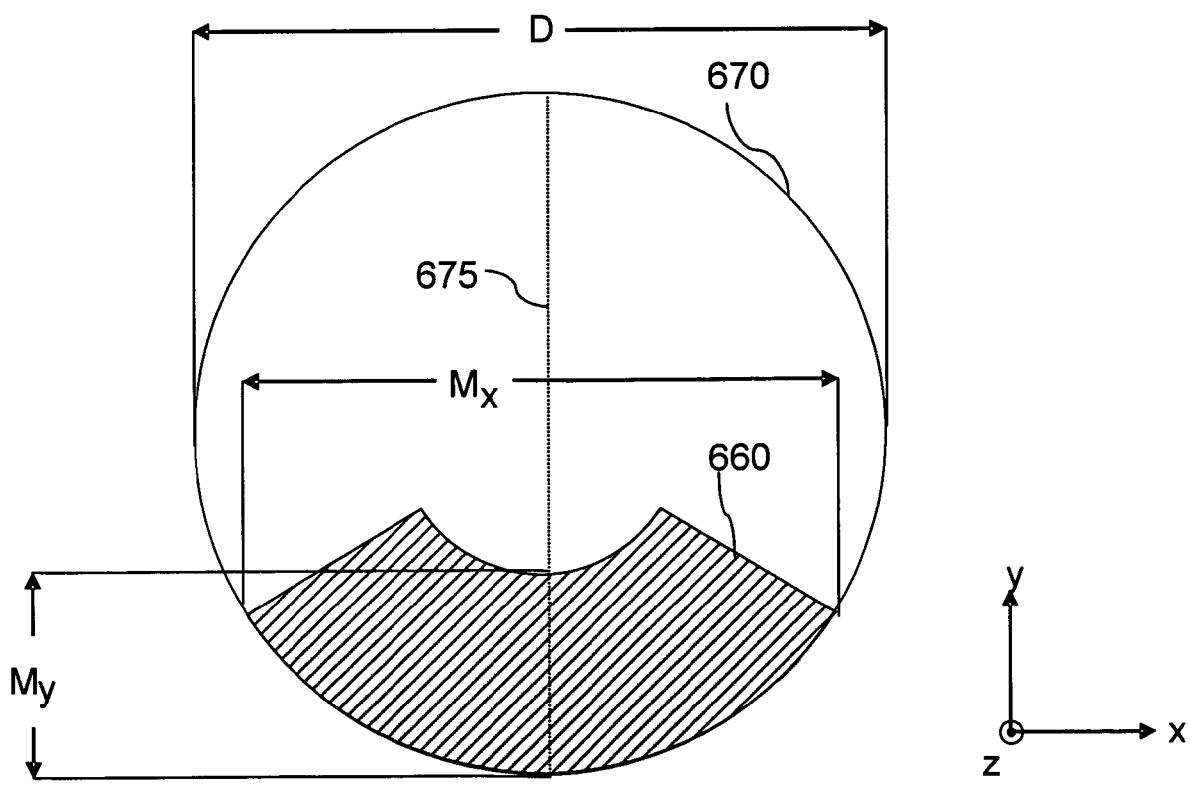
FIG. 4B is a plan view of an embodiment of a mirror from a projection objective that does not include an opening.

An example of a mirror 660 that does not include an opening is shown in FIG. 4B. Mirror 660 is in the shape of a ring segment. Mirror 660 corresponds to a segment of a circular mirror 670 of diameter D. Mirror 660 has a maximum dimension in the x-direction given by $M_x$. In embodiments, $M_x$ can be about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less). $M_x$ can be more than about 10 mm (e.g., about 20 mm or more, about 50 mm or more).

Mirror 660 is symmetric with respect to meridian 675. Mirror 660 has a dimension $M_y$ along meridian 675. $M_y$ can be smaller or larger than $M_x$. In some embodiments, $M_y$ is in a range from about 0.1 $M_x$ to about $M_x$ (e.g., about 0.2 $M_x$ or more, about 0.3 $M_x$ or more, about 0.4 $M_x$ or more, about 0.5 $M_x$ or more, about 0.6 $M_x$ or more, about 0.7 $M_x$ or more about 0.8 $M_x$ or more, about 0.9 $M_x$ or more). Alternatively, in certain embodiments, $M_y$ can be about 1.1 $M_x$ or more (e.g., about 1.5 $M_x$ or more), such as in a range from about 2 $M_x$ to about 10 $M_x$. $M_y$ can be about 1,000 mm or less (e.g., about 900 mm or less, about 800 mm or less, about 700 mm or less, about 600 mm or less, about 500 mm or less, about 400 mm or less, about 300 mm or less, about 200 mm or less, about 100 mm or less). $M_y$ can be more than about 10 mm (e.g., about 20 mm or more, about 50 mm or more).

Mirrors that do not include an opening may be arranged so that optical axis 105 intersects the mirror, or does not intersect the mirror.

In general, projection objective 101 can include mirrors of varying shape and size, depending on its design. In some embodiments, the maximum dimension of any mirror in projection objective is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, such as about 300 mm). In certain embodiments, the maximum dimension of any mirror in projection objective is about 10 mm or more (e.g., about 20 mm or more, about 30 mm or more, about 40 mm or more, about 50 mm or more, about 75 mm or more, about 100 mm or more).

In certain embodiments, projection objective 101 includes a group of mirrors (e.g., two or more mirrors, three or more mirrors, four or more, mirrors, five or more mirrors, six or more mirrors) that do not include an opening that are arranged to form an image (e.g., at image plane 102 or at some intermediate-image plane). In embodiments where projection objective 101 includes additional mirrors to the group of mirrors, the group of mirrors is referred to as a partial objective.

In embodiments, projection objective 101 can include more than one partial objective. For example, projection objective can include two partial objectives, three partial objectives, four partial objectives, or more than four partial objectives.

Figure 5A:
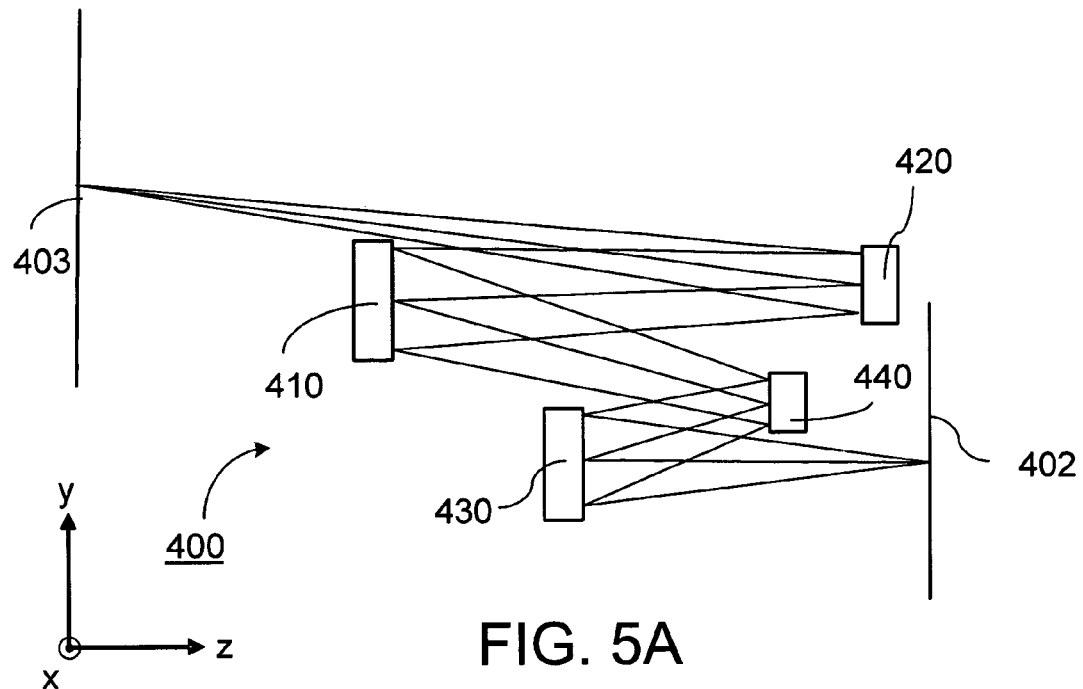
FIG. 5A is a cross-sectional view of an embodiment of a partial objective shown in meridional section.

An example of a partial objective is partial objective 400 shown in FIG. 5A. Partial objective 400 includes mirrors 410, 420, 430, and 440 arranged to image radiation from an object plane 403 (e.g., corresponding to object plane 103 or to an intermediate image plane) to an image plane 402 (e.g., corresponding to image plane 102 or to an intermediate-image plane). The reflective surfaces of mirrors 410, 420, 430, and 440 all correspond to portions of axially-symmetric surfaces, where the rest of the mirror surface has been removed to provide a path for the imaged radiation. The first mirror in the path of the radiation, mirror 420, is closest to plane 402, while the second mirror in the path of the radiation, mirror 410, is closest to plane 403.

Figure 5B:
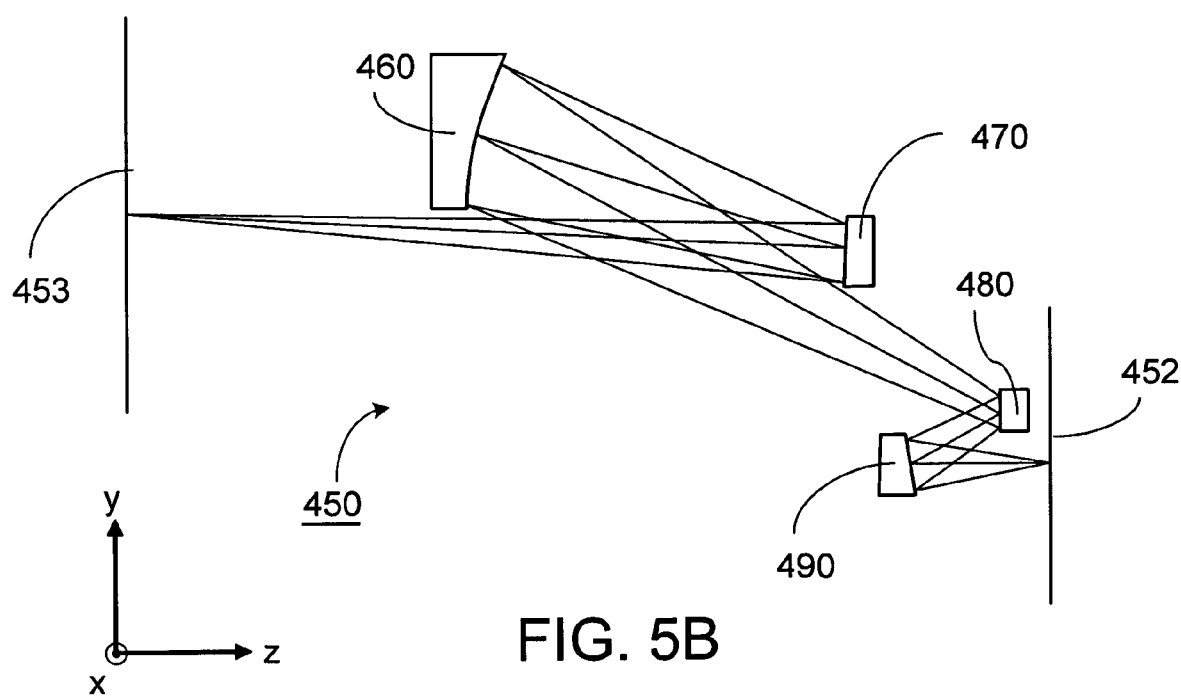
FIG. 5B is a cross-sectional view of another embodiment of a partial objective shown in meridional section.

As another example, referring to FIG. 5B, a partial objective 450 includes mirrors 460, 470, 480, and 490 arranged to image radiation from an object plane 453 (e.g., corresponding to object plane 103 or to an intermediate image plane) to an image plane 452 (e.g., corresponding to image plane 102 or to an intermediate-image plane). Like the mirrors forming partial objective 400, the reflective surfaces of mirrors 460, 470, 480, and 490 all correspond to portions of axially-symmetric surfaces, where the rest of the mirror surface has been removed to provide a path for the imaged radiation. The third mirror in the path of the radiation, mirror 480, is closest to plane 452, while the second mirror in the path of the radiation, mirror 460, is closest to plane 403.

Figure 6A:
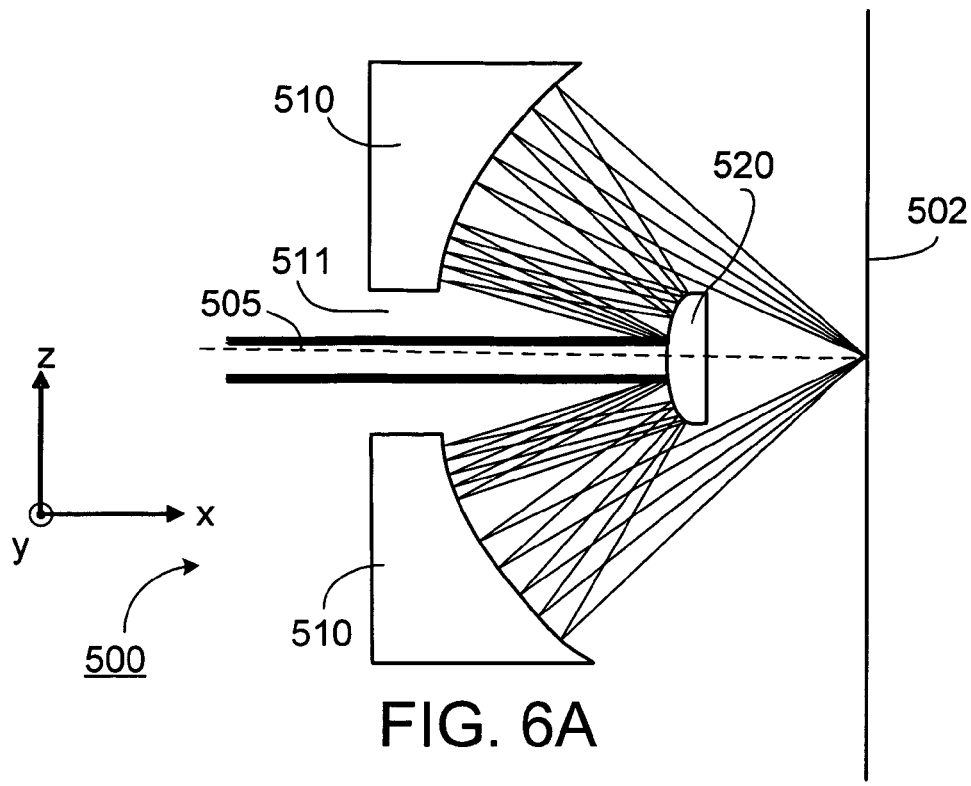
FIG. 6A is a cross-sectional view of another embodiment of a partial objective shown in meridional section.

While partial objectives 400 and 450 are formed from mirrors that do not include openings, partial objectives can also be formed from mirrors that do include an opening. For example, referring to FIG. 6A, a partial objective 500 is formed from mirrors 510 and 520, where mirror 510 includes an opening 511. Partial objective 500 is arranged to image radiation to an image plane 502 (e.g., corresponding to image plane 102 or to an intermediate-image plane)).

Figure 6B:
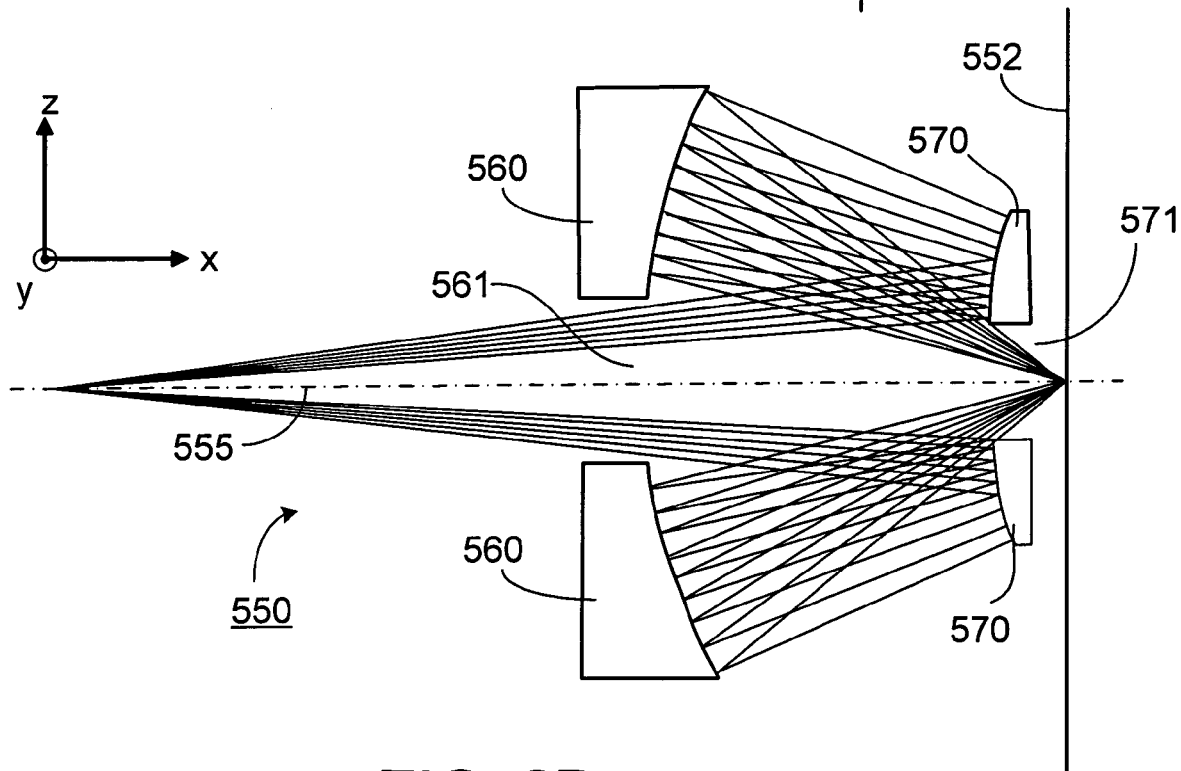
FIG. 6B is a cross-sectional view of another embodiment of a partial objective shown in meridional section.

Referring to FIG. 6B, another example of a partial objective that is formed from mirrors that include an opening is partial objective 550. Partial objective 550 includes mirrors 560 and 570. Mirror 560 includes an opening 561 and mirror 570 includes an opening 571. Partial objective 550 is arranged to image radiation to an image plane 552 (e.g., corresponding to image plane 102 or to an intermediate-image plane)).

Partial objectives that use mirrors that have an opening result in part of a pupil of the partial objective being obscured. Accordingly, in embodiments, projection objective 101 can have an obscured pupil. The extent to which the exit pupil of projection objective 101 is obscured can be characterized by a value, $R_{obs}$, referred to as the obscuration radius, which is the minimum percentage of the aperture radius of projection objective 101 that can be obscured at a pupil plane where the obscuration is substantially independent of the field position, as determined for a meridional section of projection objective 101. In other words, the obscuration radius corresponds to the minimum obscuration at a pupil plane that appears substantially the same at all positions in the field. Due to the rotational symmetry of the system with respect to optical axis it is sufficient to calculate the obscuration radius in the meridional section. In some embodiments that include one or more mirrors with an opening, projection objection 101 can have relatively little pupil obscuration. For example, $R_{obs}$ can be about 30% or less (e.g., about 25% or less, about 22% or less, about 20% or less, about 18% or less, about 15% or less, about 12% or less, about 10% or less). In certain embodiments, $R_{obs}$ is more than about 2% (e.g., about 5% or more, about 8% or more).

In some embodiments, projection objective 101 includes one or more pupil planes that are physically accessible for positioning a radiation obscuring element (referred to as an obscuration stop). The obscuration stop can be positioned substantially at that pupil plane where the pupil plane intersects optical axis 105. An obscuration stop located in a pupil position can result in a field independent obscuration of the pupil in embodiments where projection objective includes one or more mirrors that include openings for the passage of radiation.

Typically, the obscuration stop should be formed from or coated with a material that does not reflect radiation at λ (e.g., the material can substantially absorb incident radiation at λ) Preferably, the obscuration stop should not result in substantial stray radiation in the system.

Figure 7A:
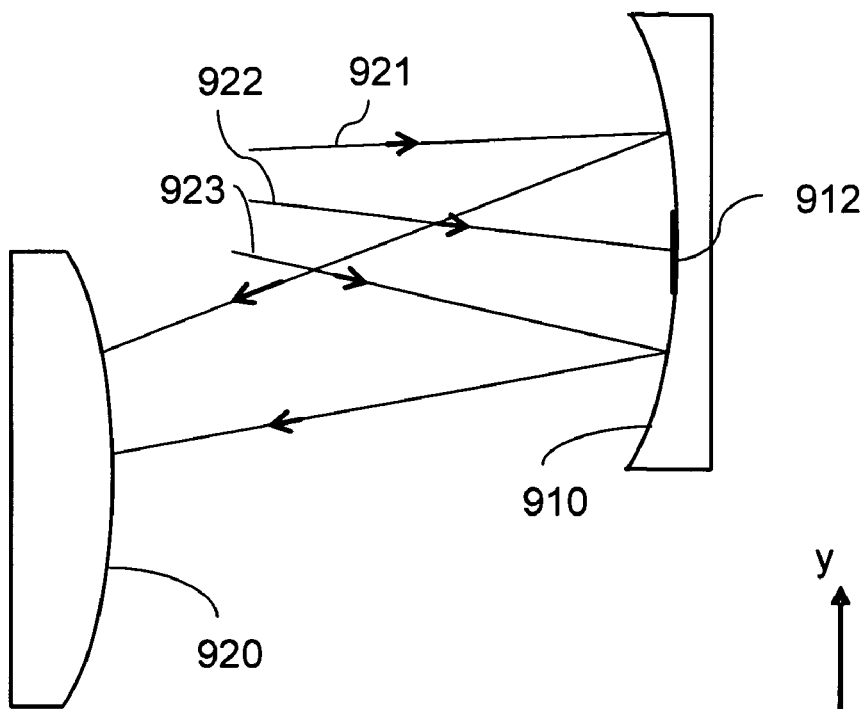
FIG. 7A is a cross-sectional view of a portion of an embodiment of a projection objective shown in meridional section, where the projection objective includes an obscuration stop on a mirror.

Referring to FIG. 7A, in some embodiments, a mirror 910 is positioned substantially at a pupil plane in projection objective 101 and an obscuration stop 912 is provided on the mirror surface. Obscuration stop 912 may be, for example, an antireflective coating for radiation of wavelength λ. Obscuration stop 912 blocks some incident radiation propagating along certain ray paths. This is illustrated in FIG. 7A by rays 921, 922, and 923. Rays 921 and 923 intersect the reflective portion of mirror 910, while ray 922 intersects obscuration stop 912. Accordingly, radiation propagating along the path of rays 921 and 923 is reflected by mirror 920 towards a downstream mirror 920. Radiation propagating along the path of ray 922, on the other hand, is blocked by obscuration stop 912.

Figure 7B:
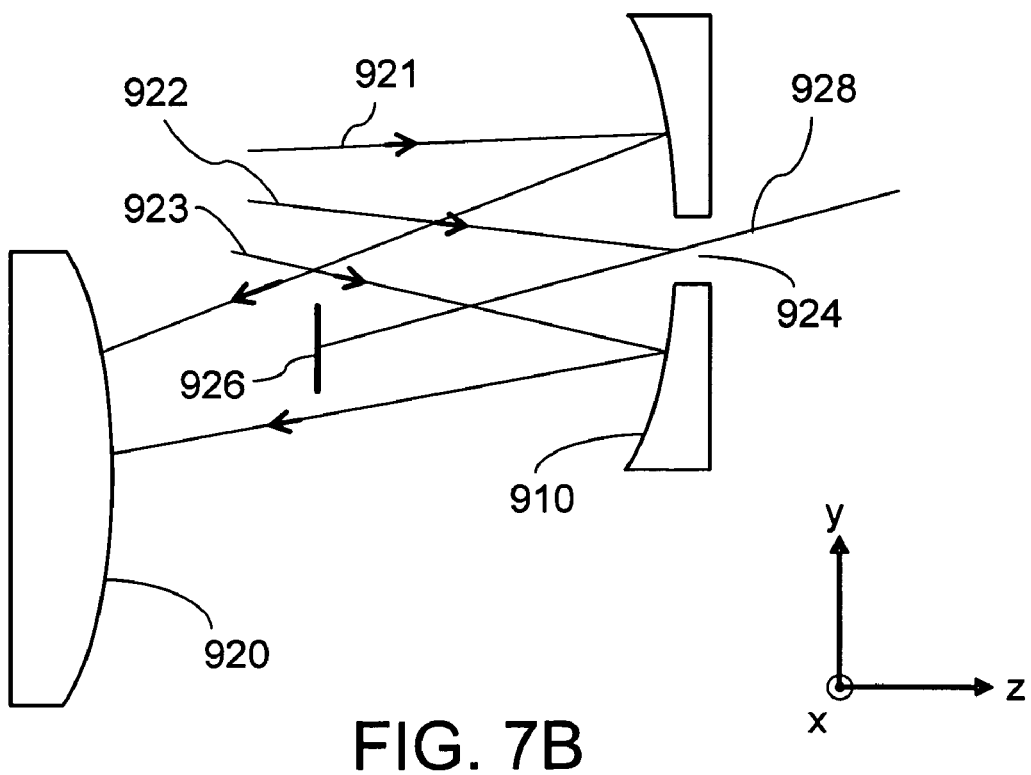
FIG. 7B is a cross-sectional view of a portion of an embodiment of a projection objective shown in meridional section, where the projection objective includes an obscuration stop positioned between two mirrors.

In certain embodiments, an obscuration stop may be positioned between mirrors in projection objective 101. For example, an obscuration stop may be positioned at a pupil plane that is not coincident with any mirrors in the projection objective. Referring to FIG. 7B, an obscuration stop 926 may be positioned between mirrors 910 and 920 to block radiation propagating along certain ray paths between the mirrors. Obscuration stop is mounted in place using a support beam 928 that is passed through an opening 924 in mirror 910.

Figure 7C:
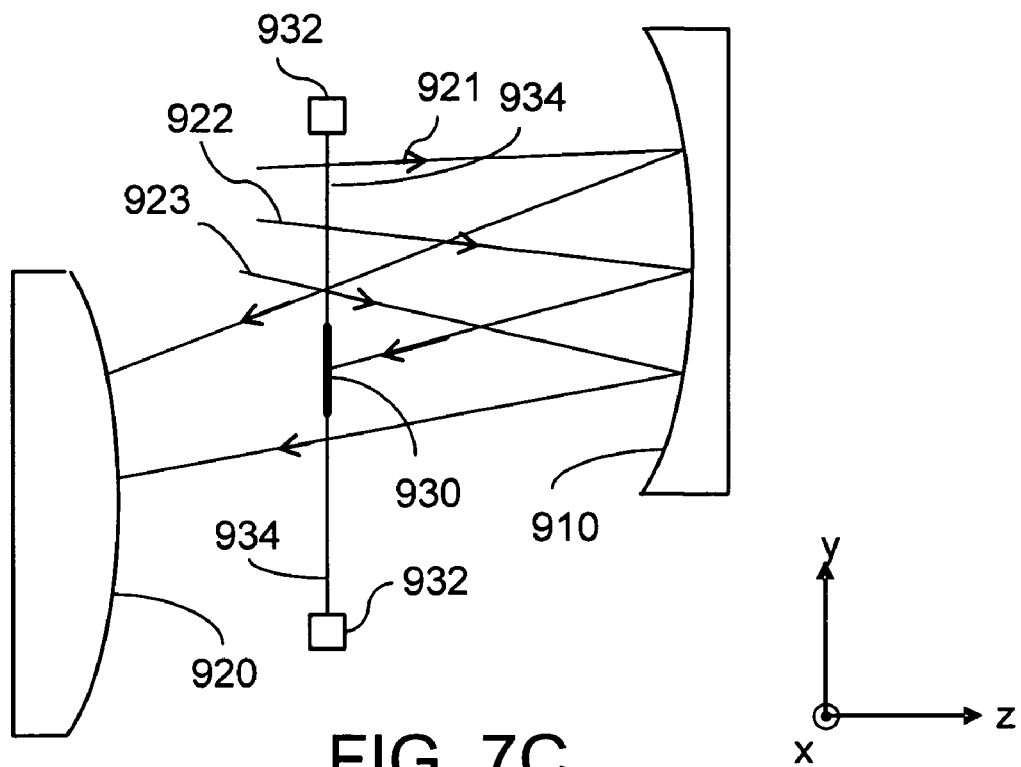
FIG. 7C is a cross-sectional view of a portion of another embodiment of a projection objective shown in meridional section, where the projection objective includes an obscuration stop positioned between two mirrors.
Figure 7D:
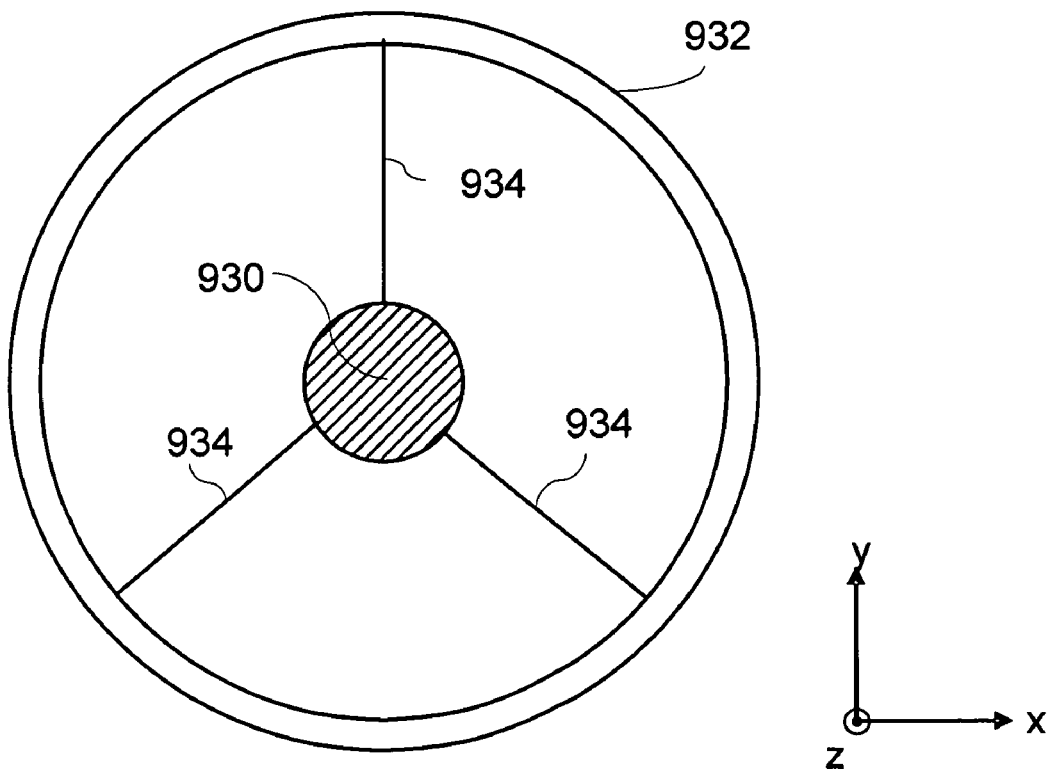
FIG. 7D is a plan view of an obscuration stop mounted in a ring-shape frame.

An alternative mounting scheme is shown in FIGS. 7C and 7D, where an obscuration stop 930 is positioned between mirrors 910 and 920 by a mounting ring 932 that has an inner diameter larger than the projection objective aperture at the pupil plane where obscuration stop 930 is positioned. Obscuration stop 930 is affixed to ring-shaped frame 932 by three radial beams 934. Beams 934 are made sufficiently narrow so as not to substantially block radiation.

In certain embodiments, an obscuration stop positioned substantially at a pupil plane may be removed or exchanged for another obscuration stop without having to remove or exchange a mirror in the projection objective.

In some embodiments, an obscuration stop can be mounted on a transmissive optical element. For example, in embodiments where there exist materials that are substantially transmissive at the system's operating wavelength λ, and these materials have sufficient mechanical strength to support an obscuration stop, an obscuration stop can be mounted on a transmissive flat element. As an example, in embodiments where λ is in the visible portion of the electromagnetic spectrum, an obscuration stop can be mounted by coating or affixing the obscuration stop onto a flat glass element of sufficient size that can be mounted to the frame of projection objective 101.

Typically, obscuration stops are used in embodiments where at least one of the mirrors in the projection objective 101 has an opening for the passage of radiation. In general, the size of the obscuration stop can vary. In certain embodiments, the obscuration stop is the smallest size possible that provides a substantially field independent obscuration at the exit pupil of the projection objective. In some embodiments, the obscuration stop can have a radial dimension that is about 60% or less (e.g., about 55% or less, about 50% or less, about 45% or less, about 40% or less, about 35% or less, about 30% or less, about 25% or less, about 20% or less) of the radius of the pupil aperture.

Figure 8:
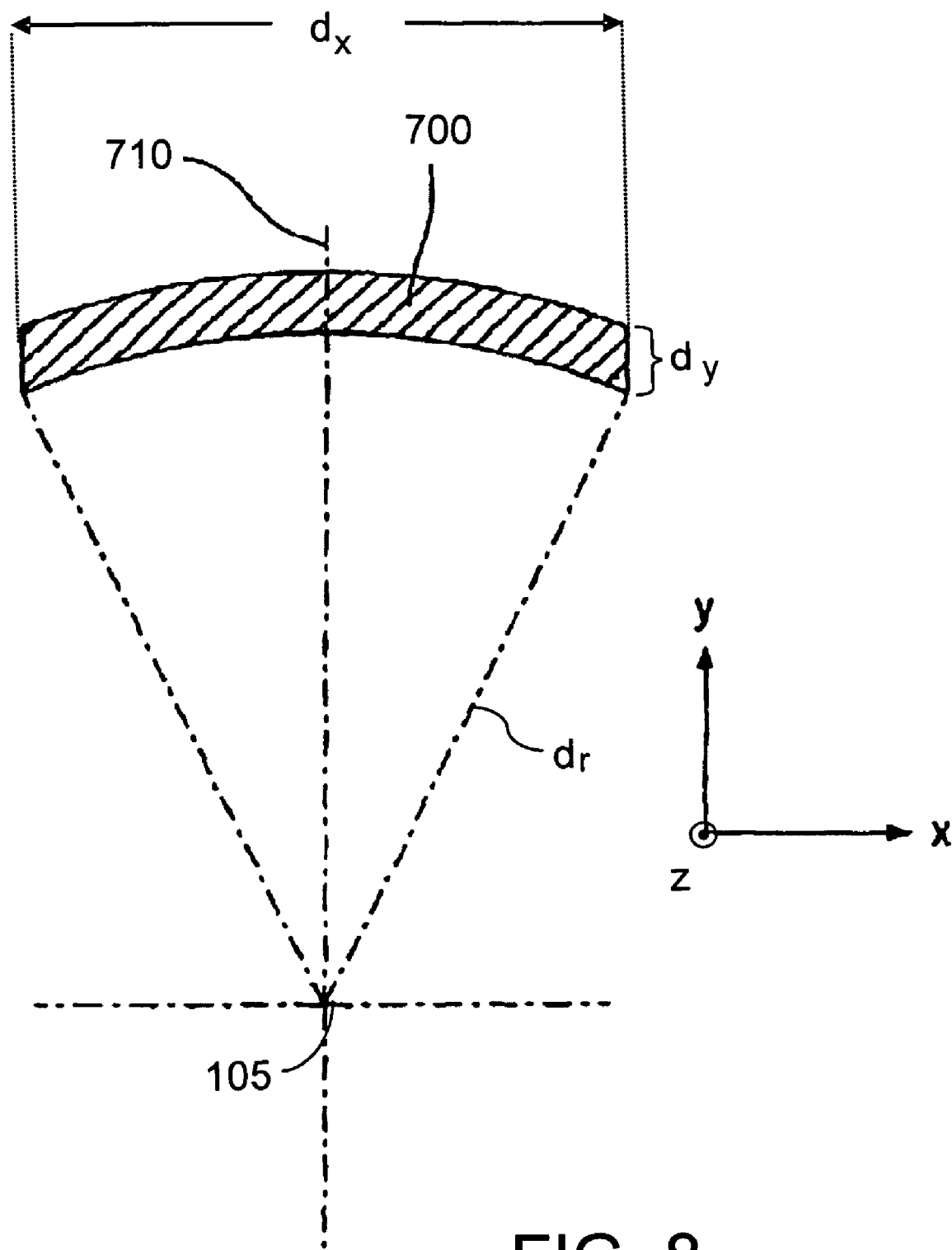
FIG. 8 is a plan view of an embodiment of a ring segment field.

In general, the shape of the field of projection objective 101 can vary. In some embodiments, the field has an arcuate shape, such as the shape of a segment of a ring. For example, projection objectives that include partial objectives formed from mirrors without openings, such as partial objectives 400 and 450 described above, can have field in the shape of a ring segment. Referring to FIG. 8, a ring-segment field 700 can be characterized by an x-dimension, $d_x$, a y-dimension, $d_y$, and a radial dimension, $d_r$. $d_x$ and $d_y$ correspond to the dimension of the field along the x-direction and y-direction, respectively. $d_r$ corresponds to the ring radius, as measured from optical axis 105 to the inner boundary of field 700. Ring-segment field 700 is symmetric with respect to a plane parallel to the y-z plane and indicated by line 710. In general, the sizes of $d_x$, $d_y$, and $d_r$ vary depending on the design of projection objective 101. Typically $d_x$ is larger than $d_y$. The relative sizes of field dimensions $d_x$, $d_y$, and $d_r$ at object plane 103 and image plane 102 vary depending on the magnification or demagnification of projection objective 101.

In some embodiments, $d_x$ is relatively large at image plane 102. For example, $d_x$ at image plane 102 can be more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more). dx can be about 100 mm or less (e.g., about 50 mm or less, about 30 mm or less).

$d_y$ at image plane 102 can be in a range from about 0.5 mm to about 5 mm (e.g., about 1 mm, about 2 mm, about 3 mm, about 4 mm).

Typically, $d_r$ at image plane 102 is in a range from about 10 mm to about 50 mm. $d_r$ can be, for example, about 15 mm or more (e.g., about 20 mm or more, about 25 mm or more, about 30 mm or more) at image plane 102.

More generally, for other field shapes, projection objective 101 can have a maximum field dimension of more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more) at image plane 102. In certain embodiments, projection objective has a maximum field dimension of no more than about 100 mm (e.g., about 50 mm or less, about 30 mm or less).

Figure 9A:
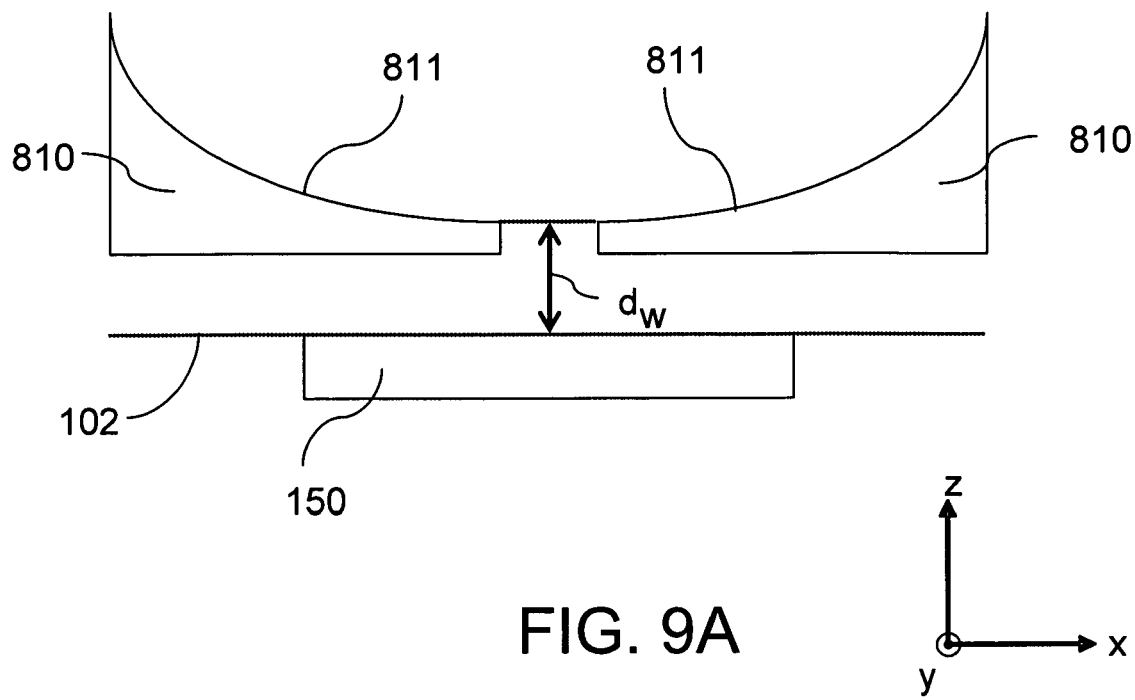
FIG. 9A is a cross-sectional view of a portion of the microlithography tool shown in FIG. 1.

Embodiments of projection objective 101 can have a relatively large image-side free working distance. The image-side free working distance refers to the shortest distance between image plane 102 and the mirror surface of the mirror closest to image plane 102. This is illustrated in FIG. 9A, which shows a mirror 810 as the closest mirror to image plane 102. Radiation reflects from surface 811 of mirror 810. The image-side free working distance is denoted $d_w$. In some embodiments, $d_w$ is about 25 mm or more (e.g., about 30 mm or more, about 35 mm or more, about 40 mm or more, about 45 mm or more, about 50 mm or more about 55 mm or more, about 60 mm or more, about 65 mm or more). In certain embodiments, $d_w$ is about 200 mm or less (e.g., about 150 mm or less, about 100 mm or less, about 50 mm or less). A relatively large working distance may be desirable because it can allow the surface of substrate 150 to be positioned at image plane 102 without contacting the side of mirror 810 facing image plane 102.

Analogously, the object-side free working distance refers to the shortest distance between object plane 103 and the surface of the reflective side of the mirror in projection objective 101 closest to object plane 103. In some embodiments, projection objective 101 has a relatively large object-side free working distance. For example, projection objective 101 can have an object-side free working distance of about 50 mm or more (e.g., about 100 mm or more, about 150 mm or more, about 200 mm or more, about 250 mm or more, about 300 mm or more, about 350 mm or more, about 400 mm or more, about 450 mm or more, about 500 mm or more, about 550 mm or more, about 600 mm or more, about 650 mm or more, about 700 mm or more, about 750 mm or more, about 800 mm or more, about 850 mm or more, about 900 mm or more, about 950 mm or more, about 1,000 mm or more). In certain embodiments, the object-side free working distance is no more than about 2,000 mm (e.g., about 1,500 mm or less, about 1,200 mm or less, about 1,000 mm or less). A relatively large object-side free working distance may be advantageous in embodiments where access to the space between projection objective 101 and object plane 103 is desired. For example, in embodiments where reticle 140 is a reflective reticle, it is necessary to illuminate the reticle from the side that faces objective 101. Therefore, there should be sufficient space between projection objective 101 and object plane 103 to allow the reticle to be illuminated by illumination system 120 at a desired illumination angle. Furthermore, in general, a larger object-side free working distance allows flexibility in design of the rest of tool, for example, by providing sufficient space to mount other components between projection objective 101 and the support structure for reticle 140.

Figure 9B:
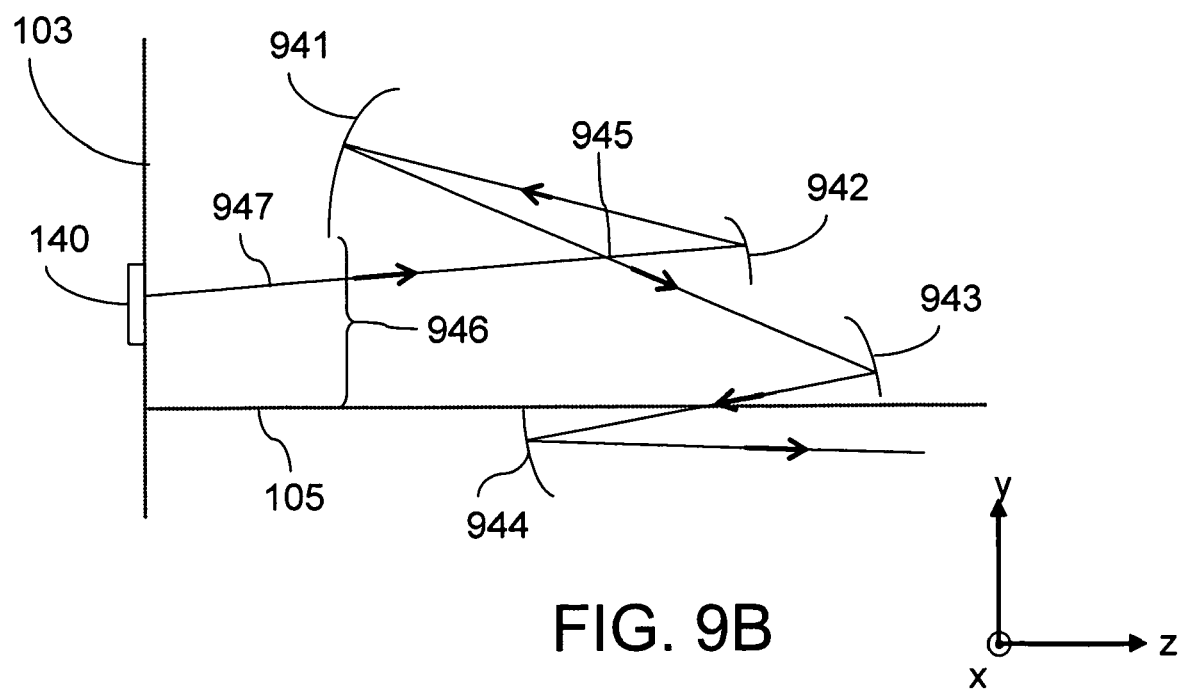
FIG. 9B is a cross-sectional view of a portion of an embodiment of a projection objective shown in meridional section.

In some embodiments, the mirror that is closest to object plane 103 can positioned away from optical axis 105. In other words, optical axis 105 does not intersect the mirror closest to object plane 103. For example, referring to FIG. 9B, in certain embodiments, projection objective 101 includes four mirrors 941-944, where mirror 941 is the closest mirror to object plane 103. The minimum distance between mirror 941 and optical axis 105 is shown by distance 946.

In some embodiments, distance 946 can be about 50 mm or more (e.g., about 60 mm or more, about 70 mm or more, about 80 mm or more, about 90 mm or more, about 100 mm or more, about 110 mm or more, about 120 mm or more, about 130 mm or more, about 140 mm or more, about 150 mm or more, about 160 mm or more, about 170 mm or more, about 180 mm or more, about 190 mm or more, about 200 mm or more, about 210 mm or more, about 220 mm or more, about 230 mm or more, about 240 mm or more, about 250 mm or more, about 260 mm or more, about 270 mm or more, about 280 mm or more, about 290 mm or more, about 300 mm or more). In certain embodiments, distance 946 is no more than about 1,000 mm (e.g., about 500 mm or less).

It may be advantageous to have a relatively large distance 946, because it can provide a relatively large space close to the point where optical axis 105 intersects object plane 103. This space may be utilized by other components in the lithography tool, such as one or more optical components of the illumination system (e.g., a grazing incidence reflective element).

Some of the radiation imaged by the projection objective follows the path of ray 947. The ray intersect the mirrors in the following order: mirror 942; mirror 941; mirror 943; and mirror 944. The path of ray 947 crosses itself at position 945, after reflecting from mirror 941, and between mirrors 941 and 943.

In general, projection objective 101 can be designed so that chief rays from reticle 140 either converge to, diverge from, or are parallel to optical axis 105. In other words, the position of the entrance pupil of projection objective 101 can vary with respect to object plane 103 depending on the projection objective design. In some embodiments, for example, object plane 103 is between projection objective 101 and the entrance pupil of projection objective 101. Alternatively, in certain embodiments, the entrance pupil is positioned between object plane 103 and projection objective 101.

Illumination system 120 may be arranged so that the exit pupil of the illumination system is positioned substantially at the entrance pupil of projection objective 101. In certain embodiments, illumination system 120 includes a telescope subsystem which projects the illumination system's exit pupil to the location of the entrance pupil of projection objective 101. However, in some embodiments, the exit pupil of illumination system 120 is positioned at the entrance pupil of projection objective 101 without using a telescope in the illumination system. For example, when the object plane 103 is between projection objective 101 and the entrance pupil of the projection objective, the exit pupil of illumination system 120 may coincide with the projection objective's entrance pupil without using a telescope in the illumination system.

In general, projection objective 101 can be designed using commercially available optical design software like ZEMAX, OSLO, or Code V. Typically, a design is started by specifying an initial projection objective design (e.g., arrangement of mirrors) along with parameters such as the radiation wavelength, field size and numerical aperture, for example. The code then optimizes the design for specified optical performance criteria, such as, for example, wavefront error, distortion, telecentricity, and image uniformity.

Figure 10:
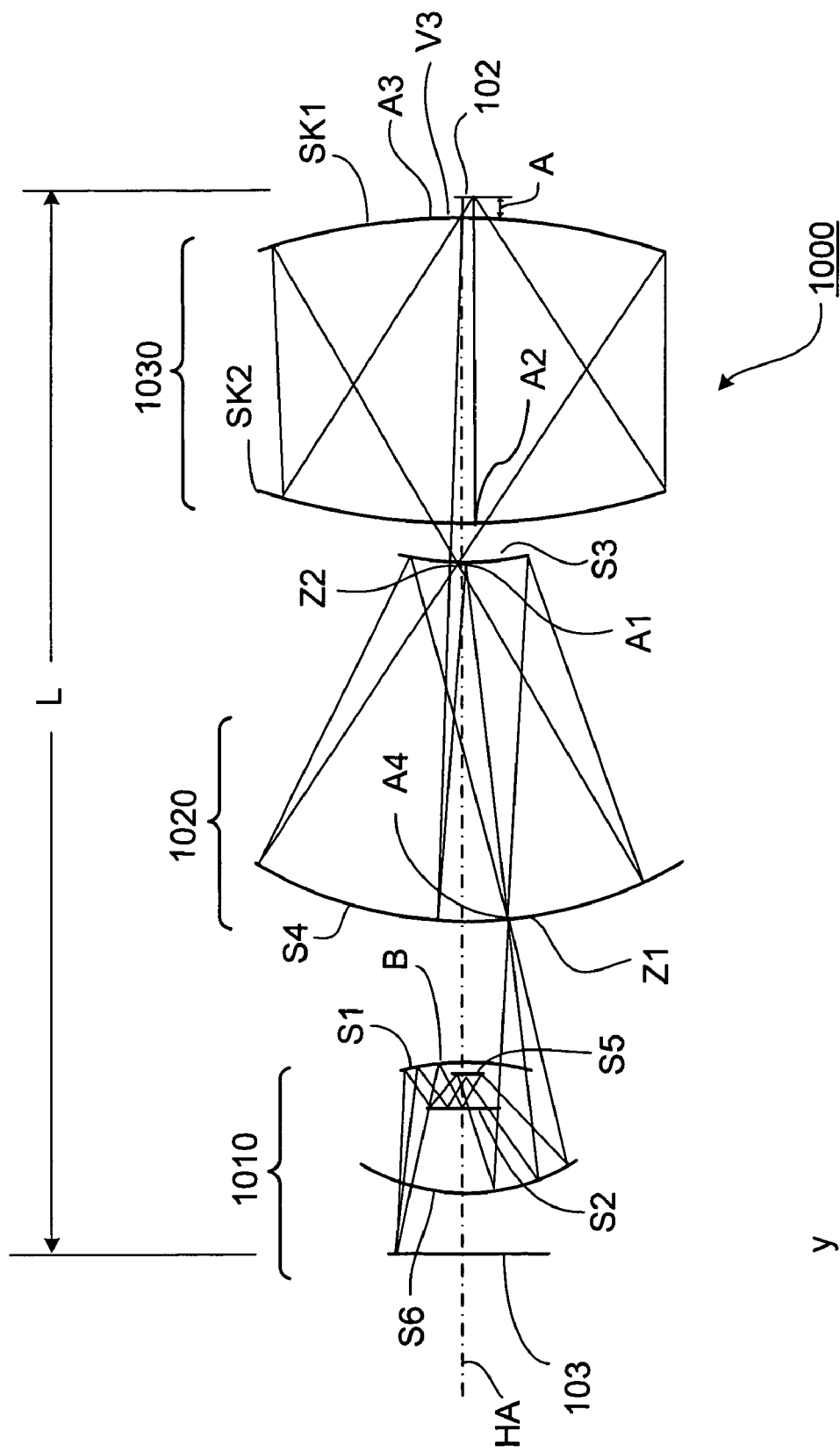
FIG. 10 is a cross-sectional view of an embodiment of a projection objective shown in meridional section.

Referring to FIG. 10, an embodiment of a projection objective 1000 includes eight mirrors S1, S2, S3, S4, S5, S6, SK1, and SK2, and has an image-side numerical aperture of 0.54 and an operating wavelength of 13.4 nm. Mirrors S1, S2, S3, S4, S5, S6, SK1, and SK2 are all aspherical mirrors. Projection objective 1000 images radiation from object plane 103 to image plane 102 with a demagnification ratio of 6× and a resolution of about 15 nm. The optical axis in relation to which the projection objective is rotationally symmetric is identified as HA, and the overall length of the system from object plane 103 to the image plane 102, the lengthwise dimension, L, is 1,745 mm.

Projection objective 1000 has a ring-segment field. The image-side field width, $d_x$, is 13 mm. The image-side field radius, $d_r$, is 20 mm. The image-side field length, $d_y$, is 1 mm. Image-side $W_{rms}$ is 0.024λ. Image-side field curvature is 3 nm.

The shape of the mirrors in the order of the radiation path from object plane 103 to image plane 102 is as follows: mirror S1 is a concave mirror; mirror S2 is a convex mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 43% of the aperture radius.

The image-side free working distance, shown as distance A between the vertex V3, i.e., the vertex of primary concave mirror SK1, and image plane 102 is 40 mm. The object-side free working distance is 100 mm.

The maximum angle of incidence on mirrors S1, S2, S3, S4, S5, S6, SK1, and SK2 of a chief ray of a central field point is 33.8°. The maximum angle of incidence of any ray on mirrors S1, S2, S3, S4, S5, S6, SK1, and SK2 is 38.6°. The maximum range of incident angles on any of mirrors S1, S2, S3, S4, S5, S6, SK1, and SK2 is 12.0°.

The size of the largest mirror in meridional section is 669 mm. The size of the largest mirror in the x-direction is 675 mm.

The mirrors are arranged so that projection objective 1000 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop. At least one of the pupil planes is accessible for positioning an obscuration stop, at the position of mirror S3, for example.

First partial objective 1010 has a total of four mirrors: mirror S1, mirror S2, mirror S5, and mirror S6. First partial objective 1010 forms an intermediate image Z1 in or close to mirror S4. This image is demagnified 1.77×.

Second partial objective 1020 has a total of two mirrors: mirror S3, and mirror S4. Second partial objective 1020 forms an intermediate image Z2 in or close to mirror S3. This image is demagnified 1.18×.

Third partial objective 1030 has a total of two mirrors: mirror SK1, and mirror SK2. Third partial objective 1030 forms an image in or close to image plane 102. This image is demagnified 2.88×.

An aperture stop B is positioned near mirror S5.

Data for projection objective 1000 is presented in Table 1A and Table 1B below. Table 1A presents optical data, while Table 1B presents aspherical constants for each of the mirror surfaces. For the purposes of Table 1A and Table 1B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 1A

| Surface | Radius | Thickness | Mode |
|---|---|---|---|
| Object | INFINITY | 316.480 | |
| Mirror 1 | −375.233 | −77.505 | REFL |
| Mirror 2 | 2976.73 | 51.007 | REFL |
| STOP | INFINITY | 0.000 | |
| Mirror 3 | 127.889 | −189.982 | REFL |
| Mirror 4 | 329.839 | 1029.934 | REFL |
| Mirror 5 | 787.6 | −596.052 | REFL |
| Mirror 6 | 735.437 | 1171.383 | REFL |
| Mirror 7 | −1195.158 | −512.255 | REFL |
| Mirror 8 | 977.668 | 552.254 | REFL |
| Image | INFINITY | 0.000 | |

TABLE 1B

| Surface | K | A | B | C |
|---|---|---|---|---|
| Mirror 1 | 0.00000E+00 | −3.72335E−09 | −1.17134E−13 | −9.45919E−19 |
| Mirror 2 | 0.00000E+00 | −6.42297E−08 | 5.78359E−13 | −1.12102E−17 |
| Mirror 3 | 0.00000E+00 | −1.89730E−07 | 1.46577E−11 | −7.35930E−15 |
| Mirror 4 | 0.00000E+00 | −6.59877E−10 | −4.46770E−15 | −8.43588E−22 |
| Mirror 5 | 0.00000E+00 | 6.80330E−10 | 8.62377E−15 | 7.97025E−20 |
| Mirror 6 | 0.00000E+00 | 1.51444E−10 | 4.21253E−16 | 9.86205E−22 |
| Mirror 7 | 0.00000E+00 | −9.01450E−11 | 7.43085E−17 | −9.79557E−22 |
| Mirror 8 | 0.00000E+00 | −4.33573E−10 | −6.45281E−16 | 1.20541E−22 |

| Surface | D | E | F | G |
|---|---|---|---|---|
| Mirror 1 | 2.64879E−22 | −1.44452E−26 | 3.02340E−31 | 0.00000E+00 |
| Mirror 2 | 1.41033E−20 | −2.65285E−24 | 1.76103E−28 | 8.50988E−33 |
| Mirror 3 | 4.29136E−18 | 4.55565E−22 | 6.01716E−23 | −9.67457E−26 |
| Mirror 4 | −1.47803E−24 | 4.37901E−29 | −7.78139E−34 | 6.26619E−39 |
| Mirror 5 | 9.90660E−24 | −3.49519E−27 | 2.27576E−31 | −5.30361E−36 |
| Mirror 6 | 2.49255E−27 | 3.14626E−33 | 1.55856E−38 | 5.58485E−45 |
| Mirror 7 | 6.90221E−27 | −3.91894E−32 | 1.37730E−37 | −2.19834E−43 |
| Mirror 8 | 6.77194E−28 | 1.92112E−32 | −7.82371E−38 | 1.09694E−43 |

Figure 11:
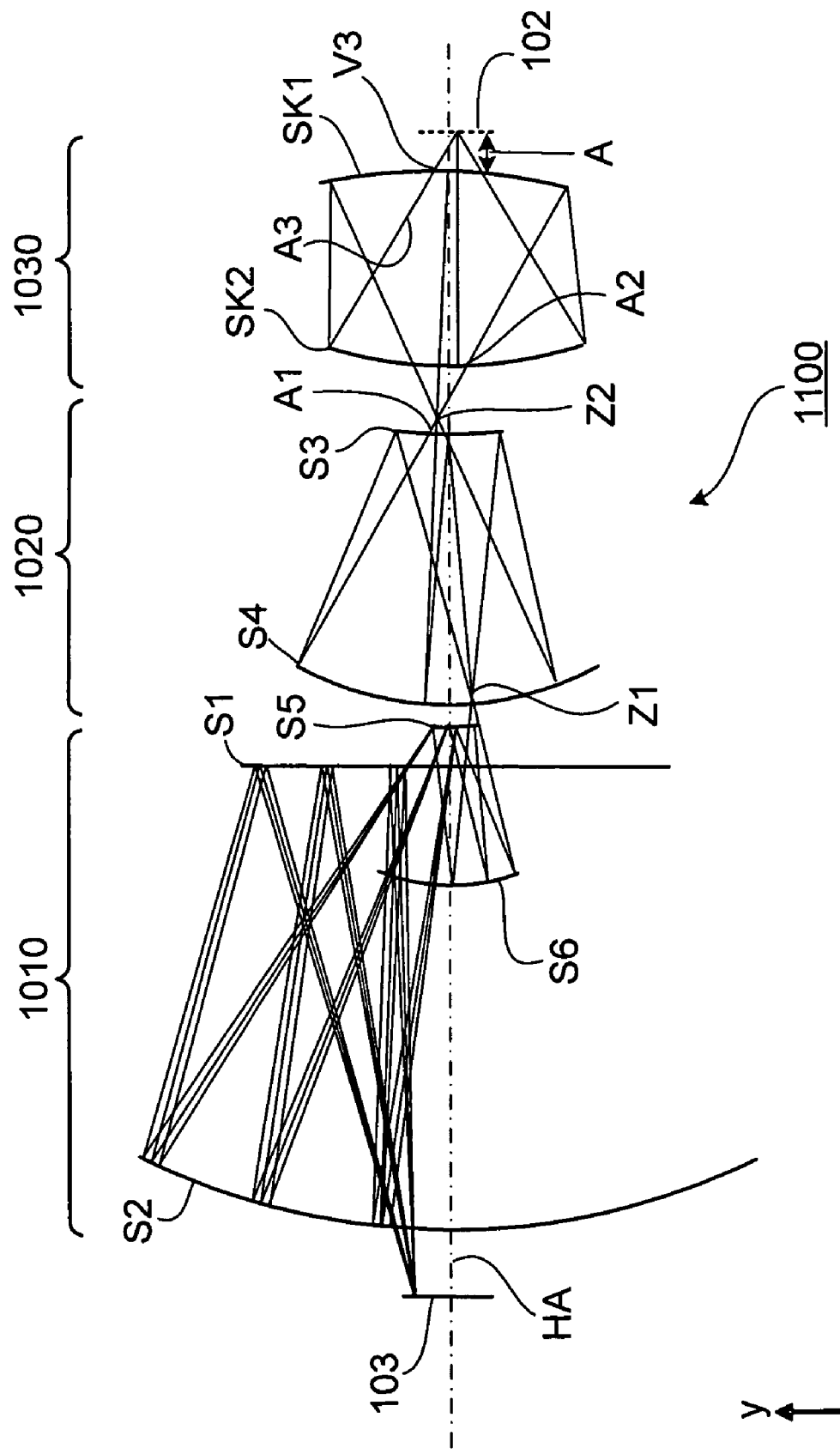
FIG. 11 is a cross-sectional view of another embodiment of a projection objective shown in meridional section.

Referring to FIG. 11, an embodiment of a projection objective 1100 includes eight mirrors S1, S2, S3, S4, S5, S6, SK1, and SK2, and has an image-side numerical aperture of 0.5 and an operating wavelength of 13.5 nm. Mirrors S1, S2, S3, S4, S5, S6, SK1, and SK2 are all aspherical mirrors. Projection objective 1100 images radiation from object plane 103 to image plane 102 with a demagnification ratio of 4× and a resolution of about 17 nm. The optical axis in relation to which the projection objective is rotationally symmetric is identified as HA, and the overall length of the system from object plane 103 to the image plane 102, the lengthwise dimension, L, is 1,711 mm.

Projection objective 1100 has a ring-segment field. The image-side field width, $d_x$, is 13 mm. The image-side field radius, $d_r$, is 13 mm. The image-side field length, $d_y$, is 1 mm. Image-side $W_{rms}$ is 0.044λ. Image-side field curvature is 12 nm.

The shape of the mirrors in the order of the radiation path from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 36% of the aperture radius.

The image-side free working distance is 69 mm. The object side free working distance is 100 mm.

The maximum angle of incidence on mirrors S1, S2, S3, S4, S5, S6, SK1, and SK2 of a chief ray of a central field point is 19.4°. The maximum angle of incidence of any ray on mirrors S1, S2, S3, S4, S5, S6, SK1, and SK2 is 21.8°. The maximum range of incident angles on any of mirrors S1, S2, S3, S4, S5, S6, SK1, and SK2 is 15.0°.

The size of the largest mirror in meridional section is 385 mm. The size of the largest mirror in the x-direction is 616 mm.

The mirrors are arranged so that projection objective 1100 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop.

First partial objective 1010 has a total of four mirrors: mirror S1, mirror S2, mirror S5, and mirror S6. First partial objective 1010 forms an intermediate image Z1 in or close to mirror S4.

Second partial objective 1020 has a total of two mirrors: mirror S3, and mirror S4. Second partial objective 1020 forms an intermediate image Z2 in or close to mirror S3.

Third partial objective 1030 has a total of two mirrors: mirror SK1, and mirror SK2. Third partial objective 1030 forms an image in or close to image plane 102.

An aperture stop is positioned near mirror S3.

Data for projection objective 1100 is presented in Table 2A and Table 2B below. Table 2A presents optical data, while Table 2B presents aspherical constants for each of the mirror surfaces. For the purposes of Table 2A and Table 2B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 2A

| Surface | Radius | Thickness | Mode |
|---|---|---|---|
| Object | INFINITY | 762.134 | |
| Mirror 1 | 44367.928 | −662.134 | REFL |
| Mirror 2 | 1027.348 | 717.444 | REFL |
| Mirror 3 | 122.696 | −209.209 | REFL |
| Mirror 4 | 298.792 | 645.481 | REFL |
| STOP | INFINITY | 0.000 | |
| Mirror 5 | 1184.237 | −391.582 | REFL |
| Mirror 6 | 518.111 | 780.329 | REFL |
| Mirror 7 | −834.844 | −288.328 | REFL |
| Mirror 8 | 612.533 | 357.344 | REFL |
| Image | INFINITY | 0.000 | |

TABLE 2B

| Surface | K | A | B |
|---|---|---|---|
| Mirror 1 | 0.00000E+00 | −7.47500E−11 | −1.75668E−16 |
| Mirror 2 | 0.00000E+00 | −1.89057E−11 | −2.80932E−17 |
| Mirror 3 | 0.00000E+00 | 4.36794E−08 | −1.06646E−11 |
| Mirror 4 | 0.00000E+00 | 2.82491E−10 | 8.34214E−15 |
| Mirror 5 | 0.00000E+00 | −3.60521E−09 | 9.55167E−14 |

TABLE 2B-continued

| | | | |
|---|---|---|---|
| Mirror 6 | 0.00000E+00 | 3.17133E−10 | 1.58610E−15 |
| Mirror 7 | 0.00000E+00 | 1.39054E−10 | −7.02552E−16 |
| Mirror 8 | 0.00000E+00 | −1.05535E−09 | −1.09975E−15 |

| Surface | C | D | E |
|---|---|---|---|
| Mirror 1 | 3.61103E−22 | 3.67940E−28 | 0.00000E+00 |
| Mirror 2 | −3.13881E−23 | −4.81965E−29 | 0.00000E+00 |
| Mirror 3 | 2.88089E−15 | 1.57635E−18 | 0.00000E+00 |
| Mirror 4 | 1.25238E−19 | 6.61889E−25 | 4.85405E−29 |
| Mirror 5 | −3.43883E−18 | −4.42296E−23 | −5.96479E−28 |
| Mirror 6 | 7.12061E−21 | 2.79827E−26 | 2.00701E−31 |
| Mirror 7 | 1.18760E−20 | −6.15624E−26 | 5.37541E−31 |
| Mirror 8 | 8.52603E−23 | 3.64425E−26 | 2.56412E−31 |

Figure 12:
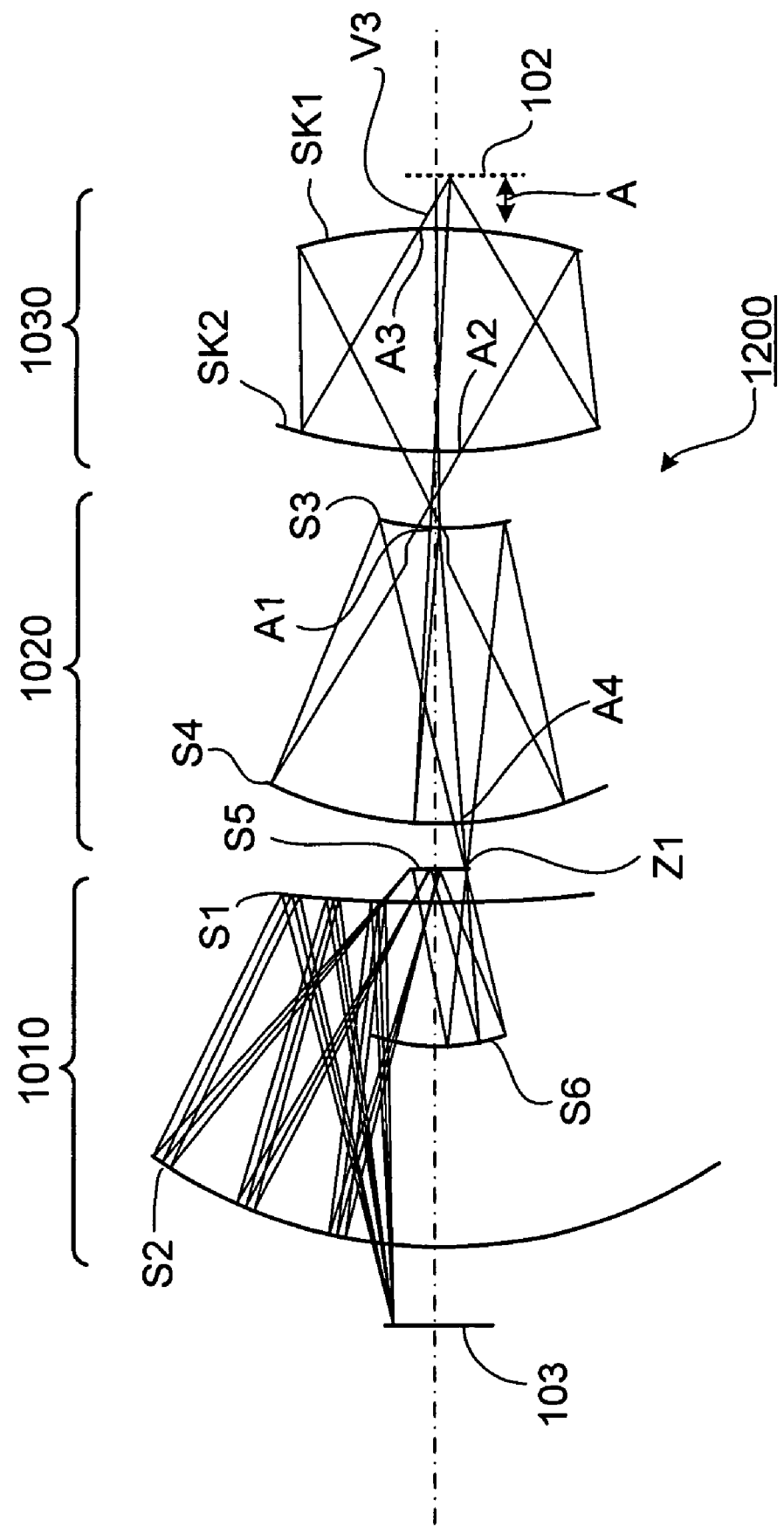
FIG. 12 is a cross-sectional view of a further embodiment of a projection objective shown in meridional section.

Referring to FIG. 12, an embodiment of a projection objective 1200 includes eight mirrors S1, S2, S3, S4, S5, S6, SK1, and SK2, and has an image-side numerical aperture of 0.5 and an operating wavelength of 13.5 nm. Mirrors S1, S2, S3, S4, S5, S6, SK1, and SK2 are all aspherical mirrors. Projection objective 1200 images radiation from object plane 103 to image plane 102 with a demagnification ratio of 5× and a resolution of about 17 nm. The optical axis in relation to which the projection objective is rotationally symmetric is identified as HA, and the overall length of the system from object plane 103 to the image plane 102, the lengthwise dimension, L, is 1,509 mm.

Projection objective 1200 has a ring-segment field. The image-side field width, $d_x$, is 22 mm. The image-side field radius, $d_r$, is 12.6 mm. The image-side field length, $d_y$, is 1 mm. Image-side $W_{rms}$ is 0.01λ. Image-side field curvature is 2 nm.

The shape of the mirrors in the order of the radiation path from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 35% of the aperture radius.

The image-side free working distance A is 69 mm. The object-side free working distance is 104 mm.

The maximum angle of incidence on mirrors S1, S2, S3, S4, S5, S6, SK1, and SK2 of a chief ray of a central field point is 23.1°. The maximum angle of incidence of any ray on mirrors S1, S2, S3, S4, S5, S6, SK1, and SK2 is 26.6°. The maximum range of incident angles on any of mirrors S1, S2, S3, S4, S5, S6, SK1, and SK2 is 16.0°.

The size of the largest mirror in meridional section is 394 mm. The size of the largest mirror in the x-direction is 669 mm.

The mirrors are arranged so that projection objective 1200 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop.

First partial objective 1010 has a total of four mirrors: mirror S1, mirror S2, mirror S5, and mirror S6. First partial objective 1010 forms an intermediate image Z1 in or close to mirror S4.

Second partial objective 1020 has a total of two mirrors: mirror S3, and mirror S4. Second partial objective 1020 forms an intermediate image Z2 in or close to mirror S3.

Third partial objective 1030 has a total of two mirrors: mirror SK1, and mirror SK2. Third partial objective 1030 forms an image in or close to image plane 102.

An aperture stop is positioned near mirror S3.

Data for projection objective 1200 is presented in Table 3A and Table 3B below. Table 3A presents optical data, while Table 3B presents aspherical constants for each of the mirror surfaces. For the purposes of Table 3A and Table 3B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 3A

| Surface | Radius | Thickness | Mode |
|---|---|---|---|
| Object | INFINITY | 546.051 | |
| Mirror 1 | 1813.761 | −442.075 | REFL |
| Mirror 2 | 659.925 | 484.056 | REFL |
| Mirror 3 | 124.229 | −230.251 | REFL |
| Mirror 4 | 297.991 | 681.239 | REFL |
| STOP | INFINITY | 0.000 | |
| Mirror 5 | 1044.821 | −388.855 | REFL |
| Mirror 6 | 513.480 | 790.082 | REFL |
| Mirror 7 | −788.712 | −300.808 | REFL |
| Mirror 8 | 679.931 | 369.811 | REFL |
| Image | INFINITY | 0.000 | |

TABLE 3B

| Surface | K | A | B |
|---|---|---|---|
| Mirror 1 | 0.00000E+00 | −1.19695E−10 | −8.52500E−16 |
| Mirror 2 | 0.00000E+00 | −3.36861E−12 | −7.92767E−18 |
| Mirror 3 | 0.00000E+00 | 9.84422E−08 | 1.34188E−11 |
| Mirror 4 | 0.00000E+00 | 1.55138E−09 | 3.79123E−14 |
| Mirror 5 | 0.00000E+00 | −4.54986E−09 | −1.08708E−13 |
| Mirror 6 | 0.00000E+00 | 1.67047E−10 | 5.41737E−16 |
| Mirror 7 | 0.00000E+00 | 5.45494E−10 | 1.78568E−15 |
| Mirror 8 | 0.00000E+00 | −5.70218E−10 | 1.44136E−15 |

| Surface | C | D | E |
|---|---|---|---|
| Mirror 1 | 7.78764E−22 | 2.36289E−26 | 0.00000E+00 |
| Mirror 2 | −1.47046E−23 | −1.76721E−28 | 0.00000E+00 |
| Mirror 3 | 1.19275E−15 | 7.18150E−19 | 0.00000E+00 |
| Mirror 4 | 7.88066E−19 | 1.04079E−23 | 8.66992E−28 |
| Mirror 5 | −1.73422E−18 | −5.79768E−23 | 2.10975E−27 |
| Mirror 6 | 1.67663E−21 | 5.27011E−27 | 2.40781E−32 |
| Mirror 7 | 9.69823E−21 | 1.84324E−26 | −1.96285E−32 |
| Mirror 8 | 6.92822E−21 | −1.65770E−26 | 4.86553E−32 |

Figure 13:
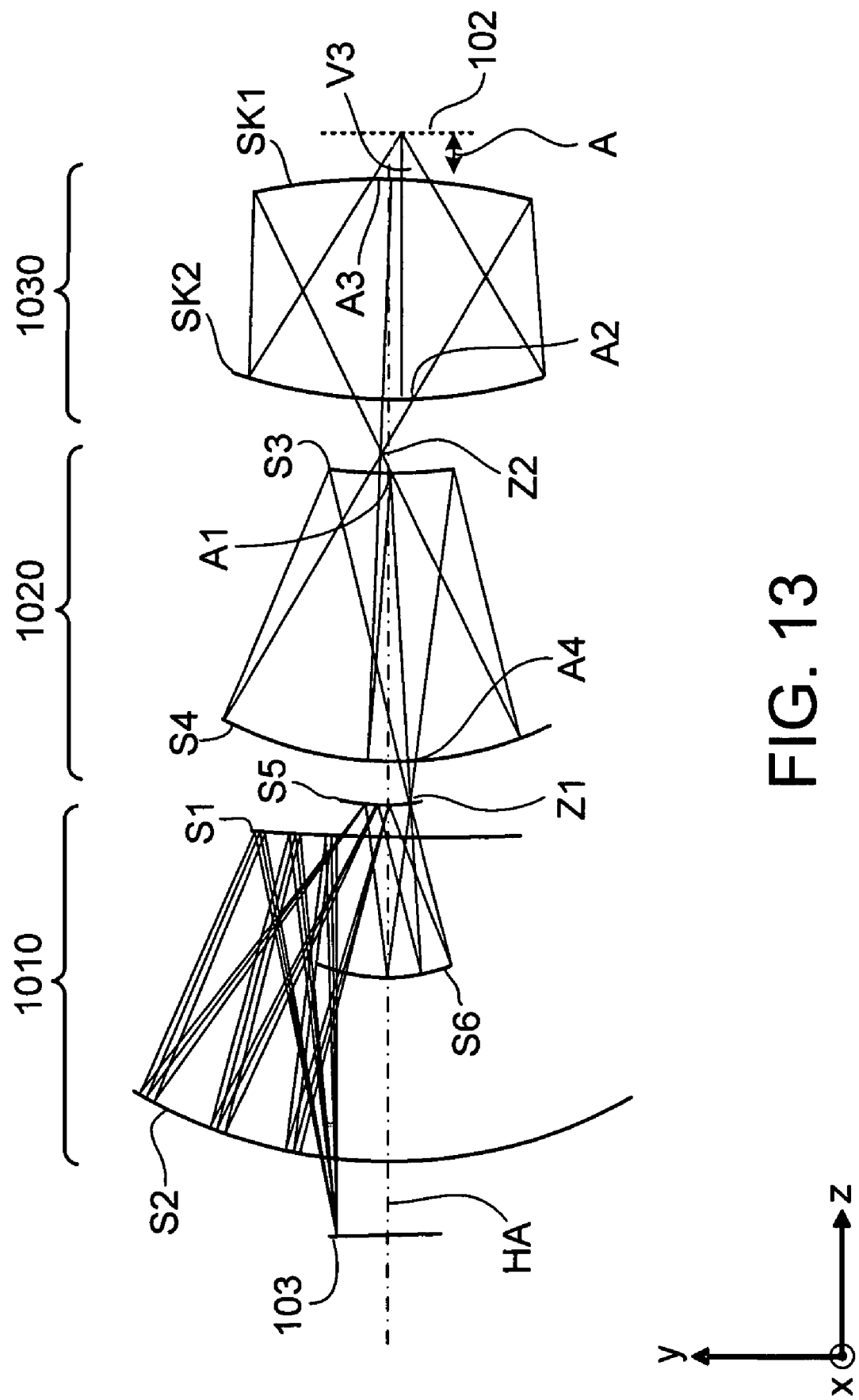
FIG. 13 is a cross-sectional view of another embodiment of a projection objective shown in meridional section.

Referring to FIG. 13, an embodiment of a projection objective 1300 includes eight mirrors S1, S2, S3, S4, S5, S6, SK1, and SK2, and has an image-side numerical aperture of 0.5 and an operating wavelength of 13.5 nm. Mirrors S1, S2, S3, S4, S5, S6, SK1, and SK2 are all aspherical mirrors. Projection objective 1300 images radiation from object plane 103 to image plane 102 with a demagnification ratio of 6× and a resolution of about 17 nm. The optical axis in relation to which the projection objective is rotationally symmetric is identified as HA, and the overall length of the system from object plane 103 to the image plane 102, the lengthwise dimension, L, is 1,508 mm.

Projection objective 1300 has a ring-segment field. The image-side field width, $d_x$, is 18 mm. The image-side field radius, $d_r$, is 10.5 mm. The image-side field length, $d_y$, is 1 mm. Image-side $W_{rms}$ is 0.006λ. Image-side field curvature is 2 nm.

The shape of the mirrors in the order of the radiation path from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 31% of the aperture radius.

The image-side free working distance is 69 mm. The object-side free working distance is 102 mm.

The maximum angle of incidence on mirrors S1, S2, S3, S4, S5, S6, SK1, and SK2 of a chief ray of a central field point is 20.0°. The maximum angle of incidence of any ray on mirrors S1, S2, S3, S4, S5, S6, SK1, and SK2 is 22.3°. The maximum range of incident angles on any of mirrors S1, S2, S3, S4, S5, S6, SK1, and SK2 is 13.6°.

The size of the largest mirror in meridional section is 396 mm. The size of the largest mirror in the x-direction is 575 mm.

The mirrors are arranged so that projection objective 1300 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop.

First partial objective 1010 has a total of four mirrors: mirror S1, mirror S2, mirror S5, and mirror S6. First partial objective 1010 forms an intermediate image Z1 in or close to mirror S4.

Second partial objective 1020 has a total of two mirrors: mirror S3, and mirror S4. Second partial objective 1020 forms an intermediate image Z2 in or close to mirror S3.

Third partial objective 1030 has a total of two mirrors: mirror SK1, and mirror SK2. Third partial objective 1030 forms an image in or close to image plane 102.

An aperture stop is positioned near mirror S3.

Data for projection objective 1300 is presented in Table 4A and Table 4B below. Table 4A presents optical data, while Table 4B presents aspherical constants for each of the mirror surfaces. For the purposes of Table 4A and Table 4B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 4A

| Surface | Radius | Thickness | Mode |
|---|---|---|---|
| Object | INFINITY | 541.176 | |
| Mirror 1 | 1654.286 | −438.932 | REFL |
| Mirror 2 | 662.227 | 486.164 | REFL |

TABLE 4A-continued

| Surface | Radius | Thickness | Mode |
|---|---|---|---|
| Mirror 3 | 124.521 | −234.334 | REFL |
| Mirror 4 | 296.656 | 684.148 | REFL |
| STOP | INFINITY | 0.000 | |
| Mirror 5 | 1078.372 | −388.948 | REFL |
| Mirror 6 | 513.362 | 789.957 | REFL |
| Mirror 7 | −788.995 | −300.590 | REFL |
| Mirror 8 | 680.459 | 369.601 | REFL |
| Image | INFINITY | 0.000 | |

TABLE 4B

| Surface | K | A | B |
|---|---|---|---|
| Mirror 1 | 0.00000E+00 | −2.36631E−10 | −8.55660E−16 |
| Mirror 2 | 0.00000E+00 | −5.67713E−12 | −1.95884E−17 |
| Mirror 3 | 0.00000E+00 | 1.11517E−07 | 1.37540E−11 |
| Mirror 4 | 0.00000E+00 | 1.49061E−09 | 3.64316E−14 |
| Mirror 5 | 0.00000E+00 | −3.81551E−09 | −9.20087E−14 |
| Mirror 6 | 0.00000E+00 | 1.71591E−10 | 5.38871E−16 |
| Mirror 7 | 0.00000E+00 | 5.11749E−10 | 1.71998E−15 |
| Mirror 8 | 0.00000E+00 | −5.78016E−10 | 1.45805E−15 |

| Surface | C | D | E |
|---|---|---|---|
| Mirror 1 | −2.47185E−21 | 7.32017E−26 | 0.00000E+00 |
| Mirror 2 | −5.87523E−23 | −3.53329E−28 | 0.00000E+00 |
| Mirror 3 | 1.28574E−15 | 7.20115E−19 | 0.00000E+00 |
| Mirror 4 | 7.29870E−19 | 1.30379E−23 | 6.71117E−28 |
| Mirror 5 | −1.57361E−18 | −5.49020E−23 | 1.99214E−27 |
| Mirror 6 | 1.53854E−21 | 4.80288E−27 | 1.35503E−32 |
| Mirror 7 | 9.34714E−21 | 1.84180E−26 | −2.13432E−32 |
| Mirror 8 | 7.06565E−21 | −1.76539E−26 | 4.32302E−32 |

Figure 14:
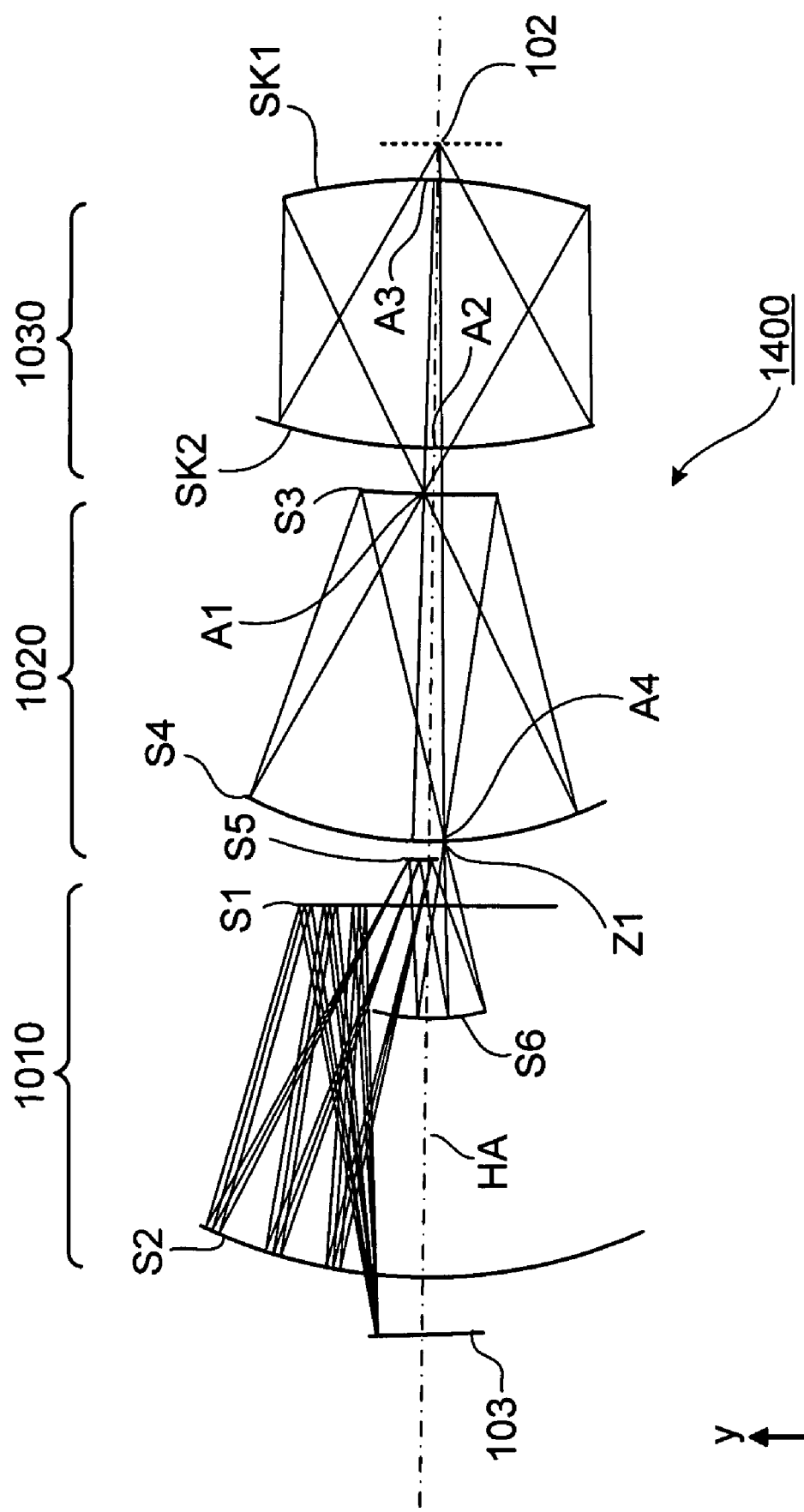
FIG. 14 is a cross-sectional view of a further embodiment of a projection objective shown in meridional section.

Referring to FIG. 14, an embodiment of a projection objective 1400 includes eight mirrors S1, S2, S3, S4, S5, S6, SK1, and SK2, and has an image-side numerical aperture of 0.5 and an operating wavelength of 13.5 nm. Mirrors S1, S2, S3, S4, S5, S6, SK1, and SK2 are all aspherical mirrors. Projection objective 1000 images radiation from object plane 103 to image plane 102 with a demagnification ratio of 8× and a resolution of about 17 nm. The optical axis in relation to which the projection objective is rotationally symmetric is identified as HA, and the overall length of the system from object plane 103 to the image plane 102, the lengthwise dimension, L, is 2,000 mm.

Projection objective 1400 has a ring-segment field. The image-side field width, $d_x$, is 13 mm. The image-side field radius, $d_r$, is 10.5 mm. The image-side field length, $d_y$, is 1 mm. Image-side $W_{rms}$ is 0.033λ. Image-side field curvature is 7 nm.

The shape of the mirrors in the order of the radiation path from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror. Mirror S1 has a very large radius of curvature such as, for example, a radius of curvature greater than 10 m. Mirror S1 may be substituted by a planar mirror or a concave mirror with similarly large radius of curvature in some embodiments.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 21% of the aperture radius.

The image-side free working distance is 61 mm. The object-side free working distance is 100 mm.

The maximum angle of incidence on mirrors S1, S2, S3, S4, S5, S6, SK1, and SK2 of a chief ray of a central field point is 15.9°. The maximum angle of incidence of any ray on mirrors S1, S2, S3, S4, S5, S6, SK1, and SK2 is 17.9°. The maximum range of incident angles on any of mirrors S1, S2, S3, S4, S5, S6, SK1, and SK2 is 10.6°.

The size of the largest mirror in meridional section is 574 mm. The size of the largest mirror in the x-direction is 602 mm.

The mirrors are arranged so that projection objective 1400 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop.

First partial objective 1010 has a total of four mirrors: mirror S1, mirror S2, mirror S5, and mirror S6. First partial objective 1010 forms an intermediate image Z1 in or close to mirror S4.

Second partial objective 1020 has a total of two mirrors: mirror S3, and mirror S4. Second partial objective 1020 forms an intermediate image Z2 in or close to mirror S3.

Third partial objective 1030 has a total of two mirrors: mirror SK1, and mirror SK2. Third partial objective 1030 forms an image in or close to image plane 102.

An aperture stop is positioned near mirror S3.

Data for projection objective 1400 is presented in Table 5A and Table 5B below. Table 5A presents optical data, while Table 5B presents aspherical constants for each of the mirror surfaces. For the purposes of Table 5A and Table 5B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 5A

| Surface | Radius | Thickness | Mode |
|---|---|---|---|
| Object | INFINITY | 718.810 | |
| Mirror 1 | 15385.939 | −618.810 | REFL |
| Mirror 2 | 1044.688 | 695.118 | REFL |
| Mirror 3 | 147.529 | −266.967 | REFL |
| Mirror 4 | 330.139 | 870.985 | REFL |
| STOP | INFINITY | 0.000 | |
| Mirror 5 | 1943.227 | −572.412 | REFL |
| Mirror 6 | 750.946 | 1111.744 | REFL |
| Mirror 7 | −1056.656 | −459.333 | REFL |
| Mirror 8 | 963.397 | 520.863 | REFL |
| Image | INFINITY | 0.000 | |

TABLE 5B

| Surface | K | A | B | C |
|---|---|---|---|---|
| Mirror 1 | 0.00000E+00 | 1.03935E-09 | 2.87706E-15 | 2.44500E-21 |
| Mirror 2 | 0.00000E+00 | 1.49306E-10 | 4.00929E-18 | 1.48243E-22 |
| Mirror 3 | 0.00000E+00 | 1.18016E-07 | -3.53495E-12 | -4.55098E-17 |
| Mirror 4 | 0.00000E+00 | -2.54082E-09 | 5.38905E-15 | -4.39113E-19 |
| Mirror 5 | 0.00000E+00 | -4.90575E-10 | -1.53636E-14 | -6.47129E-19 |
| Mirror 6 | 0.00000E+00 | 1.36782E-10 | 1.60457E-16 | -3.92581E-25 |
| Mirror 7 | 0.00000E+00 | 1.87167E-10 | 7.58028E-16 | 1.89696E-21 |
| Mirror 8 | 0.00000E+00 | -3.76514E-10 | 1.37610E-15 | 1.26961E-21 |

| Surface | D | E | F | G |
|---|---|---|---|---|
| Mirror 1 | -2.92087E-26 | 1.22174E-30 | -2.07471E-36 | 0.00000E+00 |
| Mirror 2 | 4.70420E-28 | -1.12401E-33 | 1.99786E-39 | 0.00000E+00 |
| Mirror 3 | 4.31101E-19 | -1.46428E-31 | 2.97986E-26 | 0.00000E+00 |
| Mirror 4 | 1.06326E-23 | -1.79423E-28 | -1.59791E-33 | 0.00000E+00 |
| Mirror 5 | -3.42940E-24 | -1.75351E-28 | 8.76415E-33 | 0.00000E+00 |
| Mirror 6 | -2.81150E-29 | -4.22172E-33 | 2.23604E-38 | 0.00000E+00 |
| Mirror 7 | 7.95754E-27 | -8.87929E-33 | -5.33665E-40 | 0.00000E+00 |
| Mirror 8 | -6.32171E-27 | -3.06485E-32 | 1.56764E-37 | 0.00000E+00 |

Figure 15A:
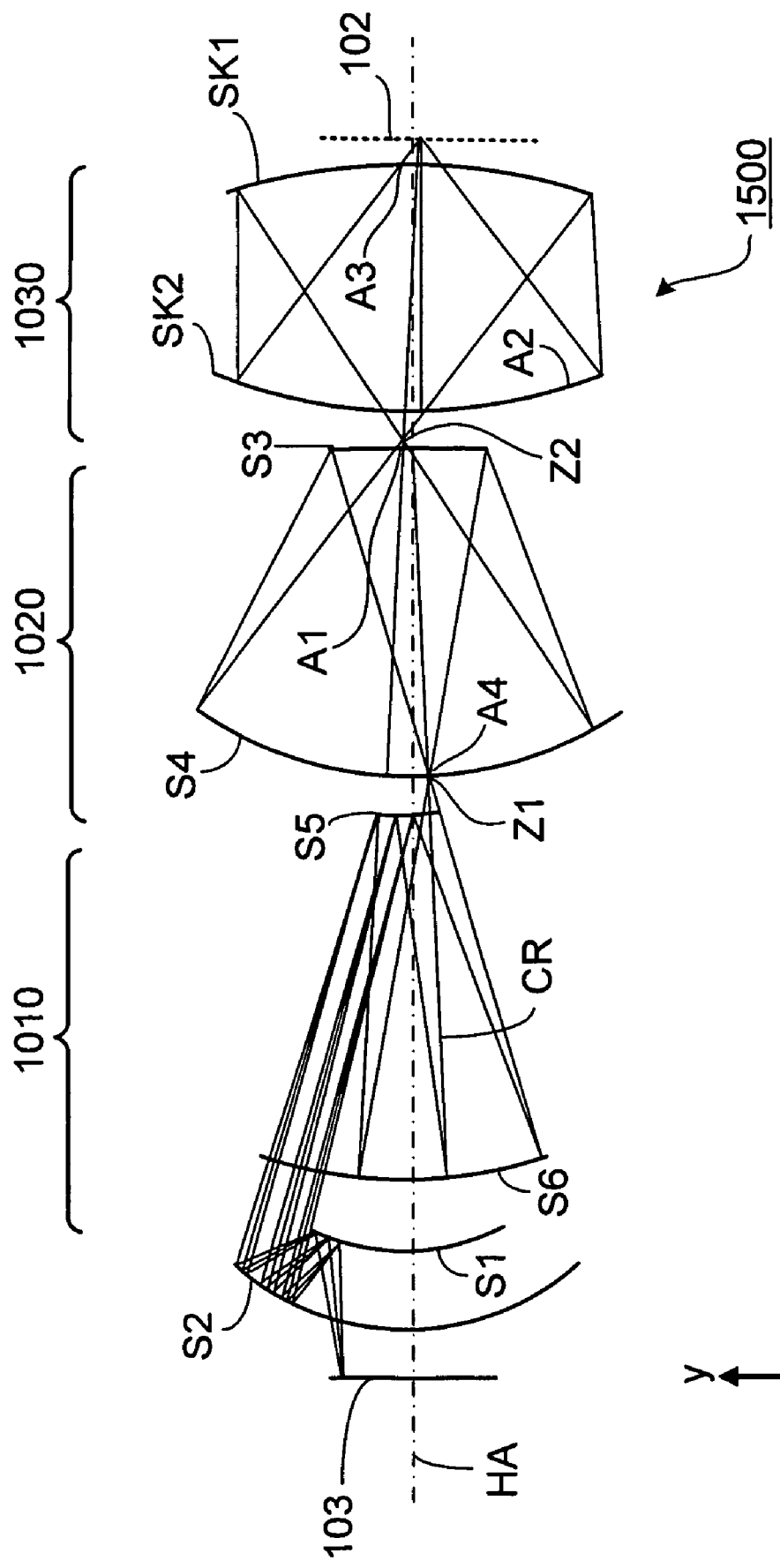
FIG. 15A is a cross-sectional view of another embodiment of a projection objective shown in meridional section.

Referring to FIG. 15A, an embodiment of a projection objective 1500 includes eight mirrors S1, S2, S3, S4, S5, S6, SK1, and SK2, and has an image-side numerical aperture of 0.6 and an operating wavelength of 13.5 nm. Mirrors S1, S2, S3, S4, S5, S6, SK1, and SK2 are all aspherical mirrors. Projection objective 1500 images radiation from object plane 103 to image plane 102 with a demagnification ratio of 8× and a resolution of about 14 nm. The optical axis in relation to which the projection objective is rotationally symmetric is identified as HA, and the overall length of the system from object plane 103 to the image plane 102, the lengthwise dimension, L, is 2,500 mm.

Projection objective 1500 has a ring-segment field. The image-side field width, $d_x$, is 13 mm. The image-side field radius, $d_r$, is 15.0 mm. The image-side field length, $d_y$, is 1 mm. Image-side $W_{rms}$ is 0.017λ. Image-side field curvature is 1 nm.

The shape of the mirrors in the order of the radiation path from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Opening A1 is located in mirror S3, opening A2 is located in mirror SK2, opening A3 is located in mirror SK1, and opening A4 is located in mirror S4. Mirrors S1, S2, S5, and S6 do not include openings. The resulting obscuration radius that provides a field-independent obscuration is 22% of the aperture radius.

The image-side free working distance is 55 mm. The object-side free working distance is 100 mm.

The maximum angle of incidence on mirrors S1, S2, S3, S4, S5, S6, SK1, and SK2 of a chief ray of a central field point is 28.3°. The maximum angle of incidence of any ray on mirrors S1, S2, S3, S4, S5, S6, SK1, and SK2 is 36.6°. The maximum range of incident angles on any of mirrors S1, S2, S3, S4, S5, S6, SK1, and SK2 is 16.6°.

The size of the largest mirror in meridional section is 778 mm. The size of the largest mirror in the x-direction is 806 mm.

The mirrors are arranged so that projection objective 1500 contains three partial objectives: a first partial objective 1010, a second partial objective 1020, and a third partial objective 1030. Accordingly, projection objective 1000 produces three pupil planes and two intermediate images. At least one of the pupil planes is accessible for positioning an aperture stop.

First partial objective 1010 has a total of four mirrors: mirror S1, mirror S2, mirror S5, and mirror S6. First partial objective 1010 forms an intermediate image Z1 in or close to mirror S4.

Second partial objective 1020 has a total of two mirrors: mirror S3, and mirror S4. Second partial objective 1020 forms an intermediate image Z2 in or close to mirror S3.

Third partial objective 1030 has a total of two mirrors: mirror SK1, and mirror SK2. Third partial objective 1030 forms an image in or close to image plane 102.

Data for projection objective 1500 is presented in Table 6A and Table 6B below. Table 6A presents optical data, while Table 6B presents aspherical constants for each of the mirror surfaces. For the purposes of Table 6A and Table 6B, the mirror designations correlate as follows: mirror 1 corresponds to mirror S1; mirror 2 corresponds to mirror S2; mirror 3 corresponds to mirror S5; mirror 4 corresponds to mirror S6; mirror 5 corresponds to mirror S3; mirror 6 corresponds to mirror S4; mirror 7 corresponds to the primary concave mirror SK1; and mirror 8 corresponds to the secondary concave mirror SK2.

TABLE 6A

| Surface | Radius | Thickness | Mode |
|---|---|---|---|
| Object | INFINITY | 257.565 | |
| Mirror 1 | 384.091 | -157.565 | REFL |
| Mirror 2 | 503.282 | 1033.640 | REFL |
| Mirror 3 | 319.62 | -732.625 | REFL |
| Mirror 4 | 847.883 | 1465.334 | REFL |
| STOP | INFINITY | 0.000 | |
| Mirror 5 | 2114.302 | -643.385 | REFL |
| Mirror 6 | 842.763 | 1221.637 | REFL |
| Mirror 7 | -1165.231 | -498.252 | REFL |
| Mirror 8 | 1000.806 | 553.650 | REFL |
| Image | INFINITY | 0.000 | |

TABLE 6B

| Surface | K | A | B | C |
|---|---|---|---|---|
| Mirror 1 | 0.00000E+00 | −1.77573E−09 | 3.48952E−15 | −6.57559E−19 |
| Mirror 2 | 0.00000E+00 | −1.90688E−10 | −1.12202E−16 | −8.55933E−21 |
| Mirror 3 | 0.00000E+00 | 8.18543E−09 | 1.94772E−13 | −1.20733E−17 |
| Mirror 4 | 0.00000E+00 | −6.32144E−11 | −3.16379E−17 | −1.24533E−22 |
| Mirror 5 | 0.00000E+00 | 5.20532E−10 | −3.03678E−15 | 5.56242E−21 |
| Mirror 6 | 0.00000E+00 | 8.24359E−11 | 1.21698E−16 | 1.72019E−22 |
| Mirror 7 | 0.00000E+00 | 1.04209E−10 | 5.94759E−17 | 3.29996E−22 |
| Mirror 8 | 0.00000E+00 | −2.52357E−10 | 8.47992E−17 | 5.92488E−22 |

| Surface | D | E | F | G |
|---|---|---|---|---|
| Mirror 1 | 2.03449E−23 | −3.58406E−28 | 2.56981E−33 | 0.00000E+00 |
| Mirror 2 | 4.01912E−26 | −1.85143E−31 | 0.00000E+00 | 0.00000E+00 |
| Mirror 3 | 5.33524E−21 | −1.38304E−24 | 1.60705E−28 | 0.00000E+00 |
| Mirror 4 | 2.11929E−28 | −1.37968E−33 | 4.50488E−39 | 0.00000E+00 |
| Mirror 5 | −2.48900E−25 | 4.49855E−30 | −1.02965E−34 | 0.00000E+00 |
| Mirror 6 | 2.88661E−28 | 2.26755E−34 | 1.46632E−39 | 0.00000E+00 |
| Mirror 7 | −9.32494E−29 | 7.01284E−34 | 1.83576E−39 | 0.00000E+00 |
| Mirror 8 | −1.30631E−27 | 1.75865E−33 | 6.32541E−40 | 0.00000E+00 |

Figure 15B:
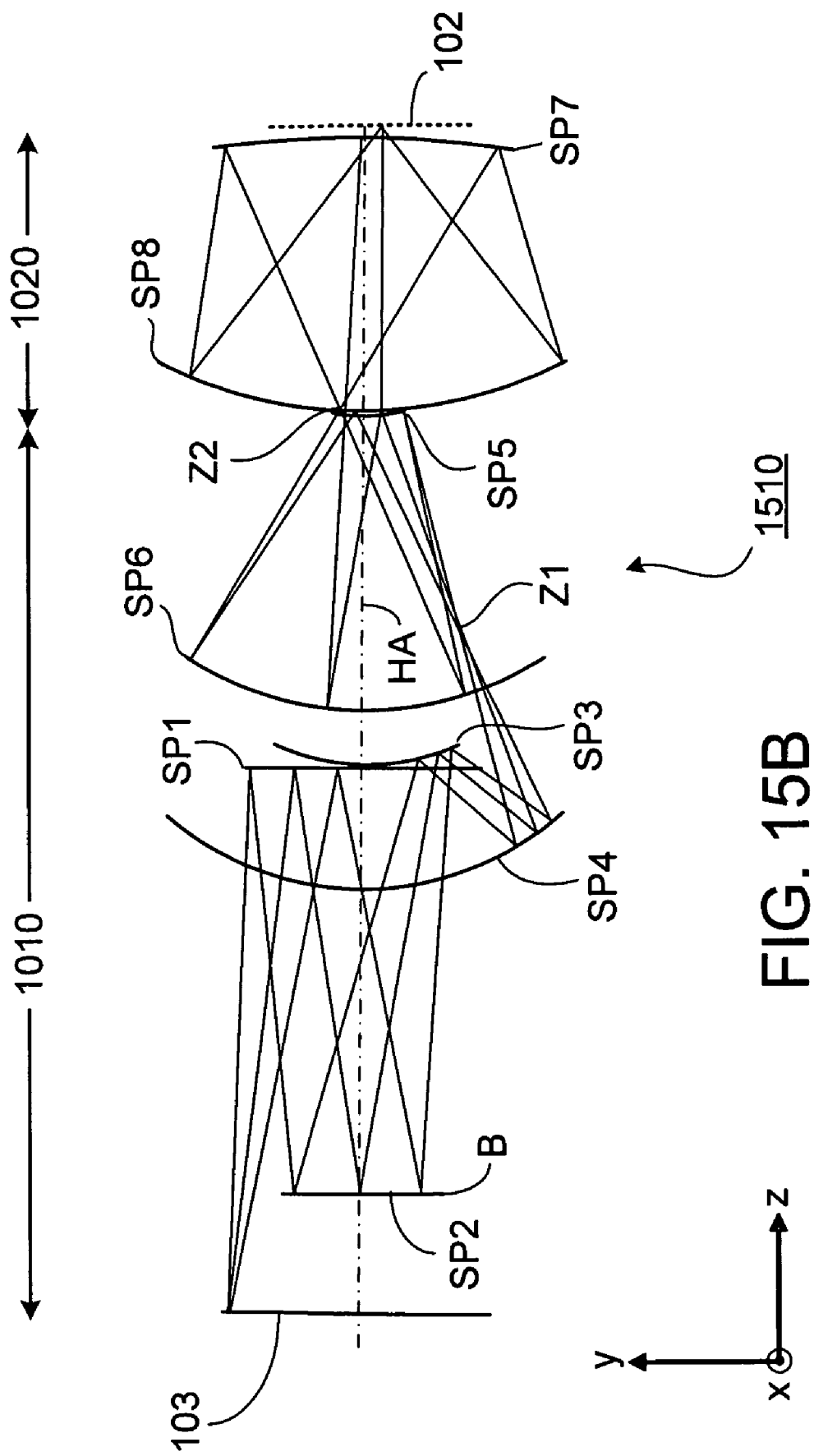
FIG. 15B is a cross-sectional view of a further embodiment of a projection objective shown in meridional section.

Referring to FIG. 15B, an embodiment of a projection objective 1510 includes eight mirrors SP1-SP8, and has an image-side numerical aperture of 0.6 and an operating wavelength of 13.5 nm. Mirrors SP1-SP8 are all aspherical mirrors. Projection objective 1510 images radiation from object plane 103 to image plane 102 with a demagnification ratio of 8× and a resolution of about 14 nm. The optical axis in relation to which the projection objective is rotationally symmetric is identified as HA, and the overall length of the system from object plane 103 to the image plane 102, the lengthwise dimension, L, is 2,000 mm.

Projection objective 1510 has a ring-segment field. The image-side field width, $d_x$, is 13 mm. The image-side field radius, $d_r$, is 26.5 mm. The image-side field length, $d_y$, is 1 mm. Image-side $W_{rms}$ is 0.018λ. Image-side field curvature is 2 nm.

The shape of the mirrors in the order of the radiation path from object plane 103 to image plane 102 is as follows: mirror SP1 is a concave mirror; mirror SP2 is a concave mirror; mirror SP3 is a convex mirror; mirror SP4 is a concave mirror; mirror SP5 is a convex mirror; mirror SP6 is a concave mirror; mirror SP7 is a concave mirror; and mirror SP8 is a concave mirror.

Mirrors SP7 and SP8 include openings. Mirrors SP1-SP6 do not include openings. The resulting obscuration radius that provides a field-independent obscuration is 22% of the aperture radius.

The image-side free working distance is 15 mm. The object-side free working distance is 100 mm.

The maximum angle of incidence on mirrors SP1-SP8 of a chief ray of a central field point is 30.1°. The maximum angle of incidence of any ray on mirrors SP1-SP8 is 31.5°. The maximum range of incident angles on any of mirrors SP1-SP8 is 29.0°.

The size of the largest mirror in meridional section is 621 mm. The size of the largest mirror in the x-direction is 668 mm.

The mirrors are arranged so that projection objective 1510 contains two partial objectives: a first partial objective 1010, and a second partial objective 1020. Accordingly, projection objective 1000 produces three pupil planes and two intermediate images. At least one of the pupil planes is accessible for positioning an aperture stop. At least one of the pupil planes is accessible for positioning an obscuration stop, at the position of mirror SP2, for example.

First partial objective 1010 has a total of six mirrors: mirror SP1, mirror SP2, mirror SP3, mirror SP4, mirror SP5, and mirror SP6. First partial objective 1010 forms an intermediate image Z1. First partial objective 1010 also forms an intermediate image Z2.

An aperture stop B is positioned on or close to mirror SP2. In this embodiment, aperture stop B can be alternatively be positioned between mirrors SP7 and SP8, because a conjugate stop plane is located there.

Data for projection objective 1510 is presented in Table 7A and Table 7B below. Table 7A presents optical data, while Table 7B presents aspherical constants for each of the mirror surfaces. For the purposes of Table 7A and Table 7B, the mirror designations correlate as follows: mirror 1 corresponds to mirror SP1; mirror 2 corresponds to mirror SP2; mirror 3 corresponds to mirror SP3; mirror 4 corresponds to mirror SP4; mirror 5 corresponds to mirror SP5; mirror 6 corresponds to mirror SP6; mirror 7 corresponds to mirror SP7; and mirror 8 corresponds to mirror SP8.

TABLE 7A

| Surface | Radius | Thickness | Mode |
|---|---|---|---|
| Object | INFINITY | 922.791 | |
| Mirror 1 | −3699.835 | −722.791 | REFL |
| STOP | INFINITY | 0.000 | |
| Mirror 2 | 1396.642 | 722.791 | REFL |
| Mirror 3 | 326.694 | −209.599 | REFL |
| Mirror 4 | 495.849 | 808.165 | REFL |
| Mirror 5 | 268.532 | −498.566 | REFL |
| Mirror 6 | 545.559 | 962.209 | REFL |
| Mirror 7 | −1362.684 | −455.200 | REFL |
| Mirror 8 | 753.748 | 470.200 | REFL |
| Image | INFINITY | 0.000 | |

TABLE 7B

| Surface | K | A | B | C |
|---|---|---|---|---|
| Mirror 1 | 0.00000E+00 | 4.62106E−10 | −1.60960E−15 | 5.15302E−21 |
| Mirror 2 | 0.00000E+00 | 5.34180E−11 | −1.73246E−15 | 8.91595E−20 |
| Mirror 3 | 0.00000E+00 | −3.78083E−09 | −1.60946E−14 | 1.44926E−18 |
| Mirror 4 | 0.00000E+00 | 1.29725E−10 | −4.33242E−15 | 3.55197E−20 |
| Mirror 5 | 0.00000E+00 | −5.41995E−09 | 5.52456E−13 | 2.52759E−17 |
| Mirror 6 | 0.00000E+00 | −3.73334E−11 | −1.02668E−16 | −2.99968E−22 |
| Mirror 7 | 0.00000E+00 | 7.83478E−10 | 1.90282E−15 | 4.06118E−21 |

TABLE 7B-continued

| Mirror 8 | 0.00000E+00 | 1.12087E−10 | 2.96721E−16 | 6.94605E−22 |

| Surface | D | E | F | G |
|---|---|---|---|---|
| Mirror 1 | −4.68484E−26 | 7.39174E−31 | −4.68562E−36 | 0.00000E+00 |
| Mirror 2 | −1.14886E−23 | 5.55335E−28 | −1.14958E−32 | 0.00000E+00 |
| Mirror 3 | −6.49583E−23 | 1.53314E−27 | −1.44417E−32 | 0.00000E+00 |
| Mirror 4 | −1.55220E−25 | 2.37719E−32 | 1.28111E−36 | 0.00000E+00 |
| Mirror 5 | 8.89081E−22 | 3.94133E−26 | −4.47051E−30 | 0.00000E+00 |
| Mirror 6 | −1.44127E−27 | 2.92660E−33 | −3.35888E−38 | 0.00000E+00 |
| Mirror 7 | 8.72416E−27 | 4.28608E−32 | 2.15963E−37 | 0.00000E+00 |
| Mirror 8 | 1.93827E−27 | −5.92415E−34 | 2.66223E−38 | 0.00000E+00 |

Figure 15C:
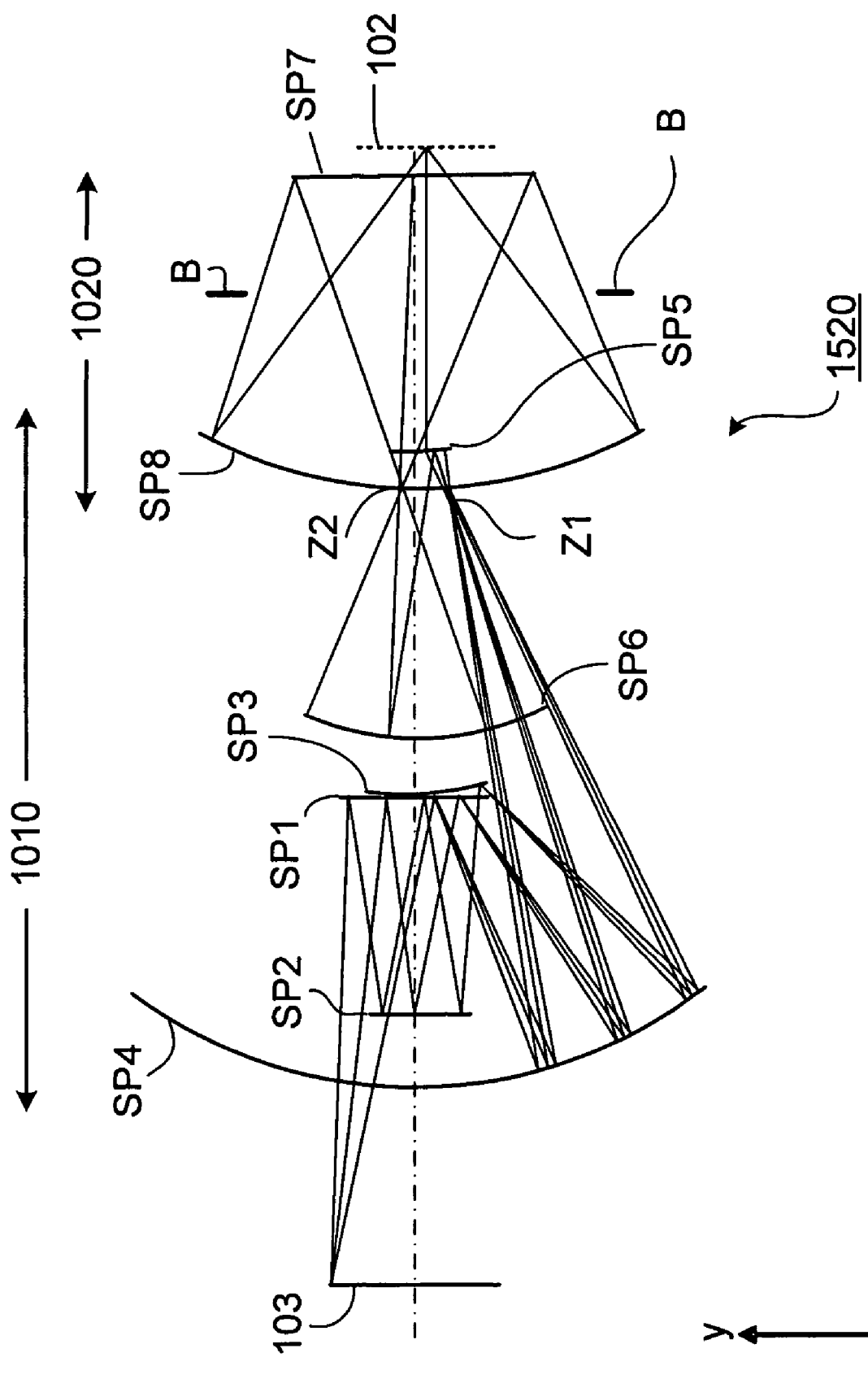
FIG. 15C is a cross-sectional view of another embodiment of a projection objective shown in meridional section.

Referring to FIG. 15C, an embodiment of a projection objective 1520 includes eight mirrors SP1-SP8, and has an image-side numerical aperture of 0.6 and an operating wavelength of 13.5 nm. Mirrors SP1-SP8 are all aspherical mirrors. Projection objective 1520 images radiation from object plane 103 to image plane 102 with a demagnification ratio of 8× and a resolution of about 14 nm. The optical axis in relation to which the projection objective is rotationally symmetric is identified as HA, and the overall length of the system from object plane 103 to the image plane 102, the lengthwise dimension, L, is 1,846 mm.

Projection objective 1520 has a ring-segment field. The image-side field width, $d_x$, is 13 mm. The image-side field radius, $d_r$, is 16.25 mm. The image-side field length, $d_y$, is 1 mm. Image-side $W_{rms}$ is $0.015\lambda$. Image-side field curvature is 1 nm.

The shape of the mirrors in the order of the radiation path from object plane 103 to image plane 102 is as follows: mirror SP1 is a concave mirror; mirror SP2 is a concave mirror; mirror SP3 is a convex mirror; mirror SP4 is a concave mirror; mirror SP5 is a convex mirror; mirror SP6 is a concave mirror; mirror SP7 is a concave mirror; and mirror SP8 is a concave mirror.

Mirrors SP7 and SP8 include openings. Mirrors SP1-SP6 do not include openings. The resulting obscuration radius that provides a field-independent obscuration is 29% of the aperture radius.

The image-side free working distance is 40 mm. The object-side free working distance is 322 mm.

The maximum angle of incidence on mirrors SP1-SP8 of a chief ray of a central field point is 21.0°. The maximum angle of incidence of any ray on mirrors SP1-SP8 is 25.2°. The maximum range of incident angles on any of mirrors SP1-SP8 is 24.9°.

The size of the largest mirror in meridional section is 682 mm. The size of the largest mirror in the x-direction is 694 mm.

The mirrors are arranged so that projection objective 1520 contains two partial objectives: a first partial objective 1010, and a second partial objective 1020. Accordingly, projection objective 1000 produces three pupil planes and two intermediate images. At least one of the pupil planes is accessible for positioning an aperture stop.

First partial objective 1010 has a total of six mirrors: mirror SP1, mirror SP2, mirror SP3, mirror SP4, mirror SP5, and mirror SP6. First partial objective 1010 forms an intermediate image Z1. First partial objective 1010 also forms an intermediate image Z2.

An aperture stop B is positioned between concave mirrors SP7 and SP8. In the current embodiment, the mirror with the shortest axial distance to object plane 103, as measured along the principal axis HA of the objective, is not mirror SP2 but mirror SP4. As a result, a particularly long drift distance is made available between fourth mirror SP4 and fifth mirror SP5, which has the consequence that the angles of incidence on the mirrors SP4 and SP5 are small.

Data for projection objective 1520 is presented in Table 8A and Table 8B below. Table 8A presents optical data, while Table 8B presents aspherical constants for each of the mirror surfaces. For the purposes of Table 8A and Table 8B, the mirror designations correlate as follows: mirror 1 corresponds to mirror SP1; mirror 2 corresponds to mirror SP2; mirror 3 corresponds to mirror SP3; mirror 4 corresponds to mirror SP4; mirror 5 corresponds to mirror SP5; mirror 6 corresponds to mirror SP6; mirror 7 corresponds to mirror SP7; and mirror 8 corresponds to mirror SP8.

TABLE 8A

| Surface | Radius | Thickness | Mode |
|---|---|---|---|
| Object | INFINITY | 798.296 | |
| Mirror 1 | −1827.312 | −361.283 | REFL |
| Mirror 2 | 2771.147 | 361.283 | REFL |
| Mirror 3 | 316.676 | −476.449 | REFL |
| Mirror 4 | 775.124 | 1039.440 | REFL |
| Mirror 5 | 372.661 | −462.991 | REFL |
| Mirror 6 | 471.732 | 908.105 | REFL |
| Mirror 7 | −8480.523 | −146.460 | REFL |
| STOP | INFINITY | −357.622 | |
| Mirror 8 | 715.42 | 544.082 | REFL |
| Image | INFINITY | 0.000 | |

TABLE 8B

| Surface | K | A | B | C |
|---|---|---|---|---|
| Mirror 1 | 0.00000E+00 | −1.45626E−09 | 6.40290E−16 | 2.94780E−20 |
| Mirror 2 | 0.00000E+00 | 9.31344E−09 | 1.78433E−13 | 6.07073E−18 |
| Mirror 3 | 0.00000E+00 | 1.20767E−09 | 4.63422E−14 | 1.06360E−18 |
| Mirror 4 | 0.00000E+00 | −3.94048E−12 | −4.34341E−18 | −2.29083E−24 |
| Mirror 5 | 0.00000E+00 | 7.23867E−08 | 4.59128E−12 | 4.03493E−16 |
| Mirror 6 | 0.00000E+00 | 4.58357E−10 | 4.09942E−15 | 3.25541E−20 |
| Mirror 7 | 0.00000E+00 | 7.13645E−10 | −4.17082E−15 | 1.96723E−20 |
| Mirror 8 | 0.00000E+00 | −2.07223E−11 | −3.53129E−17 | −8.11682E−23 |

| Surface | D | E | F | G |
|---|---|---|---|---|
| Mirror 1 | 3.73960E−25 | −1.56367E−30 | 0.00000E+00 | 0.00000E+00 |
| Mirror 2 | −1.28696E−21 | 1.16367E−25 | −4.40517E−30 | 0.00000E+00 |
| Mirror 3 | 1.78247E−23 | 4.71695E−28 | 1.30944E−32 | 0.00000E+00 |
| Mirror 4 | −6.39796E−30 | 1.00689E−35 | 0.00000E+00 | 0.00000E+00 |
| Mirror 5 | 4.83186E−20 | −2.96561E−32 | 1.74256E−27 | 0.00000E+00 |

TABLE 8B-continued

| Mirror 6 | 2.52331E-25 | 2.36217E-30 | 1.50441E-35 | 0.00000E+00 |
| Mirror 7 | -2.00951E-26 | -4.39472E-31 | 2.79897E-36 | 0.00000E+00 |
| Mirror 8 | 3.99332E-29 | -5.92386E-34 | 1.39149E-39 | 0.00000E+00 |

Figure 15D:
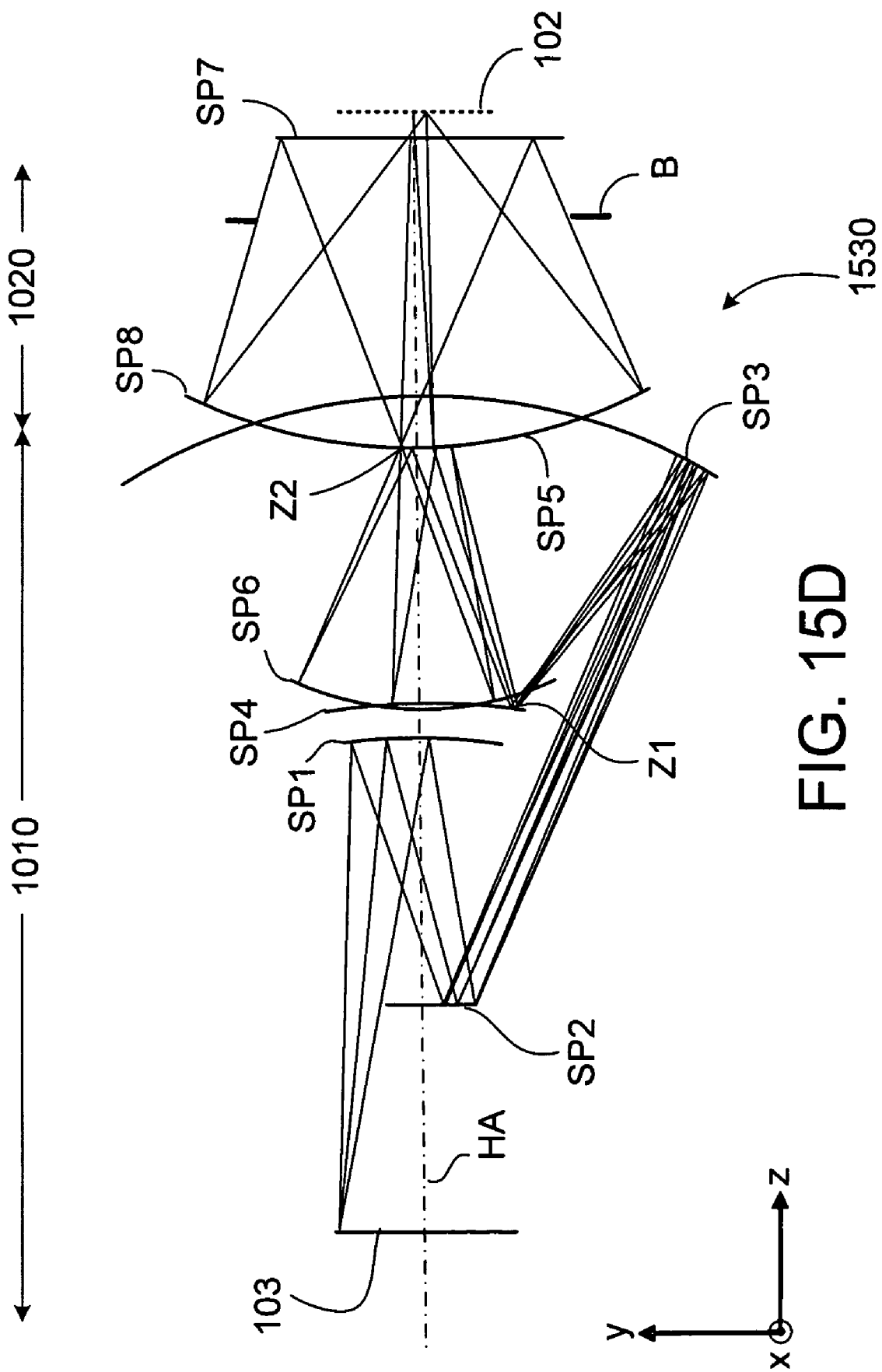
FIG. 15D is a cross-sectional view of a further embodiment of a projection objective shown in meridional section.

Referring to FIG. 15D, an embodiment of a projection objective 1530 includes eight mirrors SP1-SP8, and has an image-side numerical aperture of 0.6 and an operating wavelength of 13.4 nm. Mirrors SP1-SP8 are all aspherical mirrors. Projection objective 1530 images radiation from object plane 103 to image plane 102 with a demagnification ratio of 8× and a resolution of about 14 nm. The optical axis in relation to which the projection objective is rotationally symmetric is identified as HA, and the overall length of the system from object plane 103 to the image plane 102, the lengthwise dimension, L, is 2,000 mm.

Projection objective 1530 has a ring-segment field. The image-side field width, $d_x$, is 13 mm. The image-side field radius, $d_r$, is 18.75 mm. The image-side field length, $d_y$, is 1 mm. Image-side $W_{rms}$ is 0.025λ. Image-side field curvature is 5 nm.

The shape of the mirrors in the order of the radiation path from object plane 103 to image plane 102 is as follows: mirror SP1 is a concave mirror; mirror SP2 is a convex mirror; mirror SP3 is a concave mirror; mirror SP4 is a convex mirror; mirror SP5 is a convex mirror; mirror SP6 is a concave mirror; mirror SP7 is a concave mirror; and mirror SP8 is a concave mirror.

Mirrors SP7 and SP8 include openings. Mirrors SP1-SP6 do not include openings. The resulting obscuration radius that provides a field-independent obscuration is 26% of the aperture radius.

The image-side free working distance is 41 mm. The object-side free working distance is 402 mm.

The maximum angle of incidence on mirrors SP1-SP8 of a chief ray of a central field point is 26.1°. The maximum angle of incidence of any ray on mirrors SP1-SP8 is 29.8°. The maximum range of incident angles on any of mirrors SP1-SP8 is 21.0°.

The size of the largest mirror in meridional section is 753 mm. The size of the largest mirror in the x-direction is 765 mm.

The mirrors are arranged so that projection objective 1530 contains two partial objectives: a first partial objective 1010, and a second partial objective 1020. Accordingly, projection objective 1530 produces three pupil planes and two intermediate images. At least one of the pupil planes is accessible for positioning an aperture stop. At least one of the pupil planes is accessible for positioning an obscuration stop. For example, an obscuration stop can be positioned between mirrors SP1 and SP2.

First partial objective 1010 has a total of six mirrors: mirror SP1, mirror SP2, mirror SP3, mirror SP4, mirror SP5, and mirror SP6. First partial objective 1010 forms an intermediate image Z1. First partial objective 1010 also forms an intermediate image Z2.

An aperture stop B is positioned between concave mirrors SP7 and SP8. In some embodiments, aperture stop B can also be positioned between mirrors SP1 and SP2, or directly on mirror SP1, or directly on mirror SP2.

Data for projection objective 1530 is presented in Table 9A and Table 9B below. Table 9A presents optical data, while Table 9B presents aspherical constants for each of the mirror surfaces. For the purposes of Table 9A and Table 9B, the mirror designations correlate as follows: mirror 1 corresponds to mirror SP1; mirror 2 corresponds to mirror SP2; mirror 3 corresponds to mirror SP3; mirror 4 corresponds to mirror SP4; mirror 5 corresponds to mirror SP5; mirror 6 corresponds to mirror SP6; mirror 7 corresponds to mirror SP7; and mirror 8 corresponds to mirror SP8.

TABLE 9A

| Surface | Radius | Thickness | Mode |
|---|---|---|---|
| Object | INFINITY | 880.361 | |
| Mirror 1 | -875.368 | -478.259 | REFL |
| Mirror 2 | -690.520 | 1092.679 | REFL |
| Mirror 3 | -977.378 | -551.779 | REFL |
| Mirror 4 | -833.448 | 458.600 | REFL |
| Mirror 5 | 358.753 | -471.240 | REFL |
| Mirror 6 | 523.860 | 1028.166 | REFL |
| Mirror 7 | -5262.591 | -149.862 | REFL |
| STOP | INFINITY | -407.152 | |
| Mirror 8 | 814.485 | 598.487 | REFL |
| Image | INFINITY | 0.000 | |

TABLE 9B

| Surface | K | A | B | C |
|---|---|---|---|---|
| Mirror 1 | 0.00000E+00 | -9.68983E-11 | 1.30663E-15 | -4.94071E-20 |
| Mirror 2 | 0.00000E+00 | 2.94527E-09 | 9.63566E-14 | -4.32741E-18 |
| Mirror 3 | 0.00000E+00 | -1.03936E-10 | 5.36156E-16 | -1.65908E-21 |
| Mirror 4 | 0.00000E+00 | 1.24373E-09 | 2.24555E-14 | -3.21919E-18 |
| Mirror 5 | 0.00000E+00 | 4.32193E-08 | 1.67170E-12 | 9.36696E-17 |
| Mirror 6 | 0.00000E+00 | 6.52219E-12 | -3.83205E-16 | -1.68489E-21 |
| Mirror 7 | 0.00000E+00 | 4.88652E-10 | 1.07810E-15 | 2.49482E-21 |
| Mirror 8 | 0.00000E+00 | 1.69034E-11 | 8.05549E-17 | 1.52452E-22 |

| Surface | D | E | F | G |
|---|---|---|---|---|
| Mirror 1 | -3.11075E-25 | 7.43387E-30 | -1.22653E-34 | 0.00000E+00 |
| Mirror 2 | -1.24960E-22 | 1.48734E-26 | -4.81981E-31 | 0.00000E+00 |
| Mirror 3 | 3.13335E-27 | -3.65847E-33 | 2.78395E-39 | 0.00000E+00 |
| Mirror 4 | 1.45549E-22 | -2.80273E-27 | 1.97890E-32 | 0.00000E+00 |
| Mirror 5 | 1.12895E-20 | -5.38537E-25 | 2.00528E-28 | 0.00000E+00 |
| Mirror 6 | -4.41623E-27 | 5.82970E-33 | -9.43009E-38 | 0.00000E+00 |
| Mirror 7 | 7.45586E-27 | 1.58318E-33 | 2.42322E-37 | 0.00000E+00 |
| Mirror 8 | 3.07949E-28 | 3.98761E-35 | 2.18360E-39 | 0.00000E+00 |

Figure 15E:
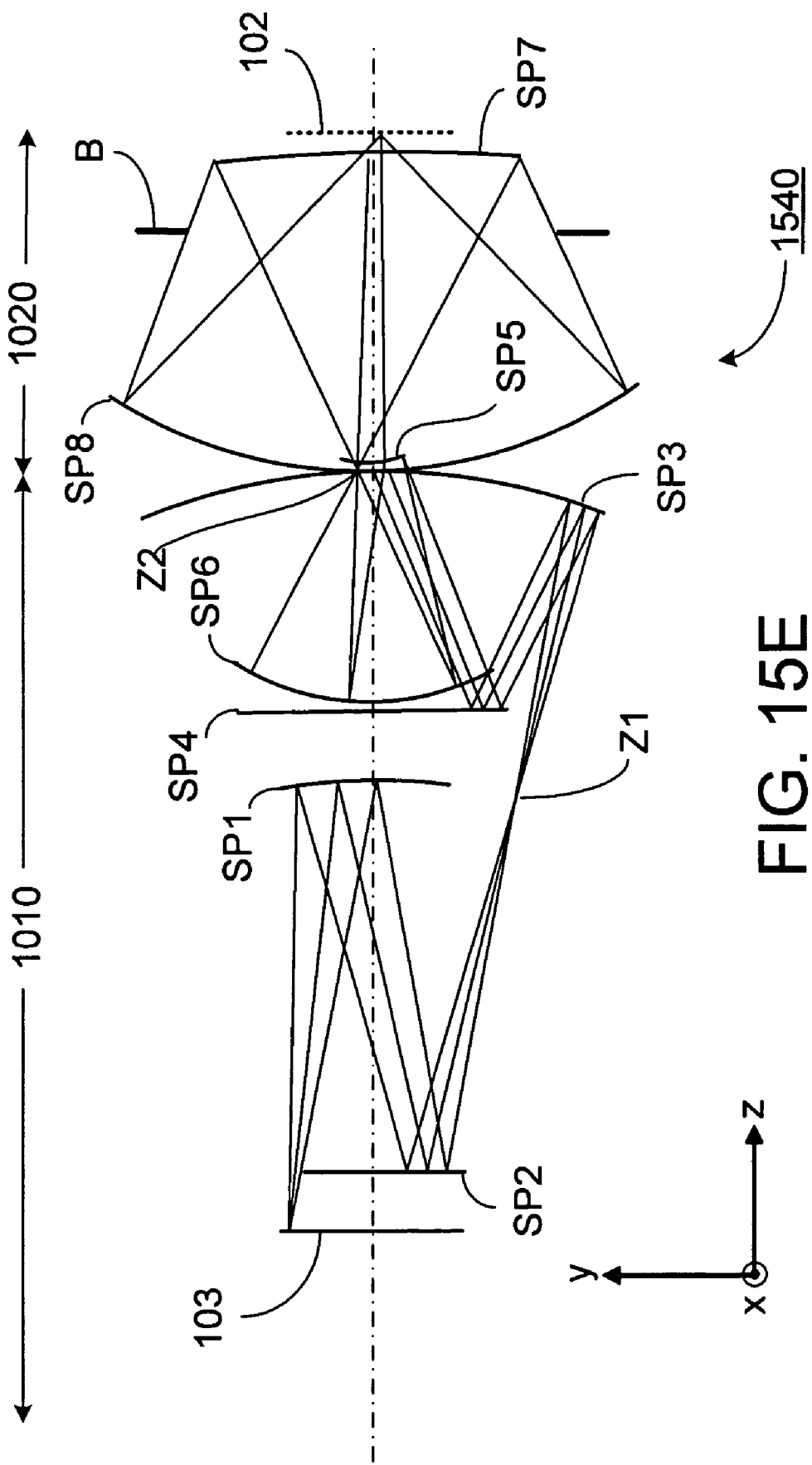
FIG. 15E is a cross-sectional view of another embodiment of a projection objective shown in meridional section.

Referring to FIG. 15E, an embodiment of a projection objective 1540 includes eight mirrors SP1-SP8, and has an image-side numerical aperture of 0.7 and an operating wavelength of 13.5 nm. Mirrors SP1-SP8 are all aspherical mirrors. Projection objective 1540 images radiation from object plane 103 to image plane 102 with a demagnification ratio of 8× and a resolution of about 12 nm. The optical axis in relation to which the projection objective is rotationally symmetric is identified as HA, and the overall length of the system from object plane 103 to the image plane 102, the lengthwise dimension, L, is 1,974 mm.

Projection objective 1540 has a ring-segment field. The image-side field width, $d_x$, is 13 mm. The image-side field radius, $d_r$, is 18.0 mm. The image-side field length, $d_y$, is 1 mm. Image-side $W_{rms}$ is 0.021λ. Image-side field curvature is 1 nm.

The shape of the mirrors in the order of the radiation path from object plane 103 to image plane 102 is as follows: mirror SP1 is a concave mirror; mirror SP2 is a concave mirror; mirror SP3 is a concave mirror; mirror SP4 is a convex mirror; mirror SP5 is a convex mirror; mirror SP6 is a concave mirror; mirror SP7 is a concave mirror; and mirror SP8 is a concave mirror. The radius of curvature of mirror SP2 is sufficiently large that a planar mirror, or a concave mirror having a similarly large radius of curvature, can also be used.

Mirrors SP7 and SP8 include openings. Mirrors SP1-SP6 do not include openings. The resulting obscuration radius that provides a field-independent obscuration is 23% of the aperture radius.

The image-side free working distance is 41 mm. The object-side free working distance is 100 mm.

The maximum angle of incidence on mirrors SP1-SP8 of a chief ray of a central field point is 23.9°. The maximum angle of incidence of any ray on mirrors SP1-SP8 is 26.7°. The maximum range of incident angles on any of mirrors SP1-SP8 is 23.3°.

The size of the largest mirror in meridional section is 904 mm. The size of the largest mirror in the x-direction is 916 mm.

The mirrors are arranged so that projection objective 1540 contains two partial objectives: a first partial objective 1010, and a second partial objective 1020. Accordingly, projection objective 1000 produces three pupil planes and two intermediate images. At least one of the pupil planes is accessible for positioning an aperture stop. At least one of the pupil planes is accessible for positioning an obscuration stop. For example, an obscuration stop can be positioned between mirrors SP1 and SP2.

First partial objective 1010 has a total of six mirrors: mirror SP1, mirror SP2, mirror SP3, mirror SP4, mirror SP5, and mirror SP6. First partial objective 1010 forms an intermediate image Z1 in a position between mirrors SP2 and SP3, and at a lower border of mirror SP4. This configuration permits the ray-bundle cross section at mirror SP4 to be kept small. First partial objective 1010 also forms an intermediate image Z2.

An aperture stop B is positioned between concave mirrors SP7 and SP8.

Data for projection objective 1540 is presented in Table 10A and Table 10B below. Table 10A presents optical data, while Table 10B presents aspherical constants for each of the mirror surfaces. For the purposes of Table 10A and Table 10B, the mirror designations correlate as follows: mirror 1 corresponds to mirror SP1; mirror 2 corresponds to mirror SP2; mirror 3 corresponds to mirror SP3; mirror 4 corresponds to mirror SP4; mirror 5 corresponds to mirror SP5; mirror 6 corresponds to mirror SP6; mirror 7 corresponds to mirror SP7; and mirror 8 corresponds to mirror SP8.

TABLE 10A

| Surface | Radius | Thickness | Mode |
|---|---|---|---|
| Object | INFINITY | 810.260 | |
| Mirror 1 | −1005.764 | −710.260 | REFL |
| Mirror 2 | 9426.007 | 1272.991 | REFL |
| Mirror 3 | −1182.815 | −429.596 | REFL |
| Mirror 4 | −11133.428 | 450.166 | REFL |
| Mirror 5 | 186.619 | −433.300 | REFL |
| Mirror 6 | 477.126 | 972.102 | REFL |

TABLE 10A-continued

| Surface | Radius | Thickness | Mode |
|---|---|---|---|
| Mirror 7 | −4183.615 | −150.374 | REFL |
| STOP | INFINITY | −408.999 | |
| Mirror 8 | 818.267 | 600.845 | REFL |
| Image | INFINITY | 0.000 | |

TABLE 10B

| Surface | K | A | B | C |
|---|---|---|---|---|
| Mirror 1 | 0.00000E+00 | 3.11825E−10 | 3.24549E−15 | −6.83571E−20 |
| Mirror 2 | 0.00000E+00 | −2.27912E−09 | −4.60552E−15 | −2.48079E−19 |
| Mirror 3 | 0.00000E+00 | −5.54875E−11 | 1.84013E−16 | −8.66678E−22 |
| Mirror 4 | 0.00000E+00 | −3.87307E−10 | 1.79298E−15 | −3.85784E−20 |
| Mirror 5 | 0.00000E+00 | −5.50749E−10 | −6.08907E−13 | 4.73842E−17 |
| Mirror 6 | 0.00000E+00 | 4.07407E−10 | 2.55564E−15 | 1.36374E−20 |
| Mirror 7 | 0.00000E+00 | 3.47533E−10 | 3.22160E−16 | 1.16439E−21 |
| Mirror 8 | 0.00000E+00 | −1.97225E−11 | 2.09194E−17 | 8.09962E−23 |

| Surface | D | E | F | G |
|---|---|---|---|---|
| Mirror 1 | 1.72371E−24 | −4.87613E−29 | 5.82893E−34 | 0.00000E+00 |
| Mirror 2 | 6.51533E−24 | −1.43666E−28 | 1.04325E−33 | 0.00000E+00 |
| Mirror 3 | 1.11987E−27 | 0.00000E+00 | 0.00000E+00 | 0.00000E+00 |
| Mirror 4 | 3.55401E−25 | −1.54989E−30 | 0.00000E+00 | 0.00000E+00 |
| Mirror 5 | −1.32381E−20 | 2.64772E−24 | −2.26591E−28 | 0.00000E+00 |
| Mirror 6 | 9.58842E−26 | −5.38128E−32 | 7.68501E−36 | 0.00000E+00 |
| Mirror 7 | 6.85290E−28 | 3.55319E−33 | 2.83137E−38 | 0.00000E+00 |
| Mirror 8 | 9.92467E−29 | 6.06015E−34 | −1.21955E−39 | 3.99272E−45 |

Figure 16:
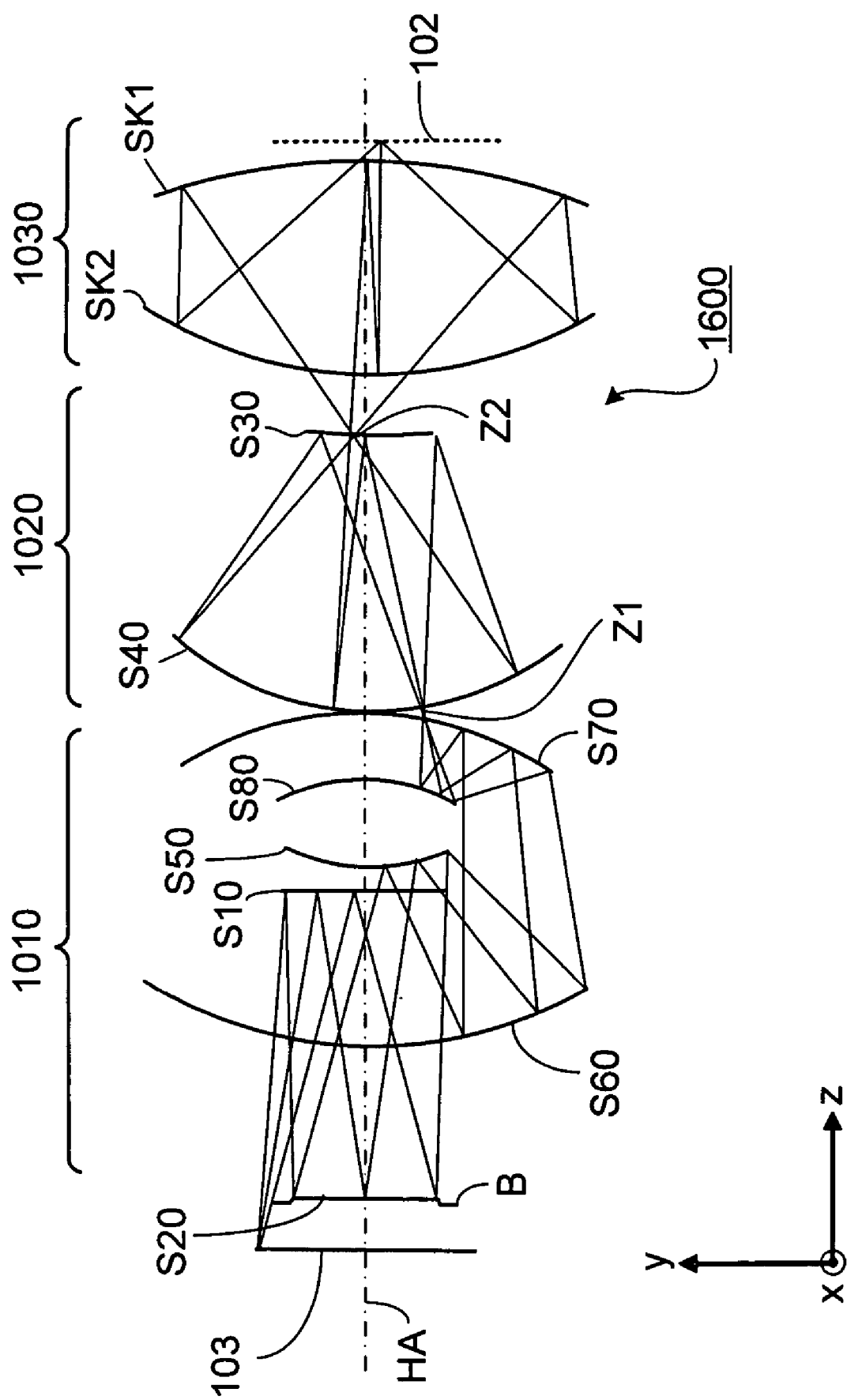
FIG. 16 is a cross-sectional view of a further embodiment of a projection objective shown in meridional section.

Referring to FIG. 16, an embodiment of a projection objective 1600 includes ten mirrors S10, S20, S30, S40, S50, S60, S70, S80, SK1, and SK2, and has an image-side numerical aperture of 0.75 and an operating wavelength of 13.5 nm. Mirrors S10, S20, S30, S40, S50, S60, S70, S80, SK1, and SK2 are all aspherical mirrors. Projection objective 1600 images radiation from object plane 103 to image plane 102 with a demagnification ratio of 8× and a resolution of about 11 nm. The optical axis in relation to which the projection objective is rotationally symmetric is identified as HA, and the overall length of the system from object plane 103 to the image plane 102, the lengthwise dimension, L, is 2,508 mm.

Projection objective 1600 has a ring-segment field. The image-side field width, $d_x$, is 13 mm. The image-side field radius, $d_r$, is 30.75 mm. The image-side field length, $d_y$, is 1 mm. Image-side $W_{rms}$ is 0.013 λ. Image-side field curvature is less than 1 nm.

The shape of the mirrors in the order of the radiation path from object plane 103 to image plane 102 is as follows: mirror S10 is a convex mirror; mirror S20 is a concave mirror; mirror S50 is a convex mirror; mirror S60 is a concave mirror; mirror S70 is a concave mirror; mirror S80 is a convex mirror; mirror S30 is a convex mirror; mirror S40 is a concave mirror; mirror SK1 is a concave mirror; and mirror SK2 is a concave mirror. Mirror S10 has a radius of curvature larger than 10,000 mm.

In some embodiments, mirror S10 can be replaced with a planar mirror, or a concave mirror having a similarly large radius of curvature. For example, in some embodiments, The order and curvature of mirrors according to the path of radiation from object plane 103 to image plane 102 may be as follows: mirror S10 is a concave mirror; mirror S20 is a concave mirror; mirror S50 is a convex mirror; mirror S60 is a concave mirror; mirror S70 is a concave mirror; mirror S80 is a convex mirror; mirror S30 is a convex mirror; mirror S40 is a concave mirror; mirror SK1 is a concave mirror; and mirror SK2 is a concave mirror. In other embodiments, for example, The order and curvature of mirrors according to the path of radiation from object plane 103 to image plane 102 may be as follows: mirror S10 is a planar mirror; mirror S20 is a concave mirror; mirror S50 is a convex mirror; mirror S60 is a concave mirror; mirror S70 is a concave mirror; mirror S80 is a convex mirror; mirror S30 is a convex mirror; mirror S40 is a concave mirror; mirror SK1 is a concave mirror; and mirror SK2 is a concave mirror.

Mirrors S30, S40, S70, SK1, and SK2 include openings. Mirrors S10, S20, S50, S60, and S80 do not include openings. The resulting obscuration radius that provides a field-independent obscuration is 55% of the aperture radius.

The image-side free working distance is 41 mm. The object-side free working distance is 100 mm.

The maximum angle of incidence on mirrors S10, S20, S30, S40, S50, S60, S70, S80, SK1, and SK2 of a chief ray of a central field point is 32.9°. The maximum angle of incidence of any ray on mirrors S10, S20, S30, S40, S50, S60, S70, S80, SK1, and SK2 is 45.1°. The maximum range of incident angles on any of mirrors S10, S20, S30, S40, S50, S60, S70, S80, SK1, and SK2 is 28.0°.

The size of the largest mirror in meridional section is 932 mm. The size of the largest mirror in the x-direction is 1034 mm.

The mirrors are arranged so that projection objective 1600 contains three partial objectives: a first partial objective 1010, a second partial objective 1020, and a third partial objective 1030. Accordingly, projection objective 1600 produces three pupil planes and two intermediate images. At least one of the pupil planes is accessible for positioning an aperture stop. At least one of the pupil planes is accessible for positioning an obscuration stop. For example, an obscuration stop can be positioned at mirror S20.

First partial objective 1010 has a total of six mirrors: mirror S10, mirror S20, mirror S50, mirror S60, mirror S70, and mirror S80. First partial objective 1010 forms an intermediate image Z1 in a position between mirrors S40 and S70, which may be at or near either or both mirrors. The Z1 image is demagnified 1.85×. Second partial objective 1020 has a total of two mirrors: mirror S30, and mirror S40. Second partial objective 1020 forms an intermediate image Z2 at or near the position of mirror S30. The Z2 image is demagnified 3.38×. Third partial objective 1030 has a total of two mirrors: mirror SK1, and mirror SK2. Third partial objective 1030 forms an image at or near the position of image plane 102. This image is demagnified 1.3×.

The embodiment shown is a pupil-obscurated system with at least one mirror with an opening for the passage of a bundle of rays, where aperture stop B, positioned on mirror S20, is positioned ahead of intermediate image Z2. Due to the fact that the aperture stop is positioned before the second intermediate image Z2, there is at least one intermediate image between aperture stop B and image plane 102.

Data for projection objective 1600 is presented in Table 11A and Table 11B below. Table 11A presents optical data, while Table 11B presents aspherical constants for each of the mirror surfaces. For the purposes of Table 11A and Table 11B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 11A

| Surface | Radius | Thickness | Mode |
| --- | --- | --- | --- |
| Object | INFINITY | 808.072 | |
| Mirror 1 | 12007.16 | −708.072 | REFL |
| STOP | INFINITY | 0.000 | |
| Mirror 2 | 1319.376 | 769.858 | REFL |
| Mirror 3 | 433.361 | −403.578 | REFL |
| Mirror 4 | 987.208 | 756.549 | REFL |
| Mirror 5 | −693.043 | −152.971 | REFL |
| Mirror 6 | −376.637 | 770.120 | REFL |
| Mirror 7 | 772.539 | −617.149 | REFL |
| Mirror 8 | 734.604 | 1245.295 | REFL |
| Mirror 9 | −1353.169 | −488.680 | REFL |
| Mirror 10 | 976.954 | 528.680 | REFL |
| Image | INFINITY | 0.000 | |

TABLE 11B

| Surface | K | A | B | C | D |
| --- | --- | --- | --- | --- | --- |
| Mirror 1 | 0.00000E+00 | 9.27937E−10 | −4.60321E−15 | 1.33022E−20 | −1.46239E−25 |
| Mirror 2 | 0.00000E+00 | −1.48167E−10 | −6.18894E−16 | −1.75227E−21 | −8.39234E−26 |
| Mirror 3 | 0.00000E+00 | −1.73010E−09 | −1.18347E−14 | 9.68679E−20 | −9.07327E−25 |
| Mirror 4 | 0.00000E+00 | −6.37553E−11 | −1.11337E−16 | −1.06013E−22 | 2.52238E−29 |
| Mirror 5 | 0.00000E+00 | 6.33779E−10 | −6.54703E−16 | 3.63365E−21 | −5.36932E−27 |
| Mirror 6 | 0.00000E+00 | 6.43612E−09 | −5.82502E−14 | 1.35839E−18 | −2.25462E−23 |
| Mirror 7 | 0.00000E+00 | 3.09804E−09 | 1.48684E−14 | −4.03834E−19 | −5.72817E−24 |
| Mirror 8 | 0.00000E+00 | 6.55194E−11 | 1.29992E−16 | 2.37143E−22 | 4.46073E−28 |
| Mirror 9 | 0.00000E+00 | 6.94725E−11 | 7.74511E−17 | 2.33861E−22 | 9.32544E−29 |
| Mirror 10 | 0.00000E+00 | −1.35922E−10 | −3.07250E−17 | 1.86948E−22 | 2.92915E−28 |

| Surface | E | F | G | H | J |
| --- | --- | --- | --- | --- | --- |
| Mirror 1 | 1.39879E−30 | −1.37935E−36 | 0.00000E+00 | 0.00000E+00 | 0.00000E+00 |
| Mirror 2 | 3.00921E−30 | −3.04597E−35 | 0.00000E+00 | 0.00000E+00 | 0.00000E+00 |

TABLE 11B-continued

| Mirror 3 | −2.20201E−29 | 2.31377E−34 | 0.00000E+00 | 0.00000E+00 | 0.00000E+00 |
| Mirror 4 | −8.15911E−34 | 2.59261E−39 | −6.08607E−45 | 0.00000E+00 | 0.00000E+00 |
| Mirror 5 | 6.45614E−33 | −1.77221E−38 | 5.08599E−44 | 0.00000E+00 | 0.00000E+00 |
| Mirror 6 | 3.31937E−28 | −3.44267E−33 | 1.68365E−38 | 0.00000E+00 | 0.00000E+00 |
| Mirror 7 | −1.99674E−28 | 3.88481E−33 | −3.50397E−38 | 0.00000E+00 | 0.00000E+00 |
| Mirror 8 | 3.95152E−34 | 3.88746E−39 | −9.08040E−45 | 2.70091E−50 | 0.00000E+00 |
| Mirror 9 | 8.50266E−34 | −1.88020E−40 | 4.25518E−46 | 4.36378E−51 | 0.00000E+00 |
| Mirror 10 | −3.23938E−34 | 1.34899E−39 | −3.15465E−45 | 6.54274E−51 | 0.00000E+00 |

Figure 17:
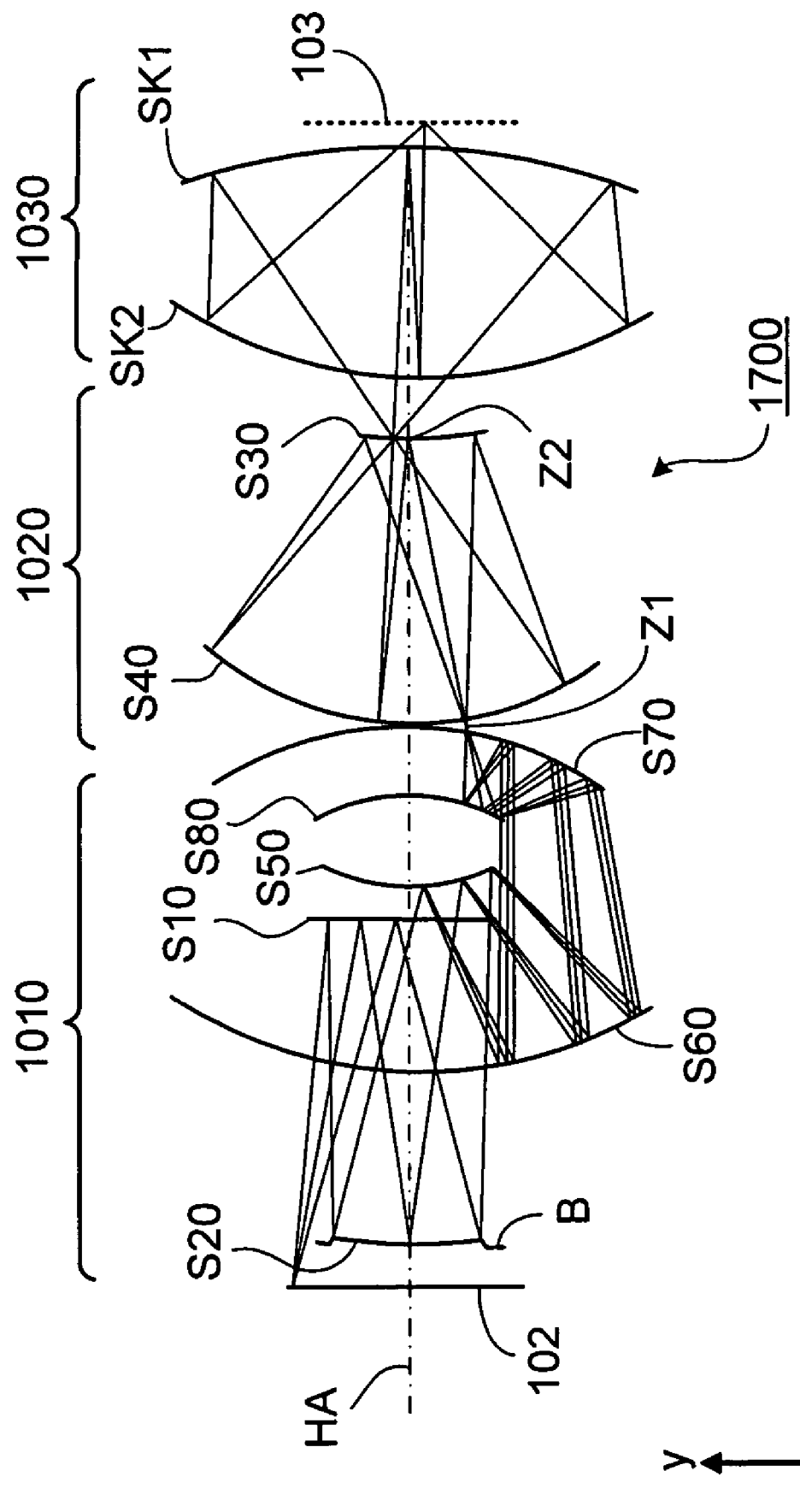
FIG. 17 is a cross-sectional view of another embodiment of a projection objective shown in meridional section.

Referring to FIG. 17, an embodiment of a projection objective 1700 includes ten mirrors S10, S20, S30, S40, S50, S60, S70, S80, SK1, and SK2, and has an image-side numerical aperture of 0.75 and an operating wavelength of 13.5 nm. Mirrors S10, S20, S30, S40, S50, S60, S70, S80, SK1, and SK2 are all aspherical mirrors. Projection objective 1700 images radiation from object plane 103 to image plane 102 with a demagnification ratio of 8× and a resolution of about 11 nm. The optical axis in relation to which the projection objective is rotationally symmetric is identified as HA, and the overall length of the system from object plane 103 to the image plane 102, the lengthwise dimension, L, is 2,511 mm.

Projection objective 1700 has a ring-segment field. The image-side field width, $d_x$, is 13 mm. The image-side field radius, $d_r$, is 29.75 mm. The image-side field length, $d_y$, is 2 mm. Image-side $W_{rms}$ is 0.024λ. Image-side field curvature is 3 nm.

The shape of the mirrors in the order of the radiation path from object plane 103 to image plane 102 is as follows: mirror S10 is a convex mirror; mirror S20 is a concave mirror; mirror S50 is a convex mirror; mirror S60 is a concave mirror; mirror S70 is a concave mirror; mirror S80 is a convex mirror; mirror S30 is a convex mirror; mirror S40 is a concave mirror; mirror SK1 is a concave mirror; and mirror SK2 is a concave mirror.

Mirrors S30, S40, S70, SK1, and SK2 include openings. Mirrors S10, S20, S50, S60, and S80 do not include openings. The resulting obscuration radius that provides a field-independent obscuration is 55% of the aperture radius.

The image-side free working distance is 40 mm. The object-side free working distance is 100 mm.

The maximum angle of incidence on mirrors S10, S20, S30, S40, S50, S60, S70, S80, SK1, and SK2 of a chief ray of a central field point is 32.5°. The maximum angle of incidence of any ray on mirrors S10, S20, S30, S40, S50, S60, S70, S80, SK1, and SK2 is 45.1°. The maximum range of incident angles on any of mirrors S10, S20, S30, S40, S50, S60, S70, S80, SK1, and SK2 is 28.9°.

The size of the largest mirror in meridional section is 933 mm. The size of the largest mirror in the x-direction is 1028 mm.

The mirrors are arranged so that projection objective 1700 contains three partial objectives: a first partial objective 1010, a second partial objective 1020, and a third partial objective 1030. Accordingly, projection objective 1700 produces three pupil planes and two intermediate images. At least one of the pupil planes is accessible for positioning an aperture stop. At least one of the pupil planes is accessible for positioning an obscuration stop. For example, an obscuration stop can be positioned at mirror S20.

First partial objective 1010 has a total of six mirrors: mirror S10, mirror S20, mirror S50, mirror S60, mirror S70, and mirror S80. First partial objective 1010 forms an intermediate image Z1 in a position between mirrors S40 and S70, which may be at or near either or both mirrors. Second partial objective 1020 has a total of two mirrors: mirror S30, and mirror S40. Second partial objective 1020 forms an intermediate image Z2 at or near the position of mirror S30. Third partial objective 1030 has a total of two mirrors: mirror SK1, and mirror SK2. Third partial objective 1030 forms an image at or near the position of image plane 102.

The embodiment shown is a pupil-obscurated system with at least one mirror with an opening for the passage of a bundle of rays, where aperture stop B, positioned near mirror S20, is positioned ahead of intermediate image Z2. Due to the fact that the aperture stop is positioned before the second intermediate image Z2, there is at least one intermediate image between aperture stop B and image plane 102.

Data for projection objective 1700 is presented in Table 12A and Table 12B below. Table 12A presents optical data, while Table 12B presents aspherical constants for each of the mirror surfaces. For the purposes of Table 12A and Table 12B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 12A

| Surface | Radius | Thickness | Mode |
|---|---|---|---|
| Object | INFINITY | 800.266 | |
| Mirror 1 | 10314.848 | −700.266 | REFL |
| STOP | INFINITY | 0.000 | |
| Mirror 2 | 1313.221 | 772.471 | REFL |
| Mirror 3 | 435.263 | −403.381 | REFL |
| Mirror 4 | 987.208 | 756.370 | REFL |
| Mirror 5 | −693.635 | −152.988 | REFL |
| Mirror 6 | −376.671 | 770.162 | REFL |
| Mirror 7 | 773.821 | −617.174 | REFL |
| Mirror 8 | 734.569 | 1245.278 | REFL |
| Mirror 9 | −1353.223 | −488.675 | REFL |
| Mirror 10 | 976.962 | 528.674 | REFL |
| Image | INFINITY | 0.000 | |

TABLE 12B

| Surface | K | A | B | C | D |
|---|---|---|---|---|---|
| Mirror 1 | 0.00000E+00 | 9.53114E-10 | -4.86644E-15 | 1.31711E-20 | -1.00791E-25 |
| Mirror 2 | 0.00000E+00 | -1.47585E-10 | -6.60664E-16 | -1.36568E-21 | -4.71682E-26 |
| Mirror 3 | 0.00000E+00 | -1.70365E-09 | -1.16839E-14 | 9.85514E-20 | -9.70081E-25 |
| Mirror 4 | 0.00000E+00 | -6.35387E-11 | -1.10979E-16 | -1.03841E-22 | 2.37479E-29 |
| Mirror 5 | 0.00000E+00 | 6.32087E-10 | -6.50351E-16 | 3.64943E-21 | -5.41639E-27 |
| Mirror 6 | 0.00000E+00 | 6.40969E-09 | -5.76722E-14 | 1.35569E-18 | -2.25614E-23 |
| Mirror 7 | 0.00000E+00 | 3.10697E-09 | 1.51614E-14 | -4.09300E-19 | -6.19233E-24 |
| Mirror 8 | 0.00000E+00 | 6.56531E-11 | 1.29850E-16 | 2.37674E-22 | 4.38690E-28 |
| Mirror 9 | 0.00000E+00 | 6.93646E-11 | 7.77340E-17 | 2.35663E-22 | 8.87991E-29 |
| Mirror 10 | 0.00000E+00 | -1.36095E-10 | -2.99886E-17 | 1.86689E-22 | 2.94132E-28 |

| Surface | E | F | G | H | J |
|---|---|---|---|---|---|
| Mirror 1 | 3.35912E-31 | 8.78178E-36 | 0.00000E+00 | 0.00000E+00 | 0.00000E+00 |
| Mirror 2 | 1.70095E-30 | -1.74271E-35 | 0.00000E+00 | 0.00000E+00 | 0.00000E+00 |
| Mirror 3 | -1.98157E-29 | 2.10542E-34 | 0.00000E+00 | 0.00000E+00 | 0.00000E+00 |
| Mirror 4 | -7.95278E-34 | 2.56682E-39 | -6.07013E-45 | 0.00000E+00 | 0.00000E+00 |
| Mirror 5 | 6.29468E-33 | -1.72403E-38 | 5.01025E-44 | 0.00000E+00 | 0.00000E+00 |
| Mirror 6 | 3.33377E-28 | -3.47620E-33 | 1.70289E-38 | 0.00000E+00 | 0.00000E+00 |
| Mirror 7 | -7.67239E-29 | -2.04991E-33 | 6.19397E-38 | 0.00000E+00 | 0.00000E+00 |
| Mirror 8 | 4.29719E-34 | 3.75714E-39 | -8.71022E-45 | 2.66200E-50 | 0.00000E+00 |
| Mirror 9 | 8.17352E-34 | 1.07822E-41 | 1.12329E-47 | 4.63290E-51 | 0.00000E+00 |
| Mirror 10 | -3.16654E-34 | 1.18038E-39 | -2.51249E-45 | 5.75859E-51 | 0.00000E+00 |

Figure 18:
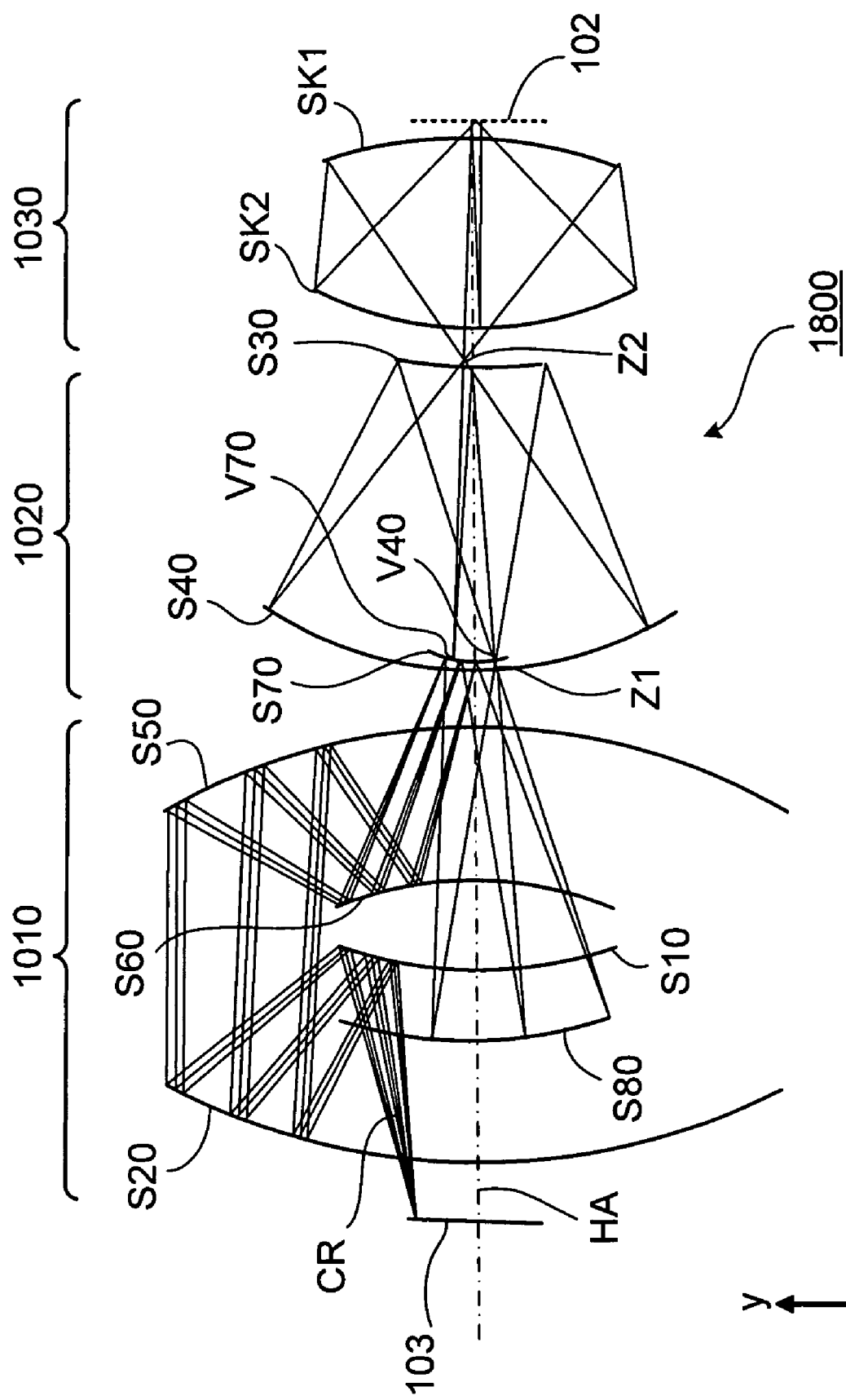
FIG. 18 is a cross-sectional view of a further embodiment of a projection objective shown in meridional section.

Referring to FIG. 18, an embodiment of a projection objective 1800 includes ten mirrors S10, S20, S30, S40, S50, S60, S70, S80, SK1, and SK2, and has an image-side numerical aperture of 0.7 and an operating wavelength of 13.5 nm. Mirrors S10, S20, S30, S40, S50, S60, S70, S80, SK1, and SK2 are all aspherical mirrors. Projection objective 1800 images radiation from object plane 103 to image plane 102 with a demagnification ratio of 8× and a resolution of about 12 nm. The optical axis in relation to which the projection objective is rotationally symmetric is identified as HA, and the overall length of the system from object plane 103 to the image plane 102, the lengthwise dimension, L, is 2,494 mm.

Projection objective 1800 has a ring-segment field. The image-side field width, $d_x$, is 13 mm. The image-side field radius, $d_r$, is 17.15 mm. The image-side field length, $d_y$, is 1 mm. Image-side $W_{rms}$ is 0.018λ. Image-side field curvature is less than 1 nm.

The shape of the mirrors in the order of the radiation path from object plane 103 to image plane 102 is as follows: mirror S10 is a convex mirror; mirror S20 is a concave mirror; mirror S50 is a concave mirror; mirror S60 is a convex mirror; mirror S70 is a convex mirror; mirror S80 is a concave mirror; mirror S30 is a convex mirror; mirror S40 is a concave mirror; mirror SK1 is a concave mirror; and mirror SK2 is a concave mirror.

Mirrors S30, S40, SK1, and SK2 include openings. Mirrors S10, S20, S50, S60, S70, and S80 do not include openings. The resulting obscuration radius that provides a field-independent obscuration is 26% of the aperture radius.

The image-side free working distance is 40 mm. The object-side free working distance is 100 mm.

The maximum angle of incidence on mirrors S10, S20, S30, S40, S50, S60, S70, S80, SK1, and SK2 of a chief ray of a central field point is 32.7°. The maximum angle of incidence of any ray on mirrors S10, S20, S30, S40, S50, S60, S70, S80, SK1, and SK2 is 42.3°. The maximum range of incident angles on any of mirrors S10, S20, S30, S40, S50, S60, S70, S80, SK1, and SK2 is 18.8°.

The size of the largest mirror in meridional section is 858 mm. The size of the largest mirror in the x-direction is 891 mm.

The mirrors are arranged so that projection objective 1800 contains three partial objectives: a first partial objective 1010, a second partial objective 1020, and a third partial objective 1030. Accordingly, projection objective 1800 produces three pupil planes and two intermediate images. At least one of the pupil planes is accessible for positioning an aperture stop.

First partial objective 1010 has a total of six mirrors: mirror S10, mirror S20, mirror S50, mirror S60, mirror S70, and mirror S80. First partial objective 1010 forms an intermediate image Z1 in a position at or near mirror S40. Second partial objective 1020 has a total of two mirrors: mirror S30, and mirror S40. Second partial objective 1020 forms an intermediate image Z2 at a position between mirrors S30 and SK2. Third partial objective 1030 has a total of two mirrors: mirror SK1, and mirror SK2. Third partial objective 1030 forms an image at or near the position of image plane 102.

Embodiments shown in FIGS. 11-18 include microlithography projection objectives where the first partial objective does not include a mirror having an opening for the passage of a bundle of rays, i.e., none of the mirrors are perforated. In addition, the projection objectives include a second partial objective having no mirror without an opening for the passage of a bundle of rays. The geometrical distance between the first and second partial objectives is generally at least 10% of the length, L, from object plane 103 to image plane 102. The distance between the first and second partial objectives is the distance between a vertex of a mirror in the first partial objective that is positioned closest to the image plane and a vertex of a mirror in the second partial objective that is positioned closest to the object plane. The mirror in the second partial objective that is positioned closest to the object plane is also referred to as the closest-to-reticle mirror of the second partial objective, and the mirror in the first partial objective that is closest to the image plane is referred to as the closest-to-substrate mirror of the first partial objective.

In the embodiment shown in FIG. 18, the geometrical distance between the first partial objective and the second partial objective corresponds to a distance between a vertex V70 of mirror S70 and a vertex V40 of mirror S40, measured along axis HA. In this embodiment, the distance between the two partial objectives is negative, because the two objectives overlap in their spatial arrangement, i.e., mirror S70 is positioned inside the space of the second partial objective.

An arrangement of this type may have the advantage that in embodiments where the closest-to-reticle mirror of the second partial objective is positioned near to the closest-to-substrate mirror of the first partial objective, the inner ring field radius, and therefore the obscuration, can be kept relatively small.

Further, embodiments shown in FIGS. 11-14, 15A, and 18, as well as other embodiments presented infra include a negative back-focus width of the entry pupil. The principal rays of the different field points are divergent as they approach the objective in the direction of light propagation, i.e., in a direction starting from the object plane. In relation to the light path from a light source of an illumination system to the object plane where a reticle is located, the entrance pupil of the projection objective is positioned in front of the object plane.

Data for projection objective 1800 is presented in Table 13A and Table 13B below. Table 13A presents optical data, while Table 13B presents aspherical constants for each of the mirror surfaces. For the purposes of Table 13A and Table 13B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 13A

| Surface | Radius | Thickness | Mode |
| --- | --- | --- | --- |
| Object | INFINITY | 576.457 | |
| Mirror 1 | 743.152 | −443.481 | REFL |
| Mirror 2 | 1348.018 | 992.889 | REFL |
| Mirror 3 | −1386.925 | −349.408 | REFL |
| Mirror 4 | −1014.795 | 496.732 | REFL |
| Mirror 5 | 324.055 | −856.578 | REFL |
| Mirror 6 | 941.81 | 1510.551 | REFL |
| STOP | INFINITY | 0.000 | |
| Mirror 7 | 2311.955 | −670.058 | REFL |
| Mirror 8 | 862.319 | 1196.518 | REFL |
| Mirror 9 | −1133.435 | −426.460 | REFL |
| Mirror 10 | 831.304 | 466.461 | REFL |
| Image | INFINITY | 0.000 | |

TABLE 13B

| Surface | K | A | B | C | D |
| --- | --- | --- | --- | --- | --- |
| Mirror 1 | 0.00000E+00 | −1.74588E−09 | 5.73560E−15 | −2.18120E−20 | 8.88355E−26 |
| Mirror 2 | 0.00000E+00 | −8.27033E−11 | −3.72143E−17 | 6.51400E−24 | 5.62567E−30 |
| Mirror 3 | 0.00000E+00 | −8.58288E−12 | 3.92829E−18 | −4.18276E−24 | −1.25792E−29 |
| Mirror 4 | 0.00000E+00 | 2.07266E−11 | −4.52705E−16 | −2.17586E−21 | −1.01747E−26 |
| Mirror 5 | 0.00000E+00 | 4.76733E−09 | −2.14786E−13 | −1.18998E−17 | −8.08930E−22 |
| Mirror 6 | 0.00000E+00 | 1.65766E−11 | 2.69419E−17 | 5.87911E−24 | 3.46720E−29 |
| Mirror 7 | 0.00000E+00 | 8.89937E−10 | 1.82131E−15 | 7.16217E−21 | −5.94918E−25 |
| Mirror 8 | 0.00000E+00 | 3.72408E−11 | 3.09842E−17 | 3.10857E−23 | 4.92719E−29 |
| Mirror 9 | 0.00000E+00 | 1.94111E−10 | 4.16355E−16 | 1.11547E−21 | 4.33879E−27 |
| Mirror 10 | 0.00000E+00 | −1.69879E−10 | 2.55525E−16 | 6.73274E−22 | −2.01071E−28 |

| Surface | E | F | G | H | J |
| --- | --- | --- | --- | --- | --- |
| Mirror 1 | −1.89149E−31 | 2.05598E−37 | 0.00000E+00 | 0.00000E+00 | 0.00000E+00 |
| Mirror 2 | 0.00000E+00 | 0.00000E+00 | 0.00000E+00 | 0.00000E+00 | 0.00000E+00 |
| Mirror 3 | 8.61573E−36 | 5.91202E−42 | −2.37686E−48 | 5.37118E−55 | 0.00000E+00 |
| Mirror 4 | 3.23938E−32 | 0.00000E+00 | 0.00000E+00 | 0.00000E+00 | 0.00000E+00 |
| Mirror 5 | 2.17082E−25 | −2.89803E−29 | 2.55500E−33 | −9.16686E−38 | 0.00000E+00 |
| Mirror 6 | −1.13782E−35 | 1.27000E−39 | 0.00000E+00 | 0.00000E+00 | 0.00000E+00 |
| Mirror 7 | −2.13013E−29 | 5.53859E−34 | −1.47815E−38 | 1.00232E−43 | 0.00000E+00 |
| Mirror 8 | 1.90775E−35 | 1.35114E−40 | −5.54544E−47 | 2.44701E−52 | 0.00000E+00 |
| Mirror 9 | −5.57552E−34 | 3.06849E−38 | 1.07483E−43 | −3.56612E−49 | 0.00000E+00 |
| Mirror 10 | 6.55890E−33 | −1.22949E−38 | 2.98699E−44 | 2.63597E−50 | 0.00000E+00 |

Figure 19:
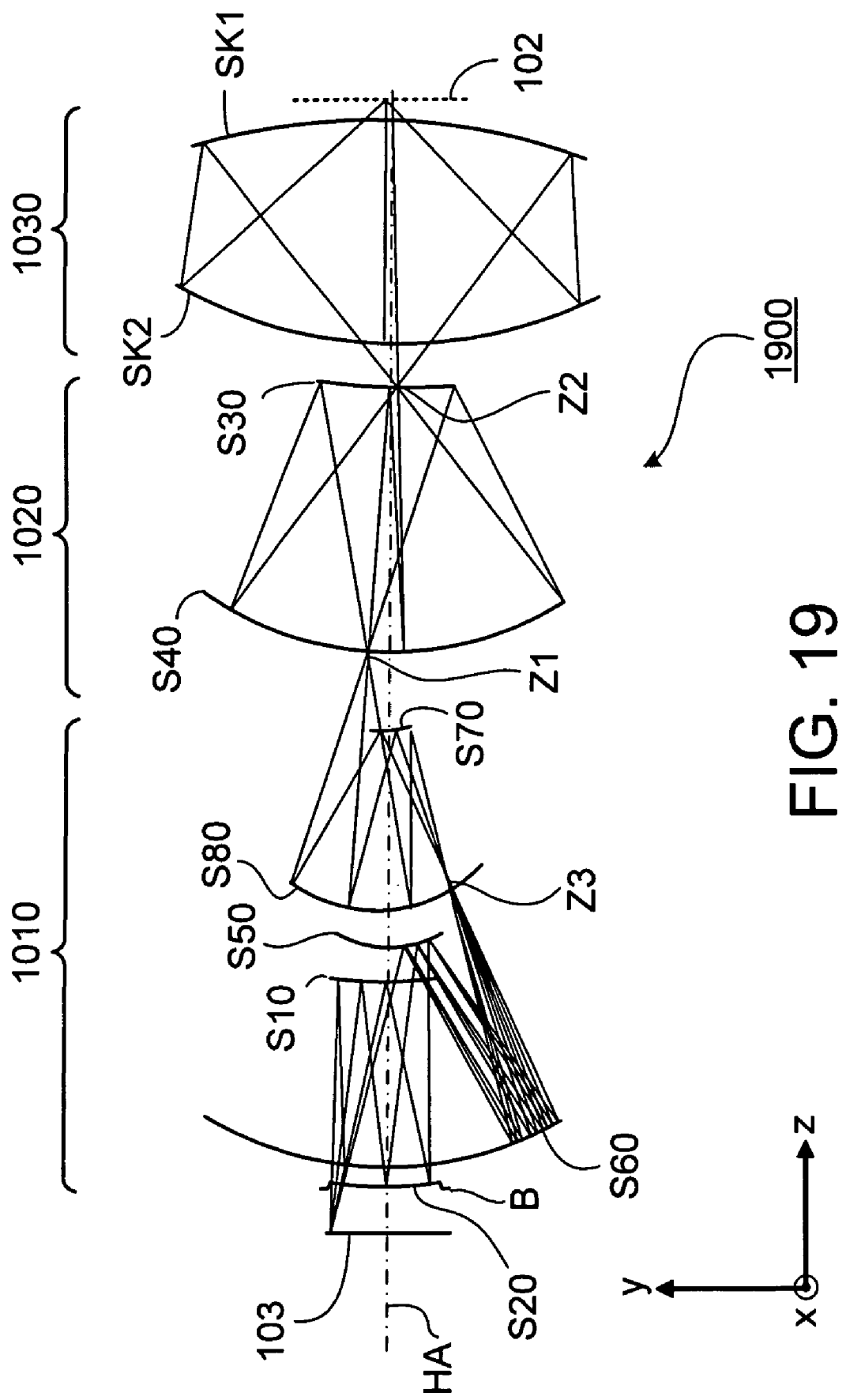
FIG. 19 is a cross-sectional view of another embodiment of a projection objective shown in meridional section.

Referring to FIG. 19, an embodiment of a projection objective 1900 includes ten mirrors S10, S20, S30, S40, S50, S60, S70, S80, SK1, and SK2, and has an image-side numerical aperture of 0.72 and an operating wavelength of 13.5 nm. Mirrors S10, S20, S30, S40, S50, S60, S70, S80, SK1, and SK2 are all aspherical mirrors. Projection objective 1900 images radiation from object plane 103 to image plane 102 with a demagnification ratio of 8× and a resolution of about 12 nm. The optical axis in relation to which the projection objective is rotationally symmetric is identified as HA, and the overall length of the system from object plane 103 to the image plane 102, the lengthwise dimension, L, is 2,500 mm.

Projection objective 1900 has a ring-segment field. The image-side field width, $d_x$, is 13 mm. The image-side field radius, $d_r$, is 15.125 mm. The image-side field length, $d_y$, is 1 mm. Image-side $W_{rms}$ is 0.041λ. Image-side field curvature is 4 nm.

The shape of the mirrors in the order of the radiation path from object plane 103 to image plane 102 is as follows: mirror S10 is a convex mirror; mirror S20 is a concave mirror; mirror S50 is a convex mirror; mirror S60 is a concave mirror; mirror S70 is a convex mirror; mirror S80 is a concave mirror; mirror S30 is a convex mirror; mirror S40 is a concave mirror; mirror SK1 is a concave mirror; and mirror SK2 is a concave mirror. The radius of curvature of mirror S10 is large enough so that mirror S10 can be replaced with a planar mirror, or a concave mirror having a similarly large radius of curvature.

Mirrors S30, S40, SK1, and SK2 include openings. Mirrors S10, S20, S50, S60, S70 and S80 do not include openings. The resulting obscuration radius that provides a field-independent obscuration is 27% of the aperture radius.

The image-side free working distance is 40 mm. The object-side free working distance is 100 mm.

The maximum angle of incidence on mirrors S10, S20, S30, S40, S50, S60, S70, S80, SK1, and SK2 of a chief ray of a central field point is 20.0°. The maximum angle of incidence of any ray on mirrors S10, S20, S30, S40, S50, S60, S70, S80, SK1, and SK2 is 27.7°. The maximum range of incident angles on any of mirrors S10, S20, S30, S40, S50, S60, S70, S80, SK1, and SK2 is 20.9°.

The size of the largest mirror in meridional section is 884 mm. The size of the largest mirror in the x-direction is 927 mm.

The mirrors are arranged so that projection objective 1900 contains three partial objectives: a first partial objective 1010, a second partial objective 1020, and a third partial objective 1030. Accordingly, projection objective 1900 produces four pupil planes and three intermediate images. At least one of the pupil planes is accessible for positioning an aperture stop. At least one of the pupil planes is accessible for positioning an obscuration stop. For example, an obscuration stop can be positioned on mirror S20.

First partial objective 1010 has a total of six mirrors: mirror S10, mirror S20, mirror S50, mirror S60, mirror S70, and mirror S80. First partial objective 1010 forms a first intermediate image Z3 in a position between mirrors S60 and S70. A second intermediate image Z1 is also formed, in a position at or near the position of mirror S40. The Z1 image is demagnified 2.78×. Second partial objective 1020 has a total of two mirrors: mirror S30, and mirror S40. Second partial objective 1020 forms an intermediate image Z2 at or near the position of mirror S30. The Z2 image is demagnified 1.29×. Third partial objective 1030 has a total of two mirrors: mirror SK1, and mirror SK2. Third partial objective 1030 forms an image at or near the position of image plane 102. This image is demagnified 2.24×.

In this and successive embodiments, by providing a third intermediate image, the cross-sections of the ray bundles, and therefore the utilized mirror surface areas, can be kept relatively small. Further, in this embodiment, the angles of incidence of the principal ray of the central field point of the field in the field plane are made particularly small. The obscuration in the pupil is only 10% of the surface An aperture stop B is positioned near mirror S20.

Data for projection objective 1900 is presented in Table 14A and Table 14B below. Table 14A presents optical data, while Table 14B presents aspherical constants for each of the mirror surfaces. For the purposes of Table 14A and Table 14B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 14A

| Surface | Radius | Thickness | Mode |
| --- | --- | --- | --- |
| Object | INFINITY | 565.102 | |
| Mirror 1 | 55533.824 | −465.102 | REFL |
| STOP | INFINITY | 0.000 | |
| Mirror 2 | 852.374 | 542.952 | REFL |
| Mirror 3 | 281.088 | −498.503 | REFL |
| Mirror 4 | 759.16 | 966.921 | REFL |
| Mirror 5 | 309.453 | −386.183 | REFL |
| Mirror 6 | 515.051 | 1141.014 | REFL |
| Mirror 7 | 1674.294 | −583.849 | REFL |
| Mirror 8 | 758.67 | 1177.650 | REFL |
| Mirror 9 | −1322.155 | −496.668 | REFL |
| Mirror 10 | 927.879 | 536.666 | REFL |
| Image | INFINITY | 0.000 | |

TABLE 14B

| Surface | K | A | B | C |
| --- | --- | --- | --- | --- |
| Mirror 1 | 0.00000E+00 | 1.52016E−09 | −3.52459E−14 | 6.75945E−19 |
| Mirror 2 | 0.00000E+00 | 1.08280E−10 | −6.34141E−15 | 5.18470E−19 |
| Mirror 3 | 0.00000E+00 | −5.96955E−09 | 1.74672E−13 | −6.30562E−19 |
| Mirror 4 | 0.00000E+00 | −1.08435E−11 | −1.00947E−16 | 8.75041E−22 |
| Mirror 5 | 0.00000E+00 | −2.51202E−09 | 7.56313E−12 | −6.05145E−16 |
| Mirror 6 | 0.00000E+00 | −2.60613E−10 | −1.98309E−16 | −1.19381E−21 |
| Mirror 7 | 0.00000E+00 | 6.30349E−10 | −3.39796E−15 | 1.21242E−19 |
| Mirror 8 | 0.00000E+00 | 1.23547E−10 | 2.57281E−16 | 4.94742E−22 |
| Mirror 9 | 0.00000E+00 | 1.05621E−10 | 1.30680E−17 | 4.34693E−22 |
| Mirror 10 | 0.00000E+00 | −2.03140E−10 | −2.32499E−17 | 2.98416E−22 |

TABLE 14B-continued

| Surface | D | E | F | G |
|---|---|---|---|---|
| Mirror 1 | −9.26171E−24 | 0.00000E+00 | 0.00000E+00 | 0.00000E+00 |
| Mirror 2 | −1.66660E−23 | 0.00000E+00 | 0.00000E+00 | 0.00000E+00 |
| Mirror 3 | 1.33871E−22 | −2.49248E−28 | 0.00000E+00 | 0.00000E+00 |
| Mirror 4 | −3.90330E−27 | 8.80258E−33 | 0.00000E+00 | 0.00000E+00 |
| Mirror 5 | 6.70343E−20 | 0.00000E+00 | 0.00000E+00 | 0.00000E+00 |
| Mirror 6 | 2.15204E−27 | 0.00000E+00 | 0.00000E+00 | 0.00000E+00 |
| Mirror 7 | −1.06347E−24 | −2.29594E−29 | 0.00000E+00 | 0.00000E+00 |
| Mirror 8 | 7.10013E−28 | 2.49635E−33 | 0.00000E+00 | 0.00000E+00 |
| Mirror 9 | −3.96448E−28 | 1.80389E−33 | 0.00000E+00 | 0.00000E+00 |
| Mirror 10 | −2.49605E−28 | 8.14302E−34 | 0.00000E+00 | 0.00000E+00 |

Figure 20:
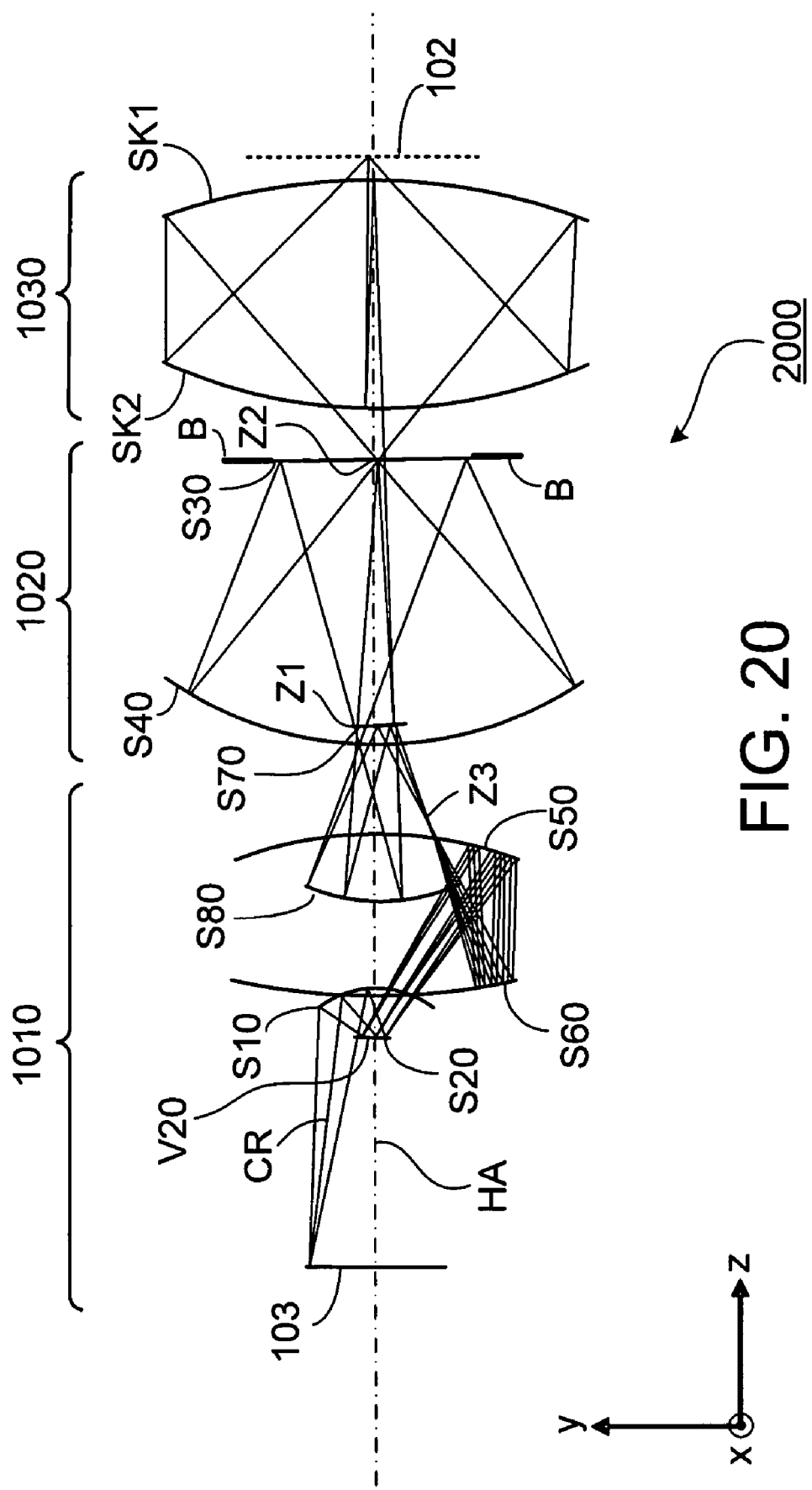
FIG. 20 is a cross-sectional view of a further embodiment of a projection objective shown in meridional section.

Referring to FIG. 20, an embodiment of a projection objective 2000 includes ten mirrors S10, S20, S30, S40, S50, S60, S70, S80, SK1, and SK2, and has an image-side numerical aperture of 0.7 at an operating wavelength of 13.5 nm. Mirrors S10, S20, S30, S40, S50, S60, S70, S80, SK1, and SK2 are all aspherical mirrors. Projection objective 2000 images radiation from object plane 103 to image plane 102 with a demagnification ratio of 8× and a resolution of about 12 nm. The optical axis in relation to which the projection objective is rotationally symmetric is identified as HA, and the overall length of the system from object plane 103 to the image plane 102, the lengthwise dimension, L, is 2,246 mm.

Projection objective 2000 has a ring-segment field. The image-side field width, $d_x$, is 13 mm. The image-side field radius, $d_r$, is 16.25 mm. The image-side field length, $d_y$, is 1 mm. Image-side $W_{rms}$ is 0.3λ. Image-side field curvature is 27 nm.

The order and curvature of mirrors according to the path of radiation from object plane 103 to image plane 102 is as follows: mirror S10 is a concave mirror; mirror S20 is a convex mirror; mirror S50 is a concave mirror; mirror S60 is a concave mirror; mirror S70 is a convex mirror; mirror S80 is a concave mirror; mirror S30 is a convex mirror; mirror S40 is a concave mirror; mirror SK1 is a concave mirror; and mirror SK2 is a concave mirror.

Mirrors S30, S40, SK1, and SK2 include openings. Mirrors S10, S20, S50, S60, S70 and S80 do not include openings. The resulting obscuration radius that provides a field-independent obscuration is 28% of the aperture radius.

The image-side free working distance is 40 mm. The object-side free working distance is 468 mm.

The maximum angle of incidence on mirrors S10, S20, S30, S40, S50, S60, S70, S80, SK1, and SK2 of a chief ray of a central field point is 35.3°. The maximum angle of incidence of any ray on mirrors S10, S20, S30, S40, S50, S60, S70, S80, SK1, and SK2 is 42.4°. The maximum range of incident angles on any of mirrors S10, S20, S30, S40, S50, S60, S70, S80, SK1, and SK2 is 18.9°.

The size of the largest mirror in meridional section is 836 mm. The size of the largest mirror in the x-direction is 834 mm.

The mirrors are arranged so that projection objective 2000 contains three partial objectives: a first partial objective 1010, a second partial objective 1020, and a third partial objective 1030. Accordingly, projection objective 2000 produces four pupil planes and three intermediate images. At least one of the pupil planes is accessible for positioning an aperture stop.

First partial objective 1010 has a total of six mirrors: mirror S10, mirror S20, mirror S50, mirror S60, mirror S70, and mirror S80. First partial objective 1010 forms a first intermediate image Z3 in a position between mirrors S60 and S70. A second intermediate image Z1 is also formed, in a position at or near the position of mirror S40. Second partial objective 1020 has a total of two mirrors: mirror S30, and mirror S40. Second partial objective 1020 forms an intermediate image Z2 at or near the position of mirror S30. Third partial objective 1030 has a total of two mirrors: mirror SK1, and mirror SK2. Third partial objective 1030 forms an image at or near the position of image plane 102.

An aperture stop B is positioned near mirror S30.

Data for projection objective 2000 is presented in Table 15A and Table 15B below. Table 15A presents optical data, while Table 15B presents aspherical constants for each of the mirror surfaces. For the purposes of Table 15A and Table 15B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 15A

| Surface | Radius | Thickness | Mode |
|---|---|---|---|
| Object | INFINITY | 559.181 | |
| Mirror 1 | −245.847 | −91.621 | REFL |
| Mirror 2 | −106.241 | 409.943 | REFL |
| Mirror 3 | −797.047 | −329.100 | REFL |
| Mirror 4 | 1288.083 | 544.097 | REFL |
| Mirror 5 | 471.444 | −352.779 | REFL |
| Mirror 6 | 391.18 | 895.651 | REFL |
| STOP | INFINITY | 0.000 | |
| Mirror 7 | 89550.706 | −575.938 | REFL |
| Mirror 8 | 769.632 | 1146.221 | REFL |
| Mirror 9 | −1294.759 | −470.344 | REFL |
| Mirror 10 | 921.525 | 510.244 | REFL |
| Image | INFINITY | 0.000 | |

TABLE 15B

| Surface | K | A | B | C |
|---|---|---|---|---|
| Mirror 1 | 0.00000E+00 | 7.66254E−09 | 2.77417E−14 | 1.36582E−18 |
| Mirror 2 | 0.00000E+00 | 7.08392E−07 | 8.77265E−11 | −1.08467E−13 |
| Mirror 3 | 0.00000E+00 | 3.26115E−10 | 3.33584E−16 | −5.68189E−21 |
| Mirror 4 | 0.00000E+00 | 2.50220E−10 | −4.02328E−15 | 3.97478E−20 |
| Mirror 5 | 0.00000E+00 | 8.20670E−08 | 8.14545E−12 | 4.31824E−16 |
| Mirror 6 | 0.00000E+00 | 1.46218E−09 | 2.25940E−14 | 5.19142E−19 |
| Mirror 7 | 0.00000E+00 | 4.23423E−09 | −7.06964E−14 | 9.09880E−19 |
| Mirror 8 | 0.00000E+00 | 6.41818E−11 | 1.25081E−16 | 4.78443E−23 |
| Mirror 9 | 0.00000E+00 | −2.72326E−10 | 1.27303E−15 | −6.33084E−21 |
| Mirror 10 | 0.00000E+00 | −2.43581E−10 | −6.44997E−16 | 3.73803E−22 |

| Surface | D | E | F | G |
|---|---|---|---|---|
| Mirror 1 | 1.60505E−23 | 0.00000E+00 | 0.00000E+00 | 0.00000E+00 |
| Mirror 2 | 0.00000E+00 | 0.00000E+00 | 0.00000E+00 | 0.00000E+00 |
| Mirror 3 | 1.08127E−25 | −4.00572E−31 | 0.00000E+00 | 0.00000E+00 |
| Mirror 4 | −1.61324E−25 | 2.23312E−31 | 0.00000E+00 | 0.00000E+00 |
| Mirror 5 | 1.12366E−19 | 0.00000E+00 | 0.00000E+00 | 0.00000E+00 |
| Mirror 6 | −2.84570E−24 | 3.72190E−28 | 0.00000E+00 | 0.00000E+00 |
| Mirror 7 | −9.81546E−24 | 1.27493E−29 | −6.38729E−35 | 0.00000E+00 |
| Mirror 8 | 1.99269E−27 | −5.19669E−33 | 2.07669E−38 | 0.00000E+00 |
| Mirror 9 | 2.30570E−26 | −5.38480E−32 | 6.82514E−38 | 0.00000E+00 |
| Mirror 10 | 1.59378E−27 | −2.26603E−32 | 7.46453E−38 | 0.00000E+00 |

Figure 21:
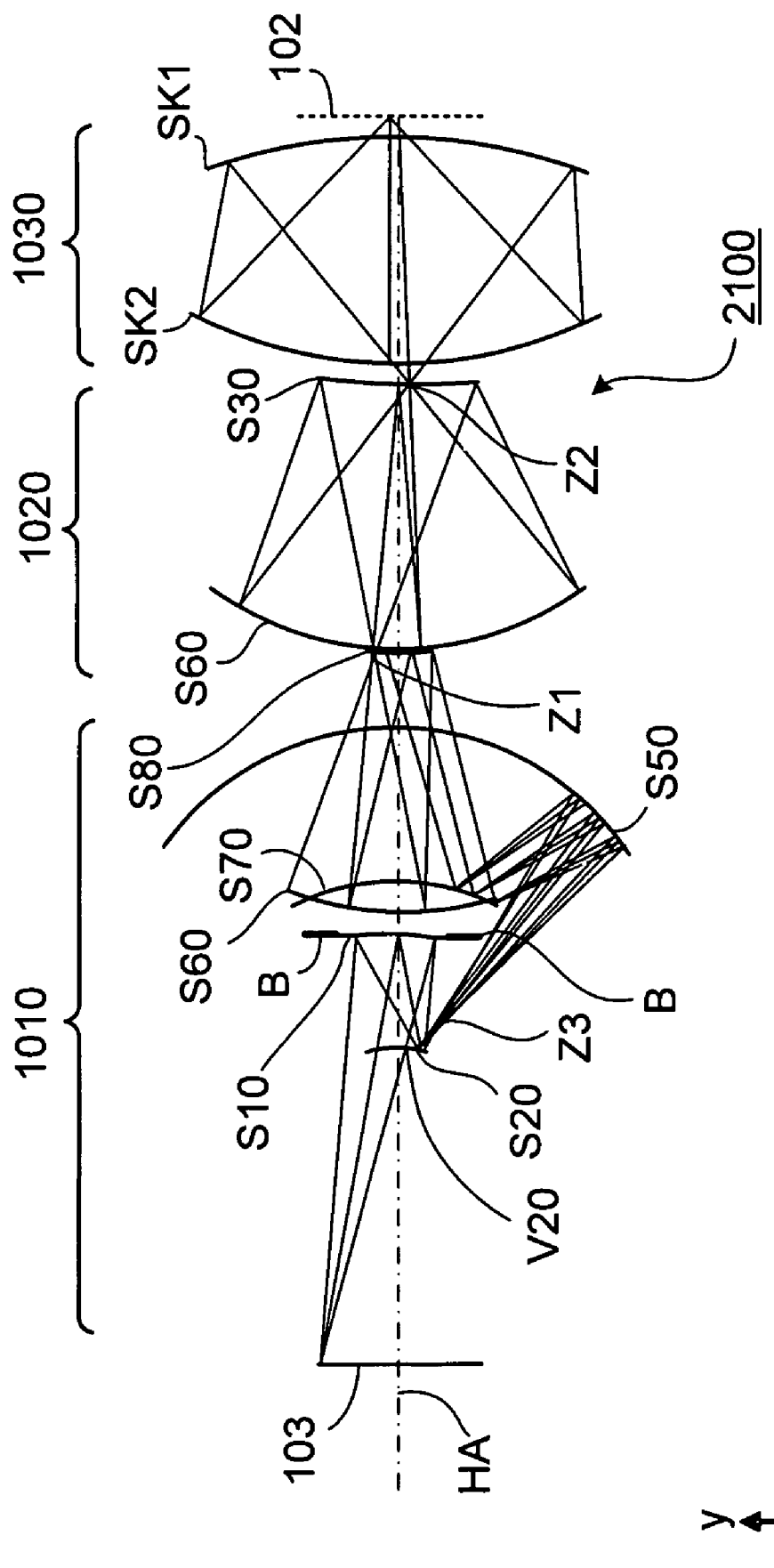
FIG. 21 is a cross-sectional view of another embodiment of a projection objective shown in meridional section.

Referring to FIG. 21, an embodiment of a projection objective 2100 includes ten mirrors S10, S20, S30, S40, S50, S60, S70, S80, SK1, and SK2, and has an image-side numerical aperture of 0.72 at an operating wavelength of 13.4 nm. Mirrors S10, S20, S30, S40, S50, S60, S70, S80, SK1, and SK2 are all aspherical mirrors. Projection objective 2100 images radiation from object plane 103 to image plane 102 with a demagnification ratio of 8× and a resolution of about 12 nm. The optical axis in relation to which the projection objective is rotationally symmetric is identified as HA, and the overall length of the system from object plane 103 to the image plane 102, the lengthwise dimension, L, is 2,800 mm.

Projection objective 2100 has a ring-segment field. The image-side field width, $d_x$, is 13 mm. The image-side field radius, $d_r$, is 21.25 mm. The image-side field length, $d_y$, is 1 mm. Image-side $W_{rms}$ is 0.052λ. Image-side field curvature is 7 nm.

The order and curvature of mirrors according to the path of radiation from object plane 103 to image plane 102 is as follows: mirror S10 is a concave mirror; mirror S20 is a convex mirror; mirror S50 is a concave mirror; mirror S60 is a convex mirror; mirror S70 is a convex mirror; mirror S80 is a concave mirror; mirror S30 is a convex mirror; mirror S40 is a concave mirror; mirror SK1 is a concave mirror; and mirror SK2 is a concave mirror.

Mirrors S30, S40, SK1, and SK2 include openings. Mirrors S10, S20, S50, S60, S70 and S80 do not include openings. The resulting obscuration radius that provides a field-independent obscuration is 29% of the aperture radius.

The image-side free working distance is 41 mm. The object-side free working distance is 729 mm.

The maximum angle of incidence on mirrors S10, S20, S30, S40, S50, S60, S70, S80, SK1, and SK2 of a chief ray of a central field point is 35.0°. The maximum angle of incidence of any ray on mirrors S10, S20, S30, S40, S50, S60, S70, S80, SK1, and SK2 is 39.6°. The maximum range of incident angles on any of mirrors S10, S20, S30, S40, S50, S60, S70, S80, SK1, and SK2 is 24.5°.

The size of the largest mirror in meridional section is 871 mm. The size of the largest mirror in the x-direction is 918 mm.

The mirrors are arranged so that projection objective 2100 contains three partial objectives: a first partial objective 1010, a second partial objective 1020, and a third partial objective 1030. Accordingly, projection objective 2500 produces four pupil planes and three intermediate images. At least one of the pupil planes is accessible for positioning an aperture stop. At least one of the pupil planes is accessible for positioning an obscuration stop. For example, an obscuration stop can be positioned on mirror S10.

First partial objective 1010 has a total of six mirrors: mirror S10, mirror S20, mirror S50, mirror S60, mirror S70, and mirror S80. First partial objective 1010 forms a first intermediate image Z3 in a position between mirrors S20 and S50. A second intermediate image Z1 is also formed, in a position at or near the position of mirror S40. Second partial objective 1020 has a total of two mirrors: mirror S30, and mirror S40. Second partial objective 1020 forms an intermediate image Z2 at or near the position of mirror S30. Third partial objective 1030 has a total of two mirrors: mirror SK1, and mirror SK2. Third partial objective 1030 forms an image at or near the position of image plane 102.

An aperture stop B is positioned near mirror S10.

The systems shown in FIGS. 20 and 21 include six or more mirrors, where at least one mirror includes no opening for the passage of a bundle of rays, and where that mirror is also positioned at the shortest distance from object plane 103, relative to the other mirrors, the distance being larger than 15% of the lengthwise dimension of the objective. With an object-side free working distance of this magnitude, a sufficient amount of space is provided to accommodate mechanical components, e.g., a reticle stage, and optical filter elements that have field-dependent effects and therefore have to be arranged near a field plane, and like components.

In the embodiments shown in FIGS. 20 and 21, the mirror that has no opening and, measured along the axis HA, has the shortest distance from the object plane, is mirror S20. The distance of mirror S20 from object plane 103 is measured as the distance from vertex V20 of mirror S20 from object plane 103.

Data for projection objective 2100 is presented in Table 16A and Table 16B below. Table 16A presents optical data, while Table 16B presents aspherical constants for each of the mirror surfaces. For the purposes of Table 16A and Table 16B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

TABLE 16A

| Surface | Radius | Thickness | Mode |
|---|---|---|---|
| Object | INFINITY | 984.370 | |
| STOP | INFINITY | 0.000 | |
| Mirror 1 | −487.824 | −255.596 | REFL |
| Mirror 2 | −203.99 | 720.214 | REFL |
| Mirror 3 | −618.943 | −342.547 | REFL |
| Mirror 4 | −467.367 | 522.697 | REFL |
| Mirror 5 | 1517.781 | −594.768 | REFL |
| Mirror 6 | 691.924 | 1170.936 | REFL |
| Mirror 7 | 2075.314 | −583.106 | REFL |
| Mirror 8 | 756.671 | 1136.329 | REFL |
| Mirror 9 | −1247.404 | −502.341 | REFL |
| Mirror 10 | 947.118 | 543.813 | REFL |
| Image | INFINITY | 0.000 | |

TABLE 16B

| Surface | K | A | B | C |
|---|---|---|---|---|
| Mirror 1 | 0.00000E+00 | 3.07073E−10 | −2.63762E−14 | −4.75987E−19 |
| Mirror 2 | 0.00000E+00 | −5.92526E−09 | −1.01630E−12 | 3.61436E−16 |
| Mirror 3 | 0.00000E+00 | 1.01014E−10 | −8.68729E−16 | 4.12943E−21 |
| Mirror 4 | 0.00000E+00 | 1.63695E−09 | 3.55194E−14 | −6.73526E−19 |
| Mirror 5 | 0.00000E+00 | 3.47124E−08 | 1.00844E−12 | 4.12785E−17 |
| Mirror 6 | 0.00000E+00 | 2.82522E−11 | 1.38881E−16 | −6.42306E−23 |
| Mirror 7 | 0.00000E+00 | −2.11518E−10 | −4.61053E−15 | −1.12662E−19 |
| Mirror 8 | 0.00000E+00 | 6.09426E−11 | 8.83052E−17 | 8.08906E−23 |
| Mirror 9 | 0.00000E+00 | 7.30445E−11 | 1.71628E−16 | 3.00636E−22 |
| Mirror 10 | 0.00000E+00 | −1.78072E−10 | −6.22611E−17 | 3.97686E−22 |

| Surface | D | E | F | G |
|---|---|---|---|---|
| Mirror 1 | 1.15793E−22 | −2.70203E−26 | 1.70913E−30 | 0.00000E+00 |
| Mirror 2 | −1.06065E−19 | 1.63883E−23 | −1.10394E−27 | 0.00000E+00 |
| Mirror 3 | −7.94689E−27 | 1.74105E−33 | 1.29251E−38 | 0.00000E+00 |
| Mirror 4 | 7.84526E−24 | −4.94145E−29 | 1.32806E−34 | 0.00000E+00 |
| Mirror 5 | 6.94133E−21 | −6.19939E−25 | 9.05297E−29 | 0.00000E+00 |
| Mirror 6 | 8.71534E−27 | −1.78347E−31 | 7.69324E−37 | 0.00000E+00 |
| Mirror 7 | 8.47783E−26 | −5.55624E−30 | −2.20618E−34 | 0.00000E+00 |
| Mirror 8 | 2.92953E−29 | 2.28833E−34 | −1.14558E−40 | 0.00000E+00 |
| Mirror 9 | 2.96880E−28 | 1.02229E−33 | 1.04271E−39 | 0.00000E+00 |
| Mirror 10 | 5.02383E−28 | −2.14813E−33 | 3.31869E−39 | 0.00000E+00 |

Figure 22:
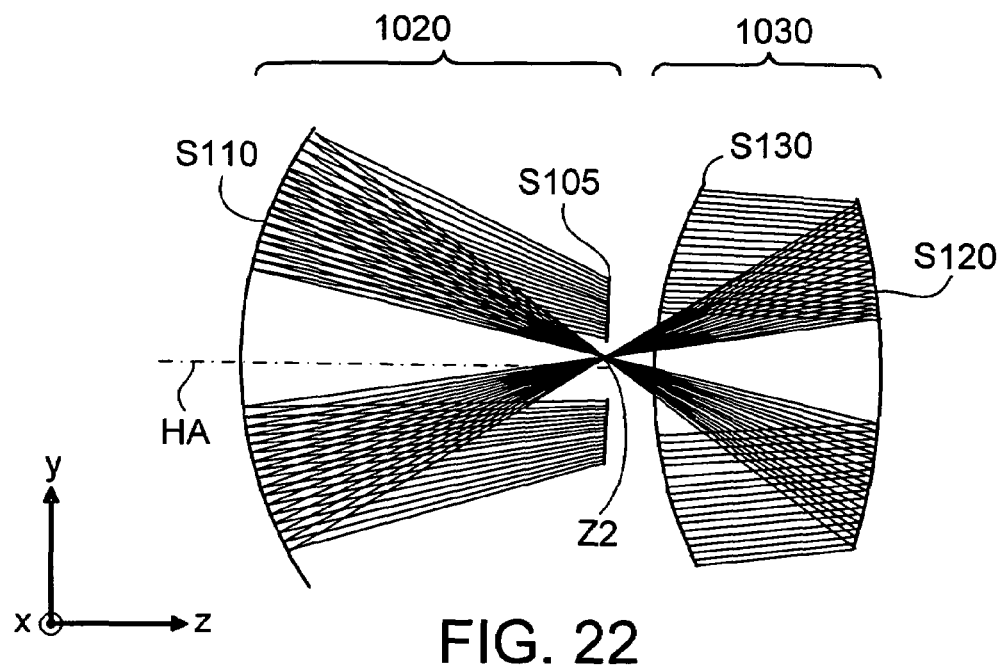
FIG. 22 is a cross-sectional view of a portion of a projection objective shown in meridional section.

FIG. 22 shows an expanded view of an embodiment of a second partial objective 1020 and a third partial objective 1030. Second partial objective 1020 includes convex mirror S105 and concave mirror S110. Third partial objective includes concave mirror S120 and concave mirror S130. An intermediate image Z2 is formed at or near the position of mirror S105 by second partial objective 1020. The intermediate image at or near the location of mirror S105 leads to a surface obscuration of about 10% of the pupil of the projection objective.

Figure 23:
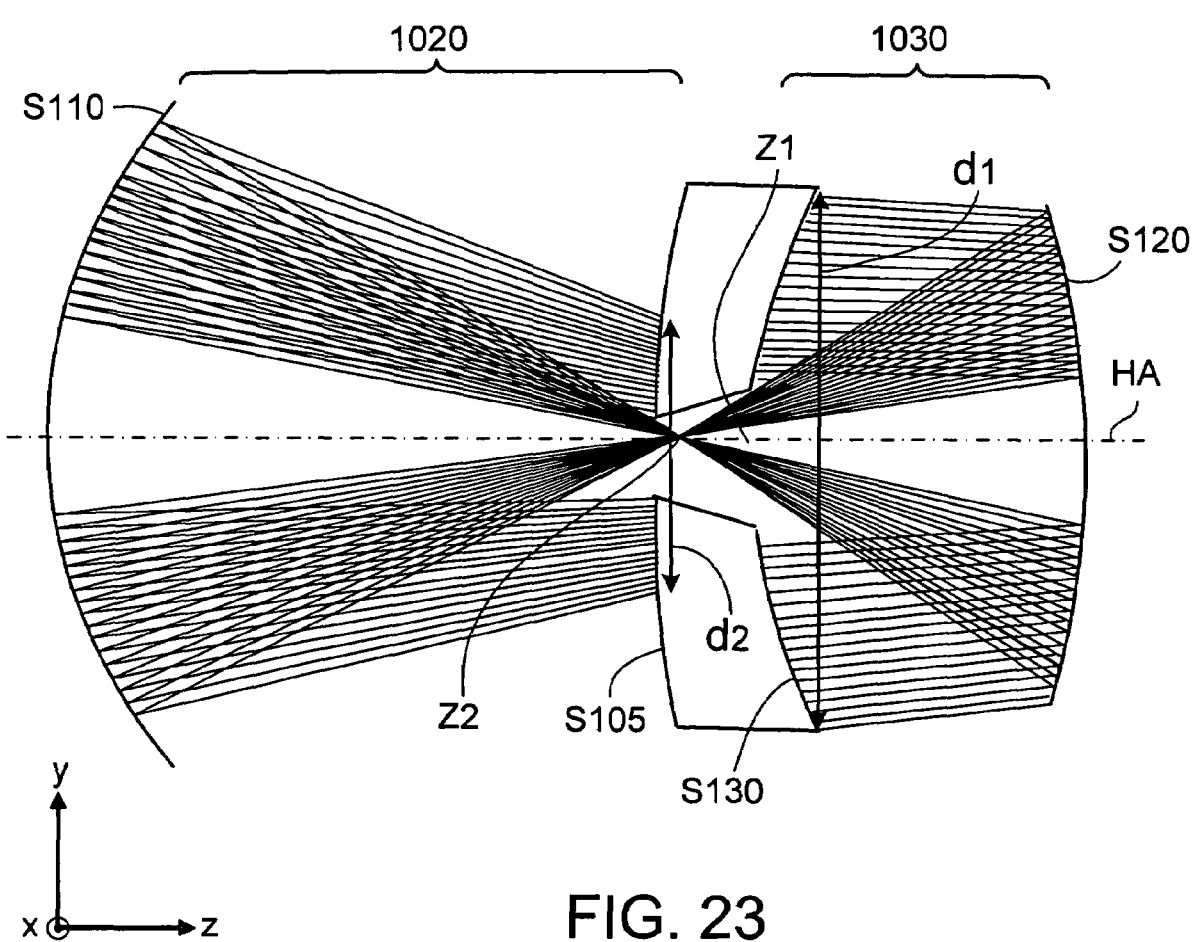
FIG. 23 is a cross-sectional view of a portion of a projection objective shown in meridional section.

FIG. 23 shows an expanded view of another embodiment of a second partial objective 1020 and a third partial objective 1030. Second partial objective 1020 includes convex mirror S105 and concave mirror S110. Third partial objective includes concave mirror S120 and concave mirror S130. In this embodiment, surface obscuration of the pupil of the projection objective is about 8% as a result of positioning intermediate image Z2 between mirrors S105 and S130. Along the light path's mirror sequence from the object plane to the image plane, these mirrors are, respectively, the fourth-from-last mirror and the last mirror from the object plane. The mirrors are selected so that the condition $d_1/d_2 = z_1/z_2$ is met, where $d_1$ is the diameter of mirror S130, $d_2$ is the diameter of mirror S105, $z_1$ is the distance from intermediate image Z2 to the surface of mirror S130, and $z_2$ is the distance from intermediate image Z2 to the surface of mirror S105.

Figure 24:
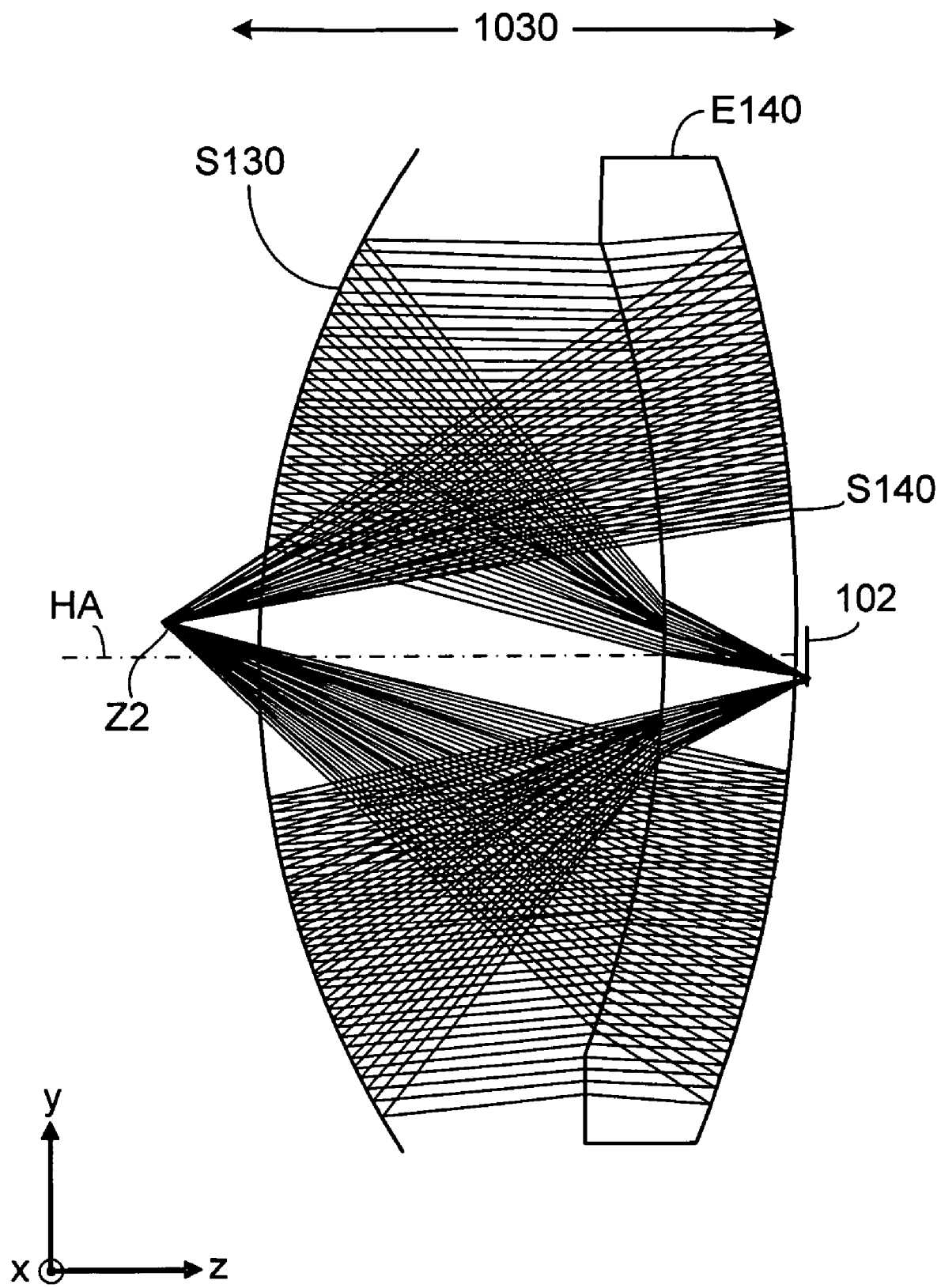
FIG. 24 is a cross-sectional view of a portion of a projection objective shown in meridional section.

FIG. 24 shows an expanded view of an embodiment of a third partial objective 1030 in which a Mangin mirror S140 is used in place of mirror S120 in FIG. 23, for example. A system with a Mangin mirror has the advantage that the space required for mounting the mirror is made available by the optical element E140 through which the light has to pass in order to reflect from mirror S140, which is located on a back surface of element E140. As a result of this configuration, mirror S140 can be positioned very close to image plane 102 without compromising stability.

Figure 25:
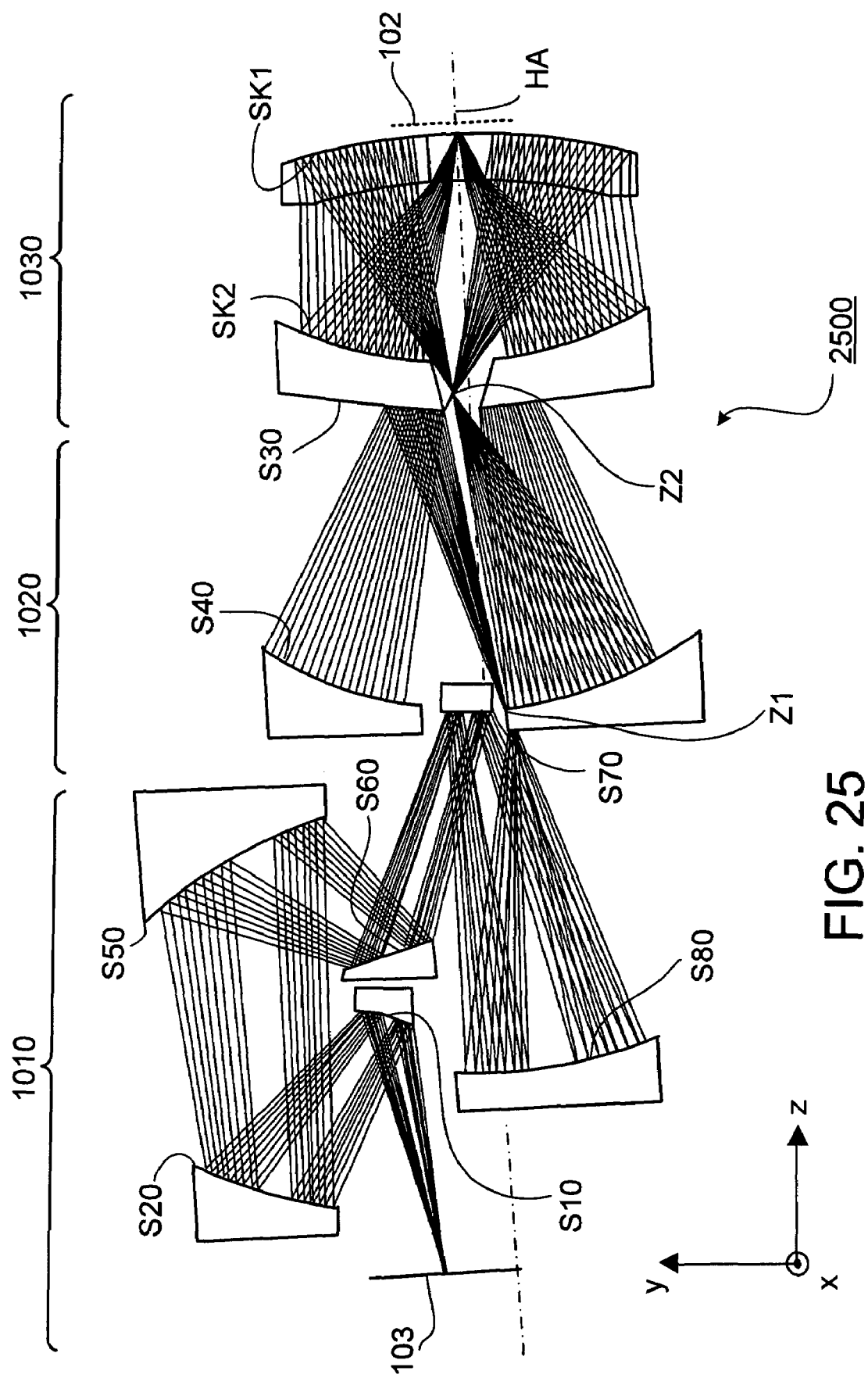
FIG. 25 is a cross-sectional view of another embodiment of a projection objective shown in meridional section.

Referring to FIG. 25, an embodiment of a projection objective 2500 includes ten mirrors S10, S20, S30, S40, S50, S60, S70, S80, SK1, and SK2, and has an image-side numerical aperture of 0.7 at an operating wavelength of 193.3 nm. Mirrors S10, S20, S30, S40, S50, S60, S70, S80, SK1, and SK2 are all aspherical mirrors. Projection objective 2500 images radiation from object plane 103 to image plane 102 with a demagnification ratio of 8× and a resolution of about 100 nm. The optical axis in relation to which the projection objective is rotationally symmetric is identified as HA, and the overall length of the system from object plane 103 to the image plane 102, the lengthwise dimension, L, is 2,500 mm.

Projection objective 2500 has a ring-segment field. The image-side field width, $d_x$, is 13 mm. The image-side field radius, $d_r$, is 18.75 mm. The image-side field length, $d_y$, is 1 mm. Image-side $W_{rms}$ is 0.023λ. Image-side field curvature is 59 nm.

The order and curvature of mirrors according to the path of radiation from object plane 103 to image plane 102 is as follows: mirror S10 is a convex mirror; mirror S20 is a concave mirror; mirror S50 is a concave mirror; mirror S60 is a convex mirror; mirror S70 is a convex mirror; mirror S80 is a concave mirror; mirror S30 is a convex mirror; mirror S40 is a concave mirror; mirror SK1 is a concave mirror; and mirror SK2 is a concave mirror. Mirror SK1 is a Mangin mirror, as discussed previously.

Mirrors S30, S40, SK1, and SK2 include openings. Mirrors S10, S20, S50, S60, S70 and S80 do not include openings. The resulting obscuration radius that provides a field-independent obscuration is 28% of the aperture radius.

The image-side free working distance is 10 mm. The object-side free working distance is 100 mm.

The maximum angle of incidence on mirrors S10, S20, S30, S40, S50, S60, S70, S80, SK1, and SK2 of a chief ray of a central field point is 37.6°. The maximum angle of incidence of any ray on mirrors S10, S20, S30, S40, S50, S60, S70, S80, SK1, and SK2 is 49.4°. The maximum range of incident angles on any of mirrors S10, S20, S30, S40, S50, S60, S70, S80, SK1, and SK2 is 22.4°.

The size of the largest mirror in meridional section is 889 mm. The size of the largest mirror in the x-direction is 883 mm.

The mirrors are arranged so that projection objective 2500 contains three partial objectives: a first partial objective 1010, a second partial objective 1020, and a third partial objective 1030. Accordingly, projection objective 2500 produces three pupil planes and two intermediate images. At least one of the pupil planes is accessible for positioning an aperture stop.

First partial objective 1010 has a total of six mirrors: mirror S10, mirror S20, mirror S50, mirror S60, mirror S70, and mirror S80. First partial objective 1010 forms a first intermediate image Z1 in a position at or near mirror S40. Second partial objective 1020 has a total of two mirrors: mirror S30, and mirror S40. Second partial objective 1020 forms an intermediate image Z2 at or near the position of mirror S30. Third partial objective 1030 has a total of two mirrors: mirror SK1, and mirror SK2. Third partial objective 1030 forms an image at or near the position of image plane 102.

Data for projection objective 2500 is presented in Table 17A and Table 17B below. Table 17A presents optical data, while Table 17B presents aspherical constants for each of the mirror surfaces. For the purposes of Table 17A and Table 17B, the mirror designations correlate as follows: mirror 1 corresponds to mirror S10; mirror 2 corresponds to mirror S20; mirror 3 corresponds to mirror S50; mirror 4 corresponds to mirror S60; mirror 5 corresponds to mirror S70; mirror 6 corresponds to mirror S80; mirror 7 corresponds to mirror S30; mirror 8 corresponds to mirror S40; mirror 9 corresponds to mirror SK1; and mirror 10 corresponds to mirror SK2.

To provide a realization of low angles of incidence in a high aperture system, it can be advantageous if the second mirror in the light path of the first partial objective is a concave mirror. This may lead to relatively low angles of incidence on all mirrors. Further, this design choice can facilitate the production of mirror coatings because low angles of incidence reduce the need for providing a coating with a lateral thickness variation of the mirror surface. Instead, the coating thickness can be relatively constant over the mirror surface. In addition, lower angles of incidence can result in higher reflectivity from the mirror surface.

TABLE 17A

| Surface | Radius | Thickness | Mode | n |
|---|---|---|---|---|
| Object | INFINITY | 533.185 | | |
| Mirror 1 | 998.875 | −433.185 | REFL | |
| Mirror 2 | 1507.19 | 966.402 | REFL | |
| Mirror 3 | −1186.286 | −333.216 | REFL | |
| Mirror 4 | −774.298 | 492.401 | REFL | |
| Mirror 5 | 345.555 | −796.615 | REFL | |
| Mirror 6 | 875.806 | 1462.434 | REFL | |
| STOP | INFINITY | 0.000 | | |
| Mirror 7 | 2012.09 | −663.855 | REFL | |
| Mirror 8 | 868.41 | 1161.917 | REFL | |
| Sphere | −1142.612 | 99.999 | REFR | 1.560491 |
| Mirror 9 | −1173.131 | −99.999 | REFL | 1.560491 |
| Sphere | −1142.612 | −398.063 | REFR | |
| Mirror 10 | 864.134 | 398.063 | REFL | |
| Sphere | −1142.612 | 99.999 | REFR | 1.560491 |
| Asphere | −1173.131 | 9.950 | REFR | |
| Image | INFINITY | 0.000 | | |

TABLE 17B

| Surface | K | A | B | C |
|---|---|---|---|---|
| Mirror 1 | 0.00000E+00 | −4.63661E−10 | 1.49173E−15 | 1.17129E−20 |
| Mirror 2 | 0.00000E+00 | −6.57662E−11 | −4.99638E−17 | 4.57647E−23 |
| Mirror 3 | 0.00000E+00 | 1.36485E−11 | −1.81657E−17 | 5.69451E−23 |
| Mirror 4 | 0.00000E+00 | 4.34663E−10 | −1.84433E−15 | 1.91302E−20 |
| Mirror 5 | 0.00000E+00 | −2.90145E−10 | −4.30363E−14 | 2.45843E−17 |
| Mirror 6 | 0.00000E+00 | −8.22539E−11 | 5.31955E−18 | −3.31349E−22 |
| Mirror 7 | 0.00000E+00 | 8.95414E−10 | 0.00000E+00 | 0.00000E+00 |
| Mirror 8 | 0.00000E+00 | 6.40715E−11 | 7.25579E−17 | 1.14913E−22 |
| Mirror 9 | 0.00000E+00 | 1.11862E−10 | 9.94515E−17 | 3.86584E−22 |
| Mirror 10 | 0.00000E+00 | −1.92745E−10 | 3.60396E−16 | 2.01867E−22 |
| Asphere | 0.00000E+00 | 1.11862E−10 | 9.94515E−17 | 3.86584E−22 |

| Surface | D | E | F | G |
|---|---|---|---|---|
| Mirror 1 | −1.03763E−25 | −3.90507E−32 | 0.00000E+00 | 0.00000E+00 |
| Mirror 2 | −5.45358E−30 | −1.74383E−34 | 0.00000E+00 | 0.00000E+00 |
| Mirror 3 | −7.91336E−29 | 9.23378E−36 | 0.00000E+00 | 0.00000E+00 |
| Mirror 4 | −1.21633E−25 | 3.53832E−31 | 0.00000E+00 | 0.00000E+00 |
| Mirror 5 | −1.57578E−21 | 2.19218E−25 | 0.00000E+00 | 0.00000E+00 |
| Mirror 6 | 3.61420E−28 | 5.96686E−34 | 0.00000E+00 | 0.00000E+00 |
| Mirror 7 | 9.11424E−25 | −4.57429E−30 | 0.00000E+00 | 0.00000E+00 |
| Mirror 8 | 2.64566E−28 | −1.96096E−34 | 1.92729E−39 | 0.00000E+00 |

TABLE 17B-continued

| Mirror 9 | 5.06626E−28 | −1.28846E−33 | 1.47731E−38 | 0.00000E+00 |
| Mirror 10 | 7.88027E−28 | −2.94908E−33 | 2.20072E−38 | 0.00000E+00 |
| Asphere | 5.06626E−28 | −1.28846E−33 | 1.47731E−38 | 0.00000E+00 |

Figure 26:
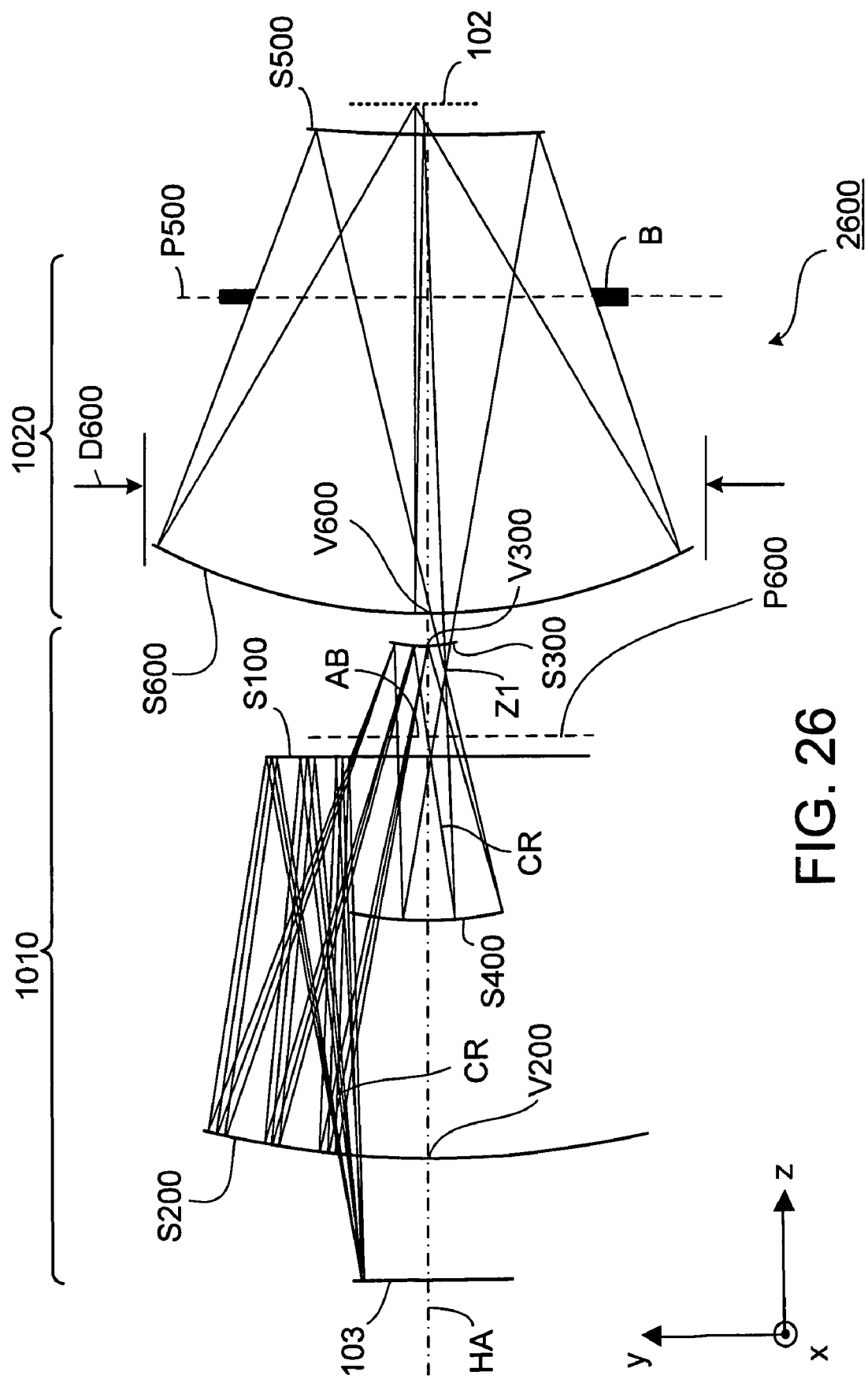
FIG. 26 is a cross-sectional view of a further embodiment of a projection objective shown in meridional section.

Referring to FIG. 26, an embodiment of a projection objective 2600 includes six mirrors S100, S200, S300, S400, S500, and S600, and has an image-side numerical aperture of 0.5 at an operating wavelength of 13.5 nm. Mirrors S100, S200, S300, S400, S500, and S600 are all aspherical mirrors. Projection objective 2600 images radiation from object plane 103 to image plane 102 with a demagnification ratio of 8× and a resolution of about 17 nm. The optical axis in relation to which the projection objective is rotationally symmetric is identified as HA, and the overall length of the system from object plane 103 to the image plane 102, the lengthwise dimension, L, is 1,521 mm.

Projection objective 2600 has a ring-segment field. The image-side field width, $d_x$, is 13 mm. The image-side field radius, $d_r$, is 9.75 mm. The image-side field length, $d_y$, is 1 mm. Image-side $W_{rms}$ is 0.028λ. Image-side field curvature is 10 nm.

The order and curvature of mirrors according to the path of radiation from object plane 103 to image plane 102 is as follows: mirror S100 is a concave mirror; mirror S200 is a concave mirror; mirror S300 is a convex mirror; mirror S400 is a concave mirror; mirror S500 is a convex mirror; and mirror S600 is a concave mirror. The use of a concave second mirror S200 provides for relatively low angles of incidence in this embodiment.

Mirrors S500 and S600 include openings. Mirrors S100, S200, S300, and S400 do not include openings. The resulting obscuration radius that provides a field-independent obscuration is 25% of the aperture radius.

The image-side free working distance is 39 mm. The object-side free working distance is 158 mm.

The maximum angle of incidence on mirrors S100, S200, S300, S400, S500, and S600 of a chief ray of a central field point is 12.3°. The maximum angle of incidence of any ray on mirrors S100, S200, S300, S400, S500, and S600 is 16.9°. The maximum range of incident angles on any of mirrors S100, S200, S300, S400, S500, and S600 is 7.5°.

The size of the largest mirror in meridional section is 675 mm. The size of the largest mirror in the x-direction is 687 mm.

The mirrors are arranged so that projection objective 2600 contains two partial objectives: a first partial objective 1010 and a second partial objective 1020. Accordingly, projection objective 2600 produces two pupil planes and one intermediate image. At least one of the pupil planes is accessible for positioning an aperture stop. At least one of the pupil planes is accessible for positioning an obscuration stop. For example, in the embodiment shown, an obscuration stop AB is positioned between mirrors S300 and S400. By positioning the obscuration stop in this location, a field-independent obscuration of about 25% with a fully open aperture is realized.

First partial objective 1010 has a total of four mirrors: mirror S100, mirror S200, mirror S300, and mirror S400. First partial objective 1010 forms a first intermediate image Z1 in a position between mirrors S400 and S500. Second partial objective 1020 has a total of two mirrors: mirror S500, and mirror S600. Second partial objective 1020 forms an image at or near the position of image plane 102.

An aperture stop B is positioned between mirrors S500 and S600.

When the obscuration stop AB, which defines the inside radius of the illuminated field and thus the obscuration, is arranged between two mirrors, i.e., relatively far from a mirror position, the obscuration stop is passed only once in the light path of the imaging light ray bundle, so that no vignetting effects occur. Further, sufficient space for the obscuration stop is provided (i.e., the stop is not constricted by space requirements for mirrors), so that the obscuration stop is easily interchangeable, since it is not realized by an anti-reflection coating on a mirror.

In the embodiment shown, aperture stop B and obscuration stop AB are located in two different stop planes that are conjugate to one another and are at a distance from each of the mirrors. Aperture stop B is positioned in stop plane P500 and the obscuration stop lies in stop plane P600. The planes P500 and P600 are conjugate to the entry pupil of the projection objective, and lie at the point of intersection of the principal ray (i.e., chief ray CR) and axis HA of the objective.

The angles of incidence of the principal ray of the central field point on all mirrors are smaller than 20° relative to the local surface-normal direction. The maximum angle of incidence of the principal ray of the central field point in the objective occurs on mirror S300 and is 12.3°, as discussed above. As a result of maintaining the angles of incidence on the mirrors small, a higher reflectivity from the individual mirrors is realized, and a higher transmissivity for the overall objective is obtained. In particular, the reflectivity for p-polarized components of light decreases as the angle of incidence increases.

Data for projection objective 2600 is presented in Table 18A and Table 18B below. Table 18A presents optical data, while Table 18B presents aspherical constants for each of the mirror surfaces. For the purposes of Table 18A and Table 18B, the mirror designations correlate as follows: mirror 1 corresponds to mirror S100; mirror 2 corresponds to mirror S200; mirror 3 corresponds to mirror S300; mirror 4 corresponds to mirror S400; mirror 5 corresponds to mirror S500; mirror 6 corresponds to mirror S600; STOP corresponds to aperture stop B; and Image corresponds to image plane 102.

TABLE 18A

| Surface | Radius | Thickness | Mode |
|---|---|---|---|
| Object | INFINITY | 670.918 | |
| Mirror 1 | −119254.844 | −513.109 | REFL |
| Mirror 2 | 1058.494 | 657.514 | REFL |
| Mirror 3 | 236.520 | −352.038 | REFL |
| Mirror 4 | 406.062 | 1018.792 | REFL |
| Mirror 5 | 2416.511 | −213.326 | REFL |
| STOP | INFINITY | −406.623 | |
| Mirror 6 | 813.393 | 659.142 | REFL |
| Image | INFINITY | 0 | |

TABLE 18B

| Surface | K | A | B |
|---|---|---|---|
| Mirror 1 | 0.00000E+00 | −1.71227E−10 | 1.21604E−16 |
| Mirror 2 | 0.00000E+00 | −3.98375E−11 | −5.16759E−17 |
| Mirror 3 | 0.00000E+00 | 2.49910E−09 | 5.14762E−13 |
| Mirror 4 | 0.00000E+00 | 6.84051E−10 | 5.83113E−15 |
| Mirror 5 | 0.00000E+00 | 1.05935E−09 | 2.78882E−15 |
| Mirror 6 | 0.00000E+00 | 2.33770E−11 | 5.31421E−17 |

| Surface | C | D | E |
|---|---|---|---|
| Mirror 1 | −1.63049E−21 | 4.61626E−27 | 0.00000E+00 |
| Mirror 2 | −1.23197E−22 | −2.34001E−28 | 0.00000E+00 |
| Mirror 3 | −1.78225E−17 | 7.40434E−22 | 0.00000E+00 |
| Mirror 4 | 5.23435E−20 | 3.88486E−25 | 5.48925E−30 |
| Mirror 5 | 1.34567E−20 | 5.03919E−26 | 8.14921E−31 |
| Mirror 6 | 9.34234E−23 | 1.04943E−28 | 4.61313E−34 |

Figure 27:
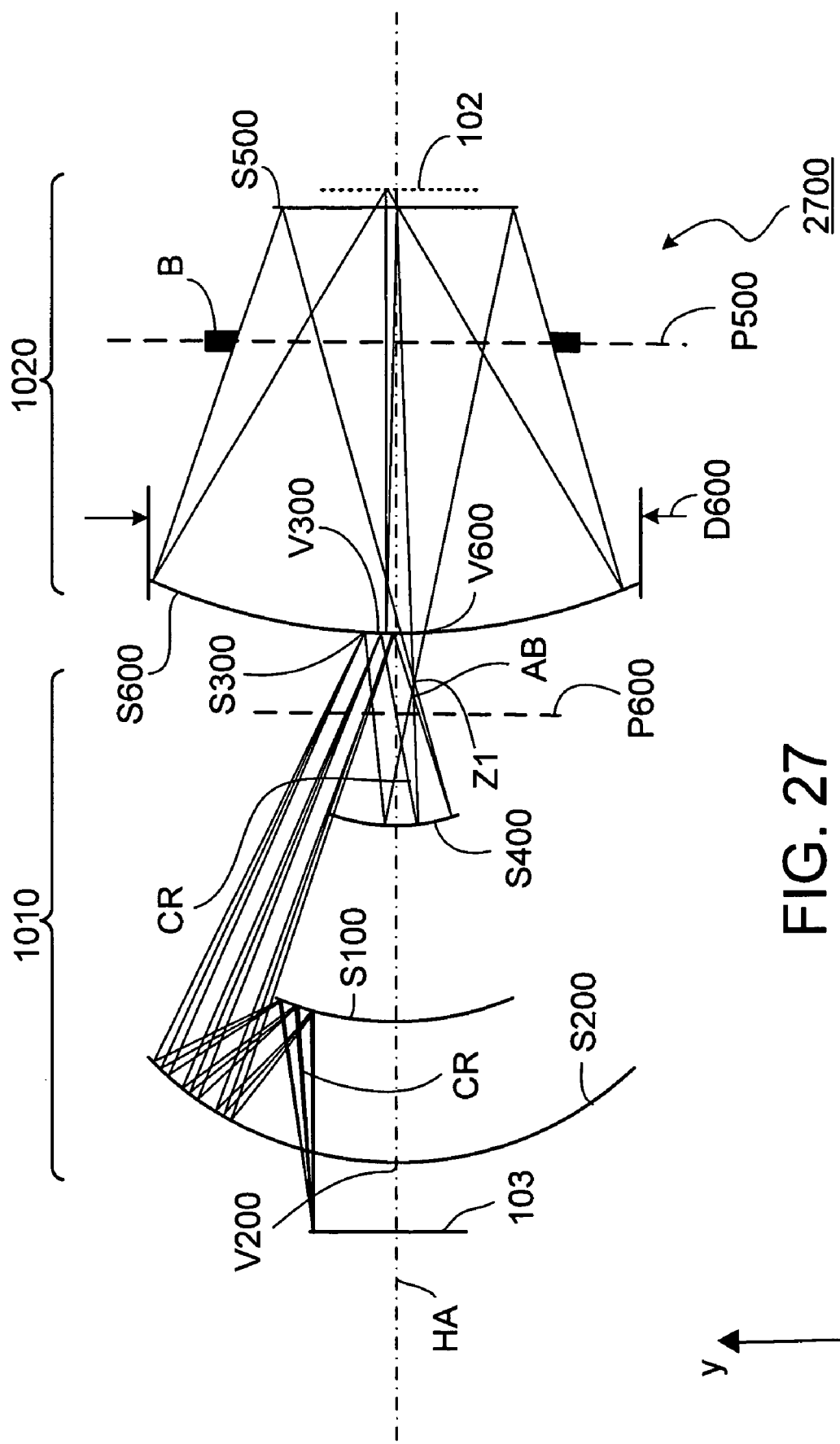
FIG. 27 is a cross-sectional view of another embodiment of a projection objective shown in meridional section.

Referring to FIG. 27, an embodiment of a projection objective 2700 includes six mirrors S100, S200, S300, S400, S500, and S600, and has an image-side numerical aperture of 0.5 at an operating wavelength of 13.5 nm. Mirrors S100, S200, S300, S400, S500, and S600 are all aspherical mirrors. Projection objective 2700 images radiation from object plane 103 to image plane 102 with a demagnification ratio of 8× and a resolution of about 17 nm. The optical axis in relation to which the projection objective is rotationally symmetric is identified as HA, and the overall length of the system from object plane 103 to the image plane 102, the lengthwise dimension, L, is 1,500 mm.

Projection objective 2700 has a ring-segment field. The image-side field width, $d_x$, is 13 mm. The image-side field radius, $d_r$, is 12.5 mm. The image-side field length, $d_y$, is 1 mm. Image-side $W_{rms}$ is 0.02λ. Image-side field curvature is 7 nm.

The order and curvature of mirrors according to the path of radiation from object plane 103 to image plane 102 is as follows: mirror S100 is a convex mirror; mirror S200 is a concave mirror; mirror S300 is a convex mirror; mirror S400 is a concave mirror; mirror S500 is a convex mirror; and mirror S600 is a concave mirror.

Mirrors S500 and S600 include openings. Mirrors S100, S200, S300, and S400 do not include openings. The resulting obscuration radius that provides a field-independent obscuration is 22% of the aperture radius.

The image-side free working distance is 30 mm. The object-side free working distance is 100 mm.

The maximum angle of incidence on mirrors S100, S200, S300, S400, S500, and S600 of a chief ray of a central field point is 27.4°. The maximum angle of incidence of any ray on mirrors S100, S200, S300, S400, S500, and S600 is 34.9°. The maximum range of incident angles on any of mirrors S100, S200, S300, S400, S500, and S600 is 15.0°.

The size of the largest mirror in meridional section is 664 mm. The size of the largest mirror in the x-direction is 677 mm.

The mirrors are arranged so that projection objective 2700 contains two partial objectives: a first partial objective 1010 and a second partial objective 1020. Accordingly, projection objective 2700 produces two pupil planes and one intermediate image. At least one of the pupil planes is accessible for positioning an aperture stop. At least one of the pupil planes is accessible for positioning an obscuration stop. For example, in the embodiment shown, an obscuration stop AB is positioned between mirrors S300 and S400 in plane P600.

First partial objective 1010 has a total of four mirrors: mirror S100, mirror S200, mirror S300, and mirror S400. First partial objective 1010 forms a first intermediate image Z1 in a position between mirrors S400 and S500. Second partial objective 1020 has a total of two mirrors: mirror S500, and mirror S600. Second partial objective 1020 forms an image at or near the position of image plane 102.

An aperture stop B is positioned between mirrors S500 and S600 in plane P500.

The embodiments shown in FIGS. 26 and 27 differ from one another in their ray tracing patterns in the area of mirrors S100 and S200. In the embodiment of FIG. 26, the third mirror S300 is positioned so that the ray paths intersect in the area between mirrors S100 and S200. In the embodiment of FIG. 27, the rays do not cross their own paths.

The embodiments of FIGS. 26 and 27 can have the following advantageous properties. In order to obtain an obscuration that is as small as possible, the distance from intermediate image Z1 to the geometrically nearest mirror of first partial objective 1010 is less than about 15% of the lengthwise dimension of the objective. The geometrically nearest mirror in these embodiments is mirror S300. As in preceding embodiments, the distance from intermediate image Z1 to mirror S300 is determined by the distance from vertex V300 of mirror S300 to intermediate image Z1 along axis HA.

Alternatively, or in addition to, the above property, the goal of a small obscuration may be further realized by maintaining the distance from intermediate image Z1 to the geometrically nearest mirror of second partial objective 1020 as less than about 8% of the lengthwise dimension of the objective. In these embodiments, the geometrically nearest mirror of second partial objective 1020 is mirror S600. As in preceding embodiments, the distance from intermediate image Z1 to mirror S600 is determined by the distance from vertex V600 of mirror S600 to intermediate image Z1 along axis HA.

As a further advantageous measure, the distance between vertex V200 of mirror S200 and vertex V300 of mirror S300 may be larger than about 18% of the lengthwise dimension of the objective.

As yet another advantageous measure with regard to the embodiments of FIGS. 26 and 27, the ratio of the diameter D600 of mirror S600 (i.e., the mirror having the largest diameter in the projection objective) to the lengthwise dimension of the system is less than 0.9 times as large as the image-side numerical aperture.

Data for projection objective 2700 is presented in Table 19A and Table 19B below. Table 19A presents optical data, while Table 19B presents aspherical constants for each of the mirror surfaces. For the purposes of Table 19A and Table 19B, the mirror designations correlate as follows: mirror 1 corresponds to mirror S100; mirror 2 corresponds to mirror S200; mirror 3 corresponds to mirror S300; mirror 4 corresponds to mirror S400; mirror 5 corresponds to mirror S500; mirror 6 corresponds to mirror S600; STOP corresponds to aperture stop B; and Image corresponds to image plane 102.

TABLE 19A

| Surface | Radius | Thickness | Mode |
|---|---|---|---|
| Object | INFINITY | 294.339 | |
| Mirror 1 | 343.317 | −194.339 | REFL |
| Mirror 2 | 485.792 | 754.54 | REFL |
| Mirror 3 | 270.258 | −275.539 | REFL |
| Mirror 4 | 290.188 | 890.999 | REFL |
| Mirror 5 | 9383.676 | −194.679 | REFL |
| STOP | INFINITY | −420.681 | |

TABLE 19A-continued

| Surface | Radius | Thickness | Mode |
|---|---|---|---|
| Mirror 6 | 841.549 | 645.36 | REFL |
| Image | INFINITY | 0 | |

TABLE 19B

| Surface | K | A | B | C |
|---|---|---|---|---|
| Mirror 1 | 0.00000E+00 | −4.96680E−09 | 8.07536E−14 | −5.21657E−18 |
| Mirror 2 | 0.00000E+00 | −2.08389E−10 | 9.04247E−16 | −1.82476E−20 |
| Mirror 3 | 0.00000E+00 | −8.58156E−10 | −1.09899E−14 | 1.23347E−16 |
| Mirror 4 | 0.00000E+00 | −3.90441E−10 | −7.66964E−15 | 8.88342E−20 |
| Mirror 5 | 0.00000E+00 | 9.99387E−10 | 2.33248E−15 | 8.58665E−21 |
| Mirror 6 | 0.00000E+00 | 4.04329E−11 | 7.49328E−17 | 1.16246E−22 |

| Surface | D | E | F | G |
|---|---|---|---|---|
| Mirror 1 | 1.71166E−22 | −3.14607E−27 | 2.43204E−32 | 0.00000E+00 |
| Mirror 2 | 9.83920E−26 | −3.32658E−31 | 0.00000E+00 | 0.00000E+00 |
| Mirror 3 | −9.03339E−20 | 3.25799E−23 | −4.65457E−27 | 0.00000E+00 |
| Mirror 4 | −3.20552E−23 | 3.31626E−27 | −1.39847E−31 | 0.00000E+00 |
| Mirror 5 | 3.37347E−26 | 3.00073E−31 | 3.53144E−37 | 0.00000E+00 |
| Mirror 6 | 1.88402E−28 | 1.78827E−34 | 9.03324E−40 | 0.00000E+00 |

Figure 28:
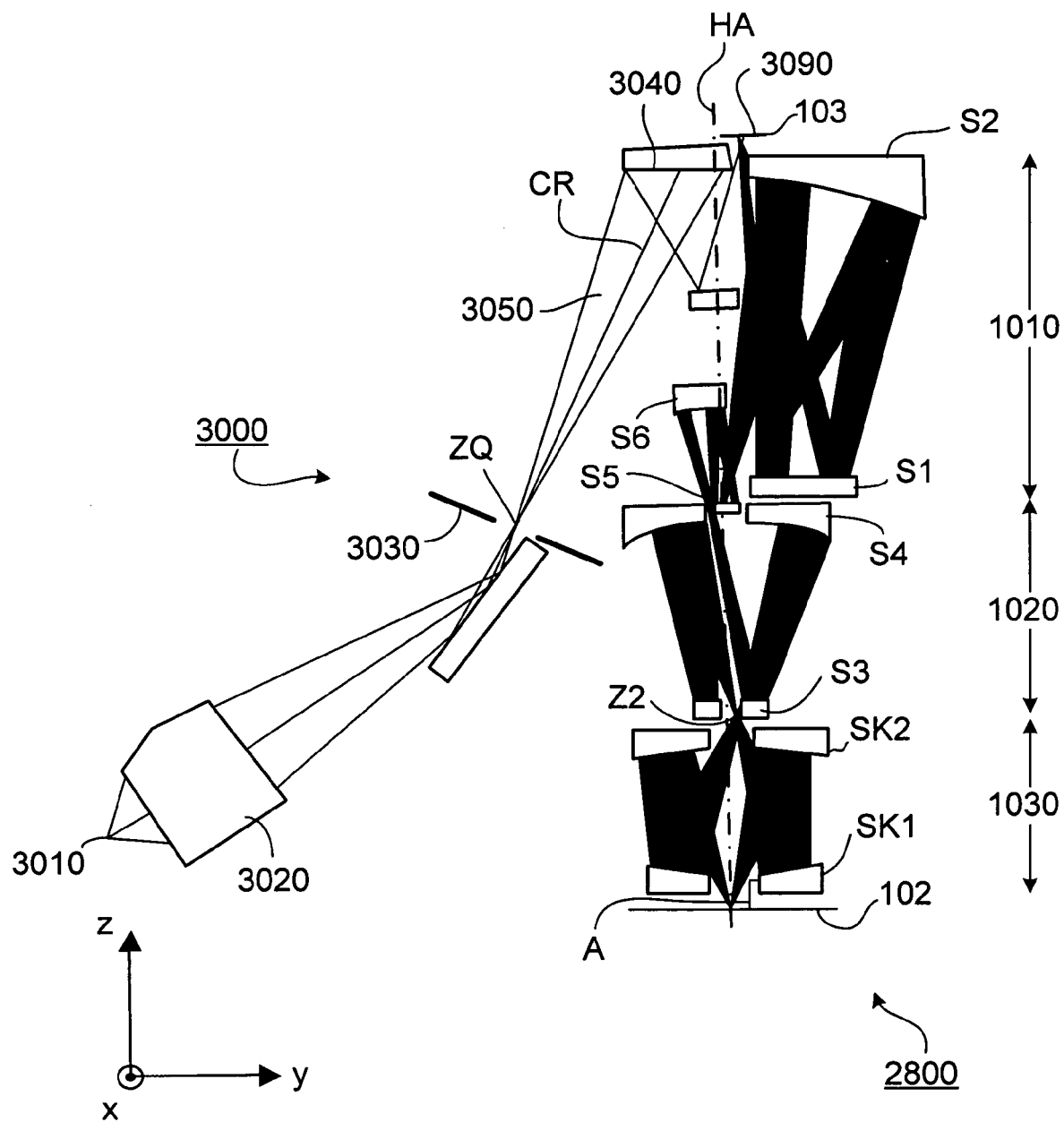
FIG. 28 is a cross-sectional view of a further embodiment of a projection objective and an illumination system, shown in meridional section.

FIG. 28 shows an illumination system 3000 in conjunction with an embodiment of a projection objective 2800. Illumination system 3000 includes a light source 3010 and a grating incidence collector. A spectral filter element 3020 can be configured as a diffractive spectral filter. In combination with stop 3030 in proximity to an intermediate image ZQ of the light source, this arrangement permits the exclusion of undesirable radiation, for example, radiation with wavelengths significantly larger than the desired wavelength, from entering the part of the illumination system that lies beyond stop 3030. Arranged in the illumination system along the light path after stop 3030 is a raster-type mirror with raster elements or field facets 3040. The field facets separate light ray bundle 3050 emerging from spectral filter 3020 into a plurality of individual light ray bundles, each with an associated secondary light source. The locations of the secondary light sources are in the vicinity of individual raster elements of a second raster-type mirror. The raster elements of the second raster-type mirror are referred to as pupil facets.

Doubly-faceted illumination systems have been disclosed, for example, in U.S. Pat. No. 6,195,201, where the field raster elements or field facets have the same shape as the field that is to be illuminated in the object plane, so that the field facets determine the shape of the field in the object plane. If the field in the object plane has the shape of, for example, a segment of a circle, then the field facets are likewise segment-shaped. Alternatively, in some embodiments, the field raster elements can have a rectangular shape, see for example U.S. Pat. No. 6,198,793, where shaping of the field occurs with the help of a field-shaping mirror.

Object plane 3090 into which the field is projected coincides with object plane 103 of the projection objective. The projection objective projects an image of the field in object plane 103 into a field in image plane 102. In image plane 102, a substrate with a light-sensitive coating can be positioned, such as a wafer, for example.

The system shown is distinguished by the entry of principal rays on divergent paths into the entry pupil of the projection objective that coincides with the exit pupil of illumination system 3000. In the light path from light source 3010 to object plane 3090, the entry pupil of the projection objective is positioned in front of object plane 3090. Projection systems having a negative entry pupil are disclosed, for example, in PCT Patent Application No. WO 2004/010224.

Projection objective 2800 includes eight mirrors S1-S6, SK1, and SK2, and has an image-side numerical aperture of 0.5 at an operating wavelength of 13.5 nm. Mirrors S1-S6, SK1, and SK2 are all aspherical mirrors. Projection objective 2800 images radiation from object plane 103 to image plane 102 with a demagnification ratio of 4× and a resolution of about 17 nm. The optical axis in relation to which the projection objective is rotationally symmetric is identified as HA, and the overall length of the system from object plane 103 to the image plane 102, the lengthwise dimension, L, is 1,711 mm.

Projection objective 2800 has a ring-segment field. The image-side field width, $d_x$, is 13 mm. The image-side field radius, $d_r$, is 13.0 mm. The image-side field length, $d_y$, is 1 mm. Image-side $W_{rms}$ is 0.044λ. Image-side field curvature is 12 nm.

The order and curvature of mirrors according to the path of radiation from object plane 103 to image plane 102 is as follows: mirror S1 is a convex mirror; mirror S2 is a concave mirror; mirror S5 is a convex mirror; mirror S6 is a concave mirror; mirror S3 is a convex mirror; mirror S4 is a concave mirror; mirror SK1 is a concave mirror; and mirror SK2 is a concave mirror.

Mirrors S3, S4, SK1, and SK2 include openings. Mirrors S1, S2, S5, and S6 do not include openings. The resulting obscuration radius that provides a field-independent obscuration is 36% of the aperture radius.

The image-side free working distance is 69 mm. The object-side free working distance is 100 mm.

The maximum angle of incidence on mirrors S1-S6, SK1, and SK2 of a chief ray of a central field point is 19.4°. The maximum angle of incidence of any ray on mirrors S1-S6, SK1, and SK2 is 21.8°. The maximum range of incident angles on any of mirrors S1-S6, SK1, and SK2 is 15.0°.

The size of the largest mirror in meridional section is 385 mm. The size of the largest mirror in the x-direction is 616 mm.

The mirrors in projection objective 2800 are arranged so that projection objective 2800 contains three partial objectives: a first partial objective 1010, a second partial objective 1020, and a third partial objective 1030. Accordingly, projection objective 2800 produces three pupil planes and two intermediate images. At least one of the pupil planes is accessible for positioning an aperture stop. At least one of the pupil planes is accessible for positioning an obscuration stop. For example, in the embodiment shown, an obscuration stop can be positioned between mirrors S1 and S2.

First partial objective 1010 has a total of four mirrors: mirror S1, mirror S2, mirror S5, and mirror S6. First partial objective 1010 forms a first intermediate image Z1 in a position between mirrors S6 and S3. Second partial objective 1020 has a total of two mirrors: mirror S3, and mirror S4. Second partial objective 1020 forms a second intermediate image Z2 at or near the position of mirror S3. Third partial objective 1030 has a total of two mirrors: mirror SK1 and mirror SK2. Third partial objective 1030 forms an image at or near the position of image plane 102.

Figure 29:
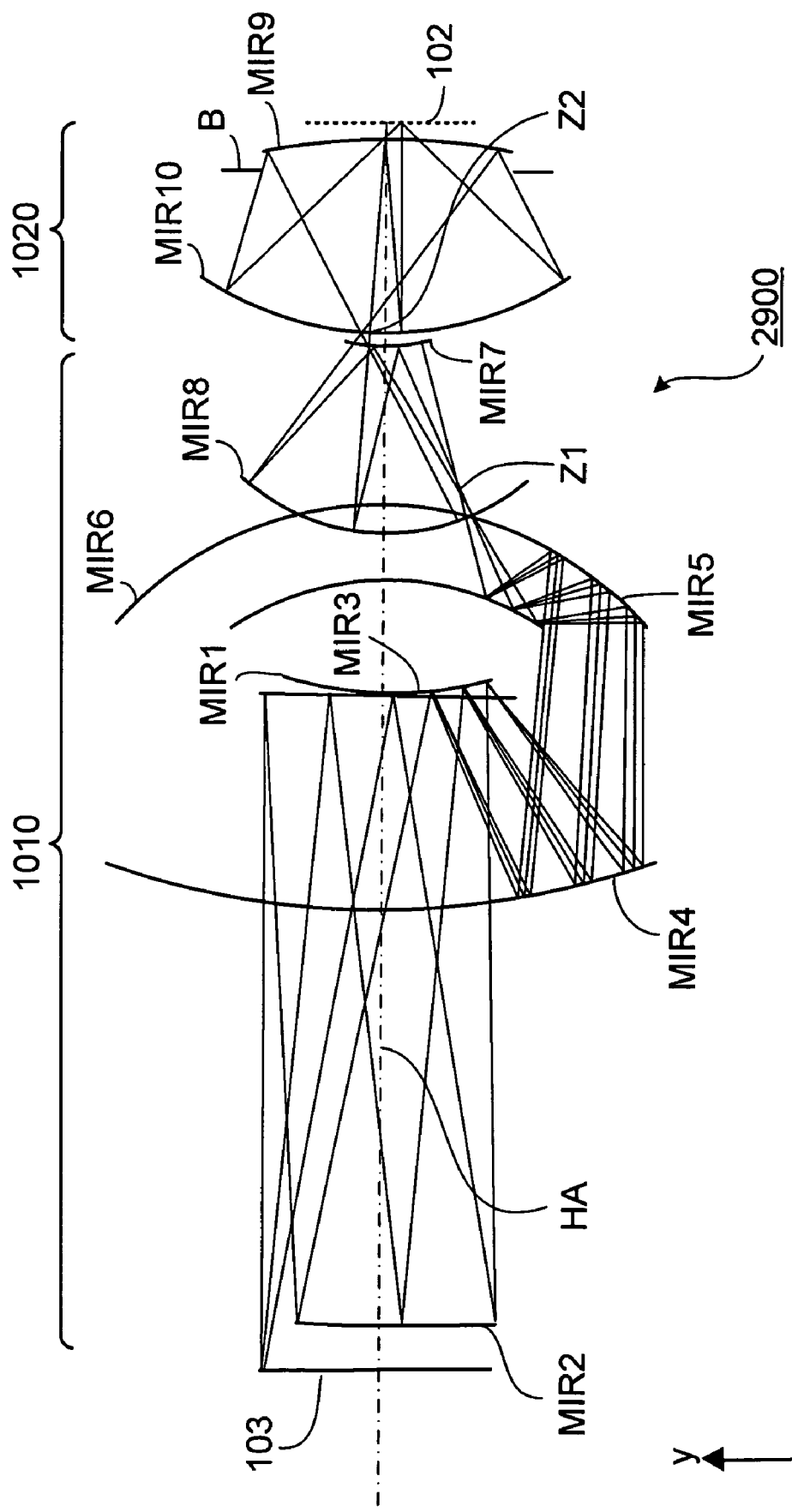
FIG. 29 is a cross-sectional view of another embodiment of a projection objective shown in meridional section.

Referring to FIG. 29, an embodiment of a projection objective 2900 includes ten mirrors MIR1-MIR10, and has an image-side numerical aperture of 0.72 at an operating wavelength of 100 nm. Mirrors MIR1-MIR10 are all aspherical mirrors. Projection objective 2900 images radiation from object plane 103 to image plane 102 with a demagnification ratio of 8× and a resolution of about 49 nm. The optical axis in relation to which the projection objective is rotationally symmetric is identified as HA, and the overall length of the system from object plane 103 to the image plane 102, the lengthwise dimension, L, is 1,374 mm.

Projection objective 2900 has a ring-segment field. The image-side field width, $d_x$, is 13 mm. The image-side field radius, $d_r$, is 15.0 mm. The image-side field length, $d_y$, is 1 mm. Image-side $W_{rms}$ is 0.0036λ. Image-side field curvature is 2 nm.

The order and curvature of mirrors according to the path of radiation from object plane 103 to image plane 102 is as follows: mirror MIR1 is a concave mirror; mirror MIR2 is a concave mirror; mirror MIR3 is a convex mirror; mirror MIR4 is a concave mirror; mirror MIR5 is a concave mirror; mirror MIR6 is a convex mirror; mirror MIR7 is a convex mirror; mirror MIR8 is a concave mirror; mirror MIR9 is a concave mirror; and mirror MIR10 is a concave mirror.

Mirrors MIR7, MIR8, MIR9 and MIR10 include openings. Mirrors MIR1, MIR2, MIR3, MIR4, MIR5 and MIR6 do not include openings. The resulting obscuration radius that provides a field-independent obscuration is 32% of the aperture radius.

The image-side free working distance is 20 mm. The object-side free working distance is 50 mm.

The maximum angle of incidence on mirrors MIR1-MIR10 of a chief ray of a central field point is 48.0°. The maximum angle of incidence of any ray on mirrors MIR1-MIR10 is 58.9°. The maximum range of incident angles on any of mirrors MIR1-MIR10 is 35.6°.

The size of the largest mirror in meridional section is 366 mm. The size of the largest mirror in the x-direction is 378 mm.

The mirrors are arranged so that projection objective 2900 contains two partial objectives: a first partial objective 1010 and a second partial objective 1020. Accordingly, projection objective 2900 produces three pupil planes and two intermediate images. At least one of the pupil planes is accessible for positioning an aperture stop. At least one of the pupil planes is accessible for positioning an obscuration stop. For example, an obscuration stop can be positioned on between mirrors MIR1 and MIR2.

First partial objective 1010 has a total of eight mirrors: mirrors MIR1-MIR8. First partial objective 1010 forms a first intermediate image Z1 in a position between mirrors MIR6 and MIR7. First partial objective 1010 also forms a second intermediate image Z2 in a position at or near the position of mirror MIR10. Second partial objective 1020 has a total of two mirrors: mirrors MIR9 and MIR10. Second partial objective 1020 forms an image at or near the position of image plane 102.

An aperture stop B is positioned between mirrors MIR9 and MIR10.

Data for projection objective 2900 is presented in Table 20A and Table 20B below. Table 20A presents optical data, while Table 20B presents aspherical constants for each of the mirror surfaces. For the purposes of Table 20A and Table 20B, the mirror designations correlate as follows: mirror 1 corresponds to mirror MIR1; mirror 2 corresponds to mirror MIR2; mirror 3 corresponds to mirror MIR3; mirror 4 corresponds to mirror MIR4; mirror 5 corresponds to mirror MIR5; mirror 6 corresponds to mirror MIR6; mirror 7 corresponds to mirror MIR7; mirror 8 corresponds to mirror MIR8; mirror 9 corresponds to mirror MIR9; mirror 10 corresponds to mirror MIR10; STOP corresponds to aperture stop B; and Image corresponds to image plane 102.

TABLE 20A

| Surface | Radius | Thickness | Mode |
|---|---|---|---|
| Object | INFINITY | 750.158 | |
| Mirror 1 | −3645.207 | −700.158 | REFL |
| Mirror 2 | 1388.693 | 700.158 | REFL |
| Mirror 3 | 421.919 | −239.680 | REFL |
| Mirror 4 | 928.703 | 450.888 | REFL |
| Mirror 5 | −316.927 | −82.283 | REFL |
| Mirror 6 | −232.317 | 253.878 | REFL |
| Mirror 7 | 138.033 | −203.878 | REFL |
| Mirror 8 | 231.384 | 424.892 | REFL |
| Mirror 9 | −631.742 | −28.814 | REFL |
| STOP | INFINITY | −179.600 | |
| Mirror 10 | 359.774 | 228.408 | REFL |
| Image | INFINITY | 0.000 | |

TABLE 20B

| Surface | K | A | B | C |
|---|---|---|---|---|
| Mirror 1 | −6.06373E+01 | 0.00000E+00 | 1.35009E−14 | −2.59993E−19 |
| Mirror 2 | 2.31409E+01 | 0.00000E+00 | −1.13367E−14 | −1.77547E−19 |
| Mirror 3 | 7.66282E+00 | 0.00000E+00 | −1.35197E−13 | −3.76649E−18 |
| Mirror 4 | 3.19172E+00 | 0.00000E+00 | −3.50329E−15 | 1.79751E−20 |
| Mirror 5 | −8.19082E−01 | 0.00000E+00 | −3.63599E−15 | 1.44815E−20 |
| Mirror 6 | −2.80654E+00 | 0.00000E+00 | −1.90563E−13 | 7.53932E−18 |
| Mirror 7 | −4.36872E+00 | 0.00000E+00 | −5.57748E−11 | 9.38288E−15 |
| Mirror 8 | −7.83804E−02 | 0.00000E+00 | −3.99246E−15 | 1.05336E−20 |

TABLE 20B-continued

| | | | | |
|---|---|---|---|---|
| Mirror 9 | −2.02616E+01 | 0.00000E+00 | 3.77305E−13 | −5.08163E−18 |
| Mirror 10 | 6.67169E−01 | 0.00000E+00 | 2.85323E−16 | −4.15075E−20 |

| Surface | D | E | F | G |
|---|---|---|---|---|
| Mirror 1 | 4.09829E−24 | −2.02663E−29 | −1.37613E−33 | 0.00000E+00 |
| Mirror 2 | 6.90094E−24 | −1.55471E−28 | 0.00000E+00 | 0.00000E+00 |
| Mirror 3 | 1.52791E−22 | −1.47257E−26 | 0.00000E+00 | 0.00000E+00 |
| Mirror 4 | 2.37312E−26 | −3.74208E−31 | 0.00000E+00 | 0.00000E+00 |
| Mirror 5 | 7.93942E−26 | 2.39496E−30 | 0.00000E+00 | 0.00000E+00 |
| Mirror 6 | −1.22667E−22 | 7.73753E−28 | 0.00000E+00 | 0.00000E+00 |
| Mirror 7 | −4.67133E−20 | 1.96718E−27 | 1.85277E−26 | 0.00000E+00 |
| Mirror 8 | −2.12451E−26 | −3.54563E−29 | 3.35753E−34 | 0.00000E+00 |
| Mirror 9 | 2.24127E−22 | −4.81678E−27 | 8.20784E−32 | 0.00000E+00 |
| Mirror 10 | 6.10237E−25 | −8.56806E−30 | 5.42702E−35 | 0.00000E+00 |

Figure 30:
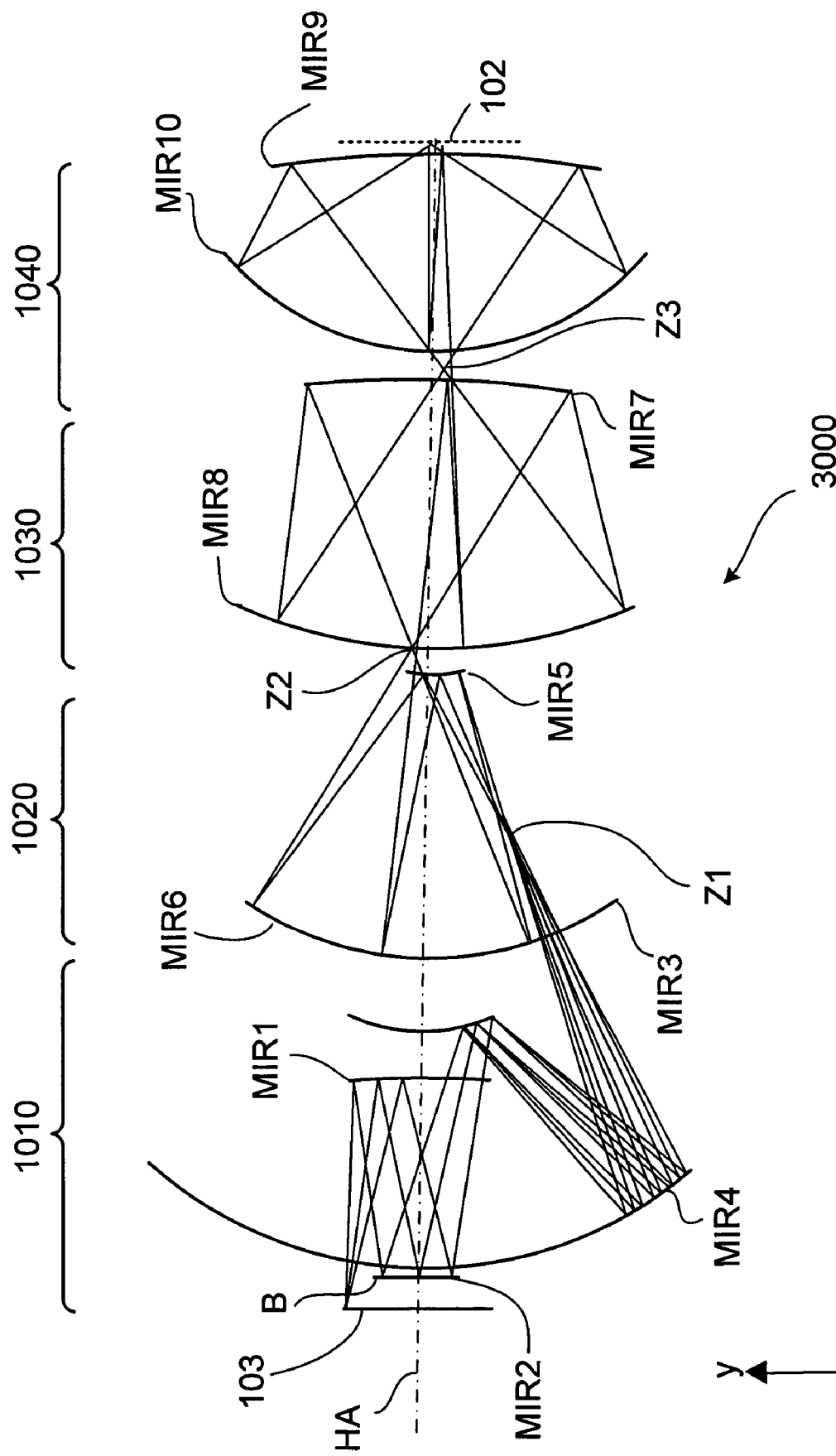
FIG. 30 is a cross-sectional view of a further embodiment of a projection objective shown in meridional section.

Referring to FIG. 30, an embodiment of a projection objective 3000 includes ten mirrors MIR1-MIR10, and has an image-side numerical aperture of 0.85 at an operating wavelength of 100 nm. Mirrors MIR1-MIR10 are all aspherical mirrors. Projection objective 3000 images radiation from object plane 103 to image plane 102 with a demagnification ratio of 8× and a resolution of about 41 nm. The optical axis in relation to which the projection objective is rotationally symmetric is identified as HA, and the overall length of the system from object plane 103 to the image plane 102, the lengthwise dimension, L, is 1,942 mm.

Projection objective 3000 has a ring-segment field. The image-side field width, $d_x$, is 13 mm. The image-side field radius, $d_r$, is 14.5 mm. The image-side field length, $d_y$, is 1 mm. Image-side $W_{rms}$ is 0.013λ. Image-side field curvature is 6 nm.

The order and curvature of mirrors according to the path of radiation from object plane 103 to image plane 102 is as follows: mirror MIR1 is a concave mirror; mirror MIR2 is a concave mirror; mirror MIR3 is a convex mirror; mirror MIR4 is a concave mirror; mirror MIR5 is a convex mirror; mirror MIR6 is a concave mirror; mirror MIR7 is a concave mirror; mirror MIR8 is a concave mirror; mirror MIR9 is a concave mirror; and mirror MIR10 is a concave mirror.

Mirrors MIR7, MIR8, MIR9 and MIR10 include openings. Mirrors MIR1, MIR2, MIR3, MIR4, MIR5 and MIR6 do not include openings. The resulting obscuration radius that provides a field-independent obscuration is 28% of the aperture radius.

The image-side free working distance is 15 mm. The object-side free working distance is 50 mm.

The maximum angle of incidence on mirrors MIR1-MIR10 of a chief ray of a central field point is 30.0°. The maximum angle of incidence of any ray on mirrors MIR1-MIR10 is 32.4°. The maximum range of incident angles on any of mirrors MIR1-MIR10 is 31.3°.

The size of the largest mirror in meridional section is 650 mm. The size of the largest mirror in the x-direction is 704 mm.

The mirrors are arranged so that projection objective 3000 contains four partial objectives: a first partial objective 1010, a second partial objective 1020, a third partial objective 1030, and a fourth partial objective 1040. Accordingly, projection objective 3000 produces four pupil planes and three intermediate images. At least one of the pupil planes is accessible for positioning an aperture stop. At least one of the pupil planes is accessible for positioning an obscuration stop. For example, an obscuration stop can be positioned on mirror MIR2.

First partial objective 1010 has a total of four mirrors: mirrors MIR1-MIR4. First partial objective 1010 forms a first intermediate image Z1 in a position between mirrors MIR4 and MIR5. Second partial objective 1020 has a total of two mirrors: mirrors MIR5 and MIR 6. Second partial objective 1020 forms a second intermediate image Z2 in a position at or near the position of mirror MIR8. Third partial objective 1030 has a total of two mirrors: mirrors MIR7 and MIR8. Third partial objective 1030 forms a third intermediate image Z3 in a position at or near the position of mirror MIR7. Fourth partial objective 1040 has a total of two mirrors: mirrors MIR9 and MIR10. Fourth partial objective 1040 forms an image at or near the position of image plane 102.

An aperture stop B is positioned on or close to mirror MIR2. Alternatively, stop B can also be positioned on mirror MIR7, or between mirrors MIR9 and MIR10.

Data for projection objective 3000 is presented in Table 21A and Table 21B below. Table 21A presents optical data, while Table 21B presents aspherical constants for each of the mirror surfaces. For the purposes of Table 21A and Table 21B, the mirror designations correlate as follows: mirror 1 corresponds to mirror MIR1; mirror 2 corresponds to mirror MIR2; mirror 3 corresponds to mirror MIR3; mirror 4 corresponds to mirror MIR4; mirror 5 corresponds to mirror MIR5; mirror 6 corresponds to mirror MIR6; mirror 7 corresponds to mirror MIR7; mirror 8 corresponds to mirror MIR8; mirror 9 corresponds to mirror MIR9; mirror 10 corresponds to mirror MIR10; STOP corresponds to aperture stop B; and Image corresponds to image plane 102.

TABLE 21A

| Surface | Radius | Thickness | Mode |
|---|---|---|---|
| Object | INFINITY | 381.457 | |
| Mirror 1 | −1379.982 | −331.458 | REFL |
| STOP | INFINITY | 0.000 | |
| Mirror 2 | 862.420 | 409.088 | REFL |
| Mirror 3 | 294.135 | −393.417 | REFL |
| Mirror 4 | 674.870 | 1003.719 | REFL |
| Mirror 5 | 159.301 | −486.152 | REFL |
| Mirror 6 | 519.366 | 977.030 | REFL |
| Mirror 7 | −1878.719 | −448.038 | REFL |
| Mirror 8 | 805.537 | 814.366 | REFL |
| Mirror 9 | −1449.005 | −316.328 | REFL |
| Mirror 10 | 452.987 | 331.329 | REFL |
| Image | INFINITY | 0.000 | |

TABLE 21B

| Surface | K | A | B | C |
|---|---|---|---|---|
| Mirror 1 | 0.00000E+00 | 2.55145E−09 | −6.09305E−14 | 4.98564E−19 |
| Mirror 2 | 0.00000E+00 | −2.87984E−10 | 1.89704E−13 | −1.31315E−16 |
| Mirror 3 | 0.00000E+00 | −9.84186E−09 | 5.83377E−14 | 1.68182E−18 |
| Mirror 4 | 0.00000E+00 | −8.72959E−11 | 2.57957E−16 | −1.74722E−21 |
| Mirror 5 | 0.00000E+00 | 2.73117E−08 | 1.12013E−11 | 9.25229E−16 |
| Mirror 6 | 0.00000E+00 | −2.84379E−10 | −4.48476E−16 | −1.28457E−21 |
| Mirror 7 | 0.00000E+00 | −5.31063E−10 | 2.49955E−16 | 9.28030E−21 |
| Mirror 8 | 0.00000E+00 | 2.32104E−10 | 8.53499E−16 | 2.27404E−21 |
| Mirror 9 | 0.00000E+00 | 8.99663E−10 | 3.52918E−15 | −4.85346E−21 |
| Mirror 10 | 7.29438E−02 | −1.05224E−09 | −1.45361E−15 | 4.37512E−21 |

| Surface | D | E | F | G |
|---|---|---|---|---|
| Mirror 1 | −2.04929E−23 | 5.33894E−28 | 0.00000E+00 | 0.00000E+00 |
| Mirror 2 | 3.83759E−20 | −4.05131E−24 | 0.00000E+00 | 0.00000E+00 |
| Mirror 3 | −3.47385E−23 | 1.19978E−28 | 0.00000E+00 | 0.00000E+00 |
| Mirror 4 | 3.35836E−27 | −2.85580E−33 | 0.00000E+00 | 0.00000E+00 |
| Mirror 5 | 3.49953E−19 | 0.00000E+00 | 0.00000E+00 | 0.00000E+00 |
| Mirror 6 | −2.99713E−27 | −4.01016E−32 | 0.00000E+00 | 0.00000E+00 |
| Mirror 7 | −5.91706E−25 | −4.04630E−31 | 0.00000E+00 | 0.00000E+00 |
| Mirror 8 | −3.97444E−27 | 1.59717E−32 | 0.00000E+00 | 0.00000E+00 |
| Mirror 9 | 4.87617E−25 | −4.02032E−30 | 2.37898E−35 | 0.00000E+00 |
| Mirror 10 | −1.37373E−25 | 1.02096E−30 | −4.77532E−36 | 7.03192E−42 |

Figure 31:
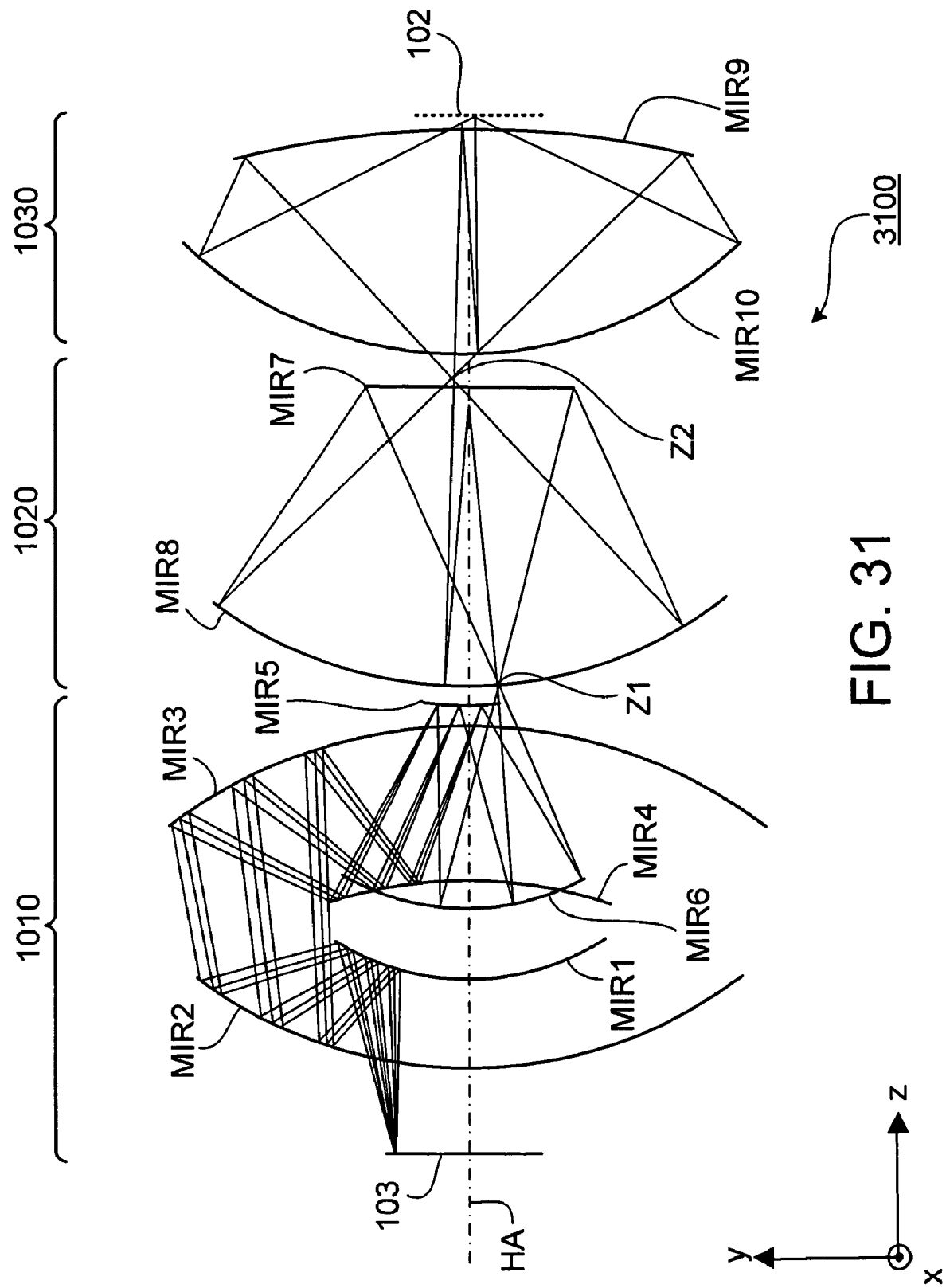
FIG. 31 is a cross-sectional view of another embodiment of a projection objective shown in meridional section.

Referring to FIG. 31, an embodiment of a projection objective 3100 includes ten mirrors MIR1-MIR10, and has an image-side numerical aperture of 0.9 at an operating wavelength of 100 nm. Mirrors MIR1-MIR10 are all aspherical mirrors. Projection objective 3100 images radiation from object plane 103 to image plane 102 with a demagnification ratio of 8× and a resolution of about 39 nm. The optical axis in relation to which the projection objective is rotationally symmetric is identified as HA, and the overall length of the system from object plane 103 to the image plane 102, the lengthwise dimension, L, is 1,510 mm.

Projection objective 3100 has a ring-segment field. The image-side field width, $d_x$, is 13 mm. The image-side field radius, $d_r$, is 12.5 mm. The image-side field length, $d_y$, is 1 mm. Image-side $W_{rms}$ is 0.02λ. Image-side field curvature is 5 nm.

The order and curvature of mirrors according to the path of radiation from object plane 103 to image plane 102 is as follows: mirror MIR1 is a convex mirror; mirror MIR2 is a concave mirror; mirror MIR3 is a concave mirror; mirror MIR4 is a convex mirror; mirror MIR5 is a convex mirror; mirror MIR6 is a concave mirror; mirror MIR7 is a convex mirror; mirror MIR8 is a concave mirror; mirror MIR9 is a concave mirror; and mirror MIR10 is a concave mirror.

Mirrors MIR7, MIR8, MIR9 and MIR10 include openings. Mirrors MIR1, MIR2, MIR3, MIR4, MIR5 and MIR6 do not include openings. The resulting obscuration radius that provides a field-independent obscuration is 24% of the aperture radius.

The image-side free working distance is 20 mm. The object-side free working distance is 120 mm.

The maximum angle of incidence on mirrors MIR1-MIR10 of a chief ray of a central field point is 36.1°. The maximum angle of incidence of any ray on mirrors MIR1-MIR10 is 44.4°. The maximum range of incident angles on any of mirrors MIR1-MIR10 is 24.2°.

The size of the largest mirror in meridional section is 767 mm. The size of the largest mirror in the x-direction is 780 mm.

The mirrors are arranged so that projection objective 3100 contains three partial objectives: a first partial objective 1010, a second partial objective 1020, and a third partial objective 1030. Accordingly, projection objective 3100 produces three pupil planes and two intermediate images. At least one of the pupil planes is accessible for positioning an aperture stop.

First partial objective 1010 has a total of six mirrors: mirrors MIR1-MIR6. First partial objective 1010 forms a first intermediate image Z1 in a position at or near mirror MIR8. Second partial objective 1020 has a total of two mirrors: mirrors MIR7 and MIR 8. Second partial objective 1020 forms a second intermediate image Z2 in a position at or near the position of mirror MIR7. Third partial objective 1030 has a total of two mirrors: mirrors MIR9 and MIR10. Third partial objective 1030 forms an image at or near the position of image plane 102.

Data for projection objective 3100 is presented in Table 22A and Table 22B below. Table 22A presents optical data, while Table 22B presents aspherical constants for each of the mirror surfaces. For the purposes of Table 22A and Table 22B, the mirror designations correlate as follows: mirror 1 corresponds to mirror MIR1; mirror 2 corresponds to mirror MIR2; mirror 3 corresponds to mirror MIR3; mirror 4 corresponds to mirror MIR4; mirror 5 corresponds to mirror MIR5; mirror 6 corresponds to mirror MIR6; mirror 7 corresponds to mirror MIR7; mirror 8 corresponds to mirror MIR8; mirror 9 corresponds to mirror MIR9; mirror 10 corresponds to mirror MIR10; STOP corresponds to an aperture stop; and Image corresponds to image plane 102.

TABLE 22A

| Surface | Radius | Thickness | Mode |
|---|---|---|---|
| Object | INFINITY | 245.168 | |
| Mirror 1 | 249.951 | −124.703 | REFL |
| Mirror 2 | 523.716 | 501.550 | REFL |
| Mirror 3 | −667.566 | −226.847 | REFL |
| Mirror 4 | −552.364 | 256.530 | REFL |
| Mirror 5 | 206.660 | −297.653 | REFL |
| Mirror 6 | 368.135 | 762.143 | REFL |
| STOP | INFINITY | 0.000 | |
| Mirror 7 | 4031.704 | −435.563 | REFL |
| Mirror 8 | 577.321 | 809.677 | REFL |
| Mirror 9 | −988.316 | −324.113 | REFL |

TABLE 22A-continued

| Surface | Radius | Thickness | Mode |
|---|---|---|---|
| Mirror 10 | 566.943 | 344.114 | REFL |
| Image | INFINITY | 0.000 | |

TABLE 22B

| Surface | K | A | B | C |
|---|---|---|---|---|
| Mirror 1 | 0.00000E+00 | −3.11456E−08 | 9.16528E−13 | −3.54546E−17 |
| Mirror 2 | −5.59339E−01 | −1.88162E−09 | 8.43476E−15 | −2.59617E−20 |
| Mirror 3 | 6.87474E−01 | 2.77052E−10 | 1.40958E−15 | 4.28911E−21 |
| Mirror 4 | −1.59289E+01 | −1.06455E−08 | 2.59948E−13 | −4.36668E−18 |
| Mirror 5 | 5.12429E+00 | −8.25258E−08 | −9.24031E−12 | −8.33161E−16 |
| Mirror 6 | −1.39031E−01 | 3.43126E−10 | 4.60045E−15 | −6.53939E−20 |
| Mirror 7 | 5.78570E+02 | 2.57528E−09 | 3.83885E−14 | −2.02693E−19 |
| Mirror 8 | −6.96187E−02 | 2.19736E−10 | 3.72967E−16 | 1.51513E−21 |
| Mirror 9 | 2.14467E+00 | 1.04852E−09 | 2.81763E−15 | 1.99872E−20 |
| Mirror 10 | 5.40700E−01 | −5.74797E−10 | −3.19526E−16 | −3.95750E−21 |

| Surface | D | E | F | G |
|---|---|---|---|---|
| Mirror 1 | 8.93385E−22 | −1.43705E−26 | 1.00944E−31 | −1.28239E−37 |
| Mirror 2 | 5.48279E−26 | −1.28956E−31 | 6.35331E−38 | 0.00000E+00 |
| Mirror 3 | 2.07859E−26 | −5.39237E−32 | 3.55065E−37 | 2.29678E−43 |
| Mirror 4 | 3.82440E−23 | 8.41820E−29 | −3.23510E−33 | 0.00000E+00 |
| Mirror 5 | 1.48317E−19 | −4.88263E−23 | 2.75394E−26 | −6.18092E−30 |
| Mirror 6 | 5.47733E−24 | −2.56664E−28 | 6.45932E−33 | −6.55148E−38 |
| Mirror 7 | −2.80256E−23 | 3.79804E−28 | −1.15483E−31 | −6.06768E−37 |
| Mirror 8 | 7.88332E−28 | 4.72725E−32 | −2.42047E−37 | 7.91050E−43 |
| Mirror 9 | 2.86297E−26 | 1.14192E−30 | −7.63438E−37 | 4.45766E−42 |
| Mirror 10 | 8.93037E−27 | −1.25840E−31 | 8.67177E−37 | −3.34533E−42 |

Figure 32:
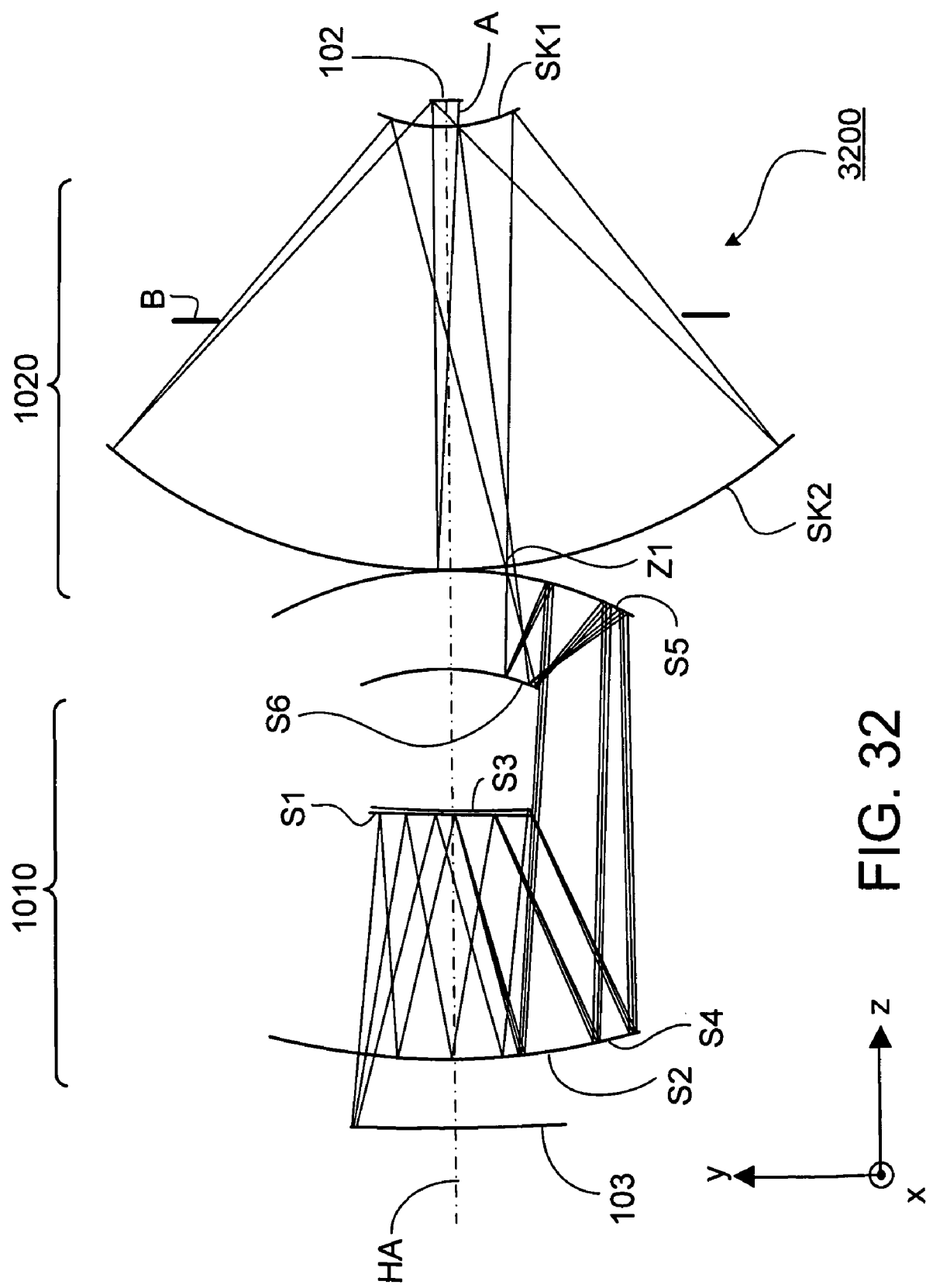
FIG. 32 is a cross-sectional view of a further embodiment of a projection objective shown in meridional section.

Referring to FIG. 32, projection objective 3200 includes eight mirrors S1-S6, SK1, and SK2, and has an image-side numerical aperture of 0.7 at an operating wavelength of 100 nm. Mirrors S1-S6, SK1, and SK2 are all aspherical mirrors. Projection objective 3200 images radiation from object plane 103 to image plane 102 with a demagnification ratio of 8× and a resolution of about 50 nm. The optical axis in relation to which the projection objective is rotationally symmetric is identified as HA, and the overall length of the system from object plane 103 to the image plane 102, the lengthwise dimension, L, is 1,470 mm.

Projection objective 3200 has a ring-segment field. The image-side field width, $d_x$, is 13 mm. The image-side field radius, $d_r$, is 17.5 mm. The image-side field length, $d_y$, is 1 mm. Image-side $W_{rms}$ is 0.14 λ. Image-side field curvature is 125 nm.

The order and curvature of mirrors according to the path of radiation from object plane 103 to image plane 102 is as follows: mirror S1 is a concave mirror; mirror S2 is a concave mirror; mirror S3 is a convex mirror; mirror S4 is a concave mirror; mirror S5 is a concave mirror; mirror S6 is a convex mirror; mirror SK1 is a convex mirror; and mirror SK2 is a concave mirror.

Mirrors SK1 and SK2 include openings. Mirrors S1-S6 do not include openings. The resulting obscuration radius that provides a field-independent obscuration is 57% of the aperture radius.

The image-side free working distance is 30 mm. The object-side free working distance is 100 mm.

The maximum angle of incidence on mirrors S1-S6, SK1, and SK2, of a chief ray of a central field point is 25.4°. The maximum angle of incidence of any ray on mirrors S1-S6, SK1, and SK2, is 32.4°. The maximum range of incident angles on any of mirrors S1-S6, SK1, and SK2, is 20.5°.

The size of the largest mirror in meridional section is 945 mm. The size of the largest mirror in the x-direction is 960 mm.

The mirrors are arranged so that projection objective 3200 contains two partial objectives: a first partial objective 1010 and a second partial objective 1020. Accordingly, projection objective 3200 produces two pupil planes and one intermediate image. At least one of the pupil planes is accessible for positioning an aperture stop. At least one of the pupil planes is accessible for positioning an obscuration stop. For example, an obscuration stop can be positioned on mirror S2.

First partial objective 1010 has a total of six mirrors: mirrors S1-S6. First partial objective 1010 forms an intermediate image Z1 in a position at or near mirror S5. Second partial objective 1020 has a total of two mirrors: mirrors SK1 and SK2. Second partial objective 1020 forms an image at or near the position of image plane 102.

An aperture stop B is positioned between mirrors SK1 and SK2.

Data for projection objective 3200 is presented in Table 23A and Table 23B below. Table 23A presents optical data, while Table 23B presents aspherical constants for each of the mirror surfaces. For the purposes of Table 23A and Table 23B, the mirror designations correlate as follows: mirror 1 corresponds to mirror S1; mirror 2 corresponds to mirror S2; mirror 3 corresponds to mirror S3; mirror 4 corresponds to mirror S4; mirror 5 corresponds to mirror S5; mirror 6 corresponds to mirror S6; mirror 7 corresponds to mirror SK1; and mirror 8 corresponds to mirror SK2.

TABLE 23A

| Surface | Radius | Thickness | Mode |
|---|---|---|---|
| Object | INFINITY | 450.606 | |
| Mirror 1 | −28568.210 | −350.616 | REFL |
| Mirror 2 | 851.174 | 350.616 | REFL |
| Mirror 3 | 442.020 | −350.606 | REFL |
| Mirror 4 | 987.208 | 696.277 | REFL |

TABLE 23A-continued

| Surface | Radius | Thickness | Mode |
|---|---|---|---|
| Mirror 5 | −512.086 | −134.752 | REFL |
| Mirror 6 | −273.167 | 779.239 | REFL |
| Mirror 7 | 348.346 | −282.337 | REFL |
| STOP | INFINITY | −362.208 | |
| Mirror 8 | 724.665 | 674.286 | REFL |
| Image | INFINITY | 0.000 | |

TABLE 23B

| Surface | K | A | B | C |
|---|---|---|---|---|
| Mirror 1 | 0.00000E+00 | 9.08199E−09 | −6.44794E−13 | 2.73864E−17 |
| Mirror 2 | 0.00000E+00 | −3.95755E−09 | −4.59326E−14 | −7.77764E−18 |
| Mirror 3 | 0.00000E+00 | −2.26321E−08 | 2.00888E−13 | 4.01582E−18 |
| Mirror 4 | 0.00000E+00 | −3.58006E−10 | −8.38532E−16 | −4.42394E−20 |
| Mirror 5 | 0.00000E+00 | 1.82876E−09 | 3.83573E−15 | −1.98419E−19 |
| Mirror 6 | 0.00000E+00 | 3.72775E−08 | −9.31689E−13 | 1.99541E−17 |
| Mirror 7 | 0.00000E+00 | 3.17967E−09 | 1.39624E−13 | 2.49821E−18 |
| Mirror 8 | 0.00000E+00 | 9.10620E−12 | 2.42344E−17 | 2.73184E−23 |

| Surface | D | E | F | G |
|---|---|---|---|---|
| Mirror 1 | −9.33644E−22 | 1.62066E−26 | 0.00000E+00 | 0.00000E+00 |
| Mirror 2 | 1.19180E−21 | −6.96128E−26 | 0.00000E+00 | 0.00000E+00 |
| Mirror 3 | −3.30477E−22 | 7.17255E−27 | 0.00000E+00 | 0.00000E+00 |
| Mirror 4 | 4.09594E−25 | −2.20889E−30 | 0.00000E+00 | 0.00000E+00 |
| Mirror 5 | 1.79598E−24 | −5.45453E−30 | 0.00000E+00 | 0.00000E+00 |
| Mirror 6 | −2.45482E−22 | 1.70799E−27 | 0.00000E+00 | 0.00000E+00 |
| Mirror 7 | 1.11591E−22 | 3.21132E−27 | 0.00000E+00 | 0.00000E+00 |
| Mirror 8 | 2.91015E−28 | −7.88285E−34 | 2.39162E−39 | 0.00000E+00 |

Figure 33:
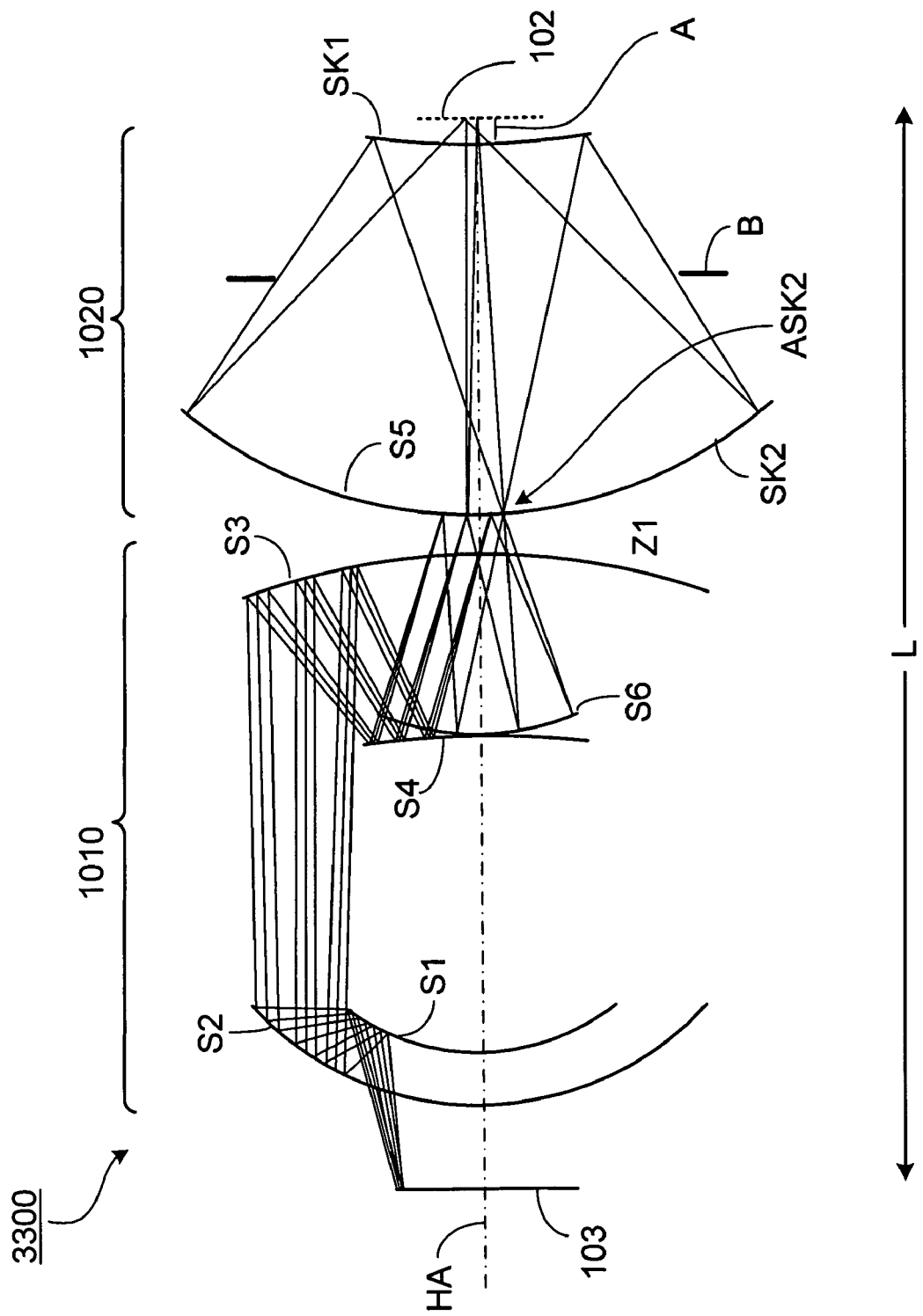
FIG. 33 is a cross-sectional view of another embodiment of a projection objective shown in meridional section.
Figure 21:
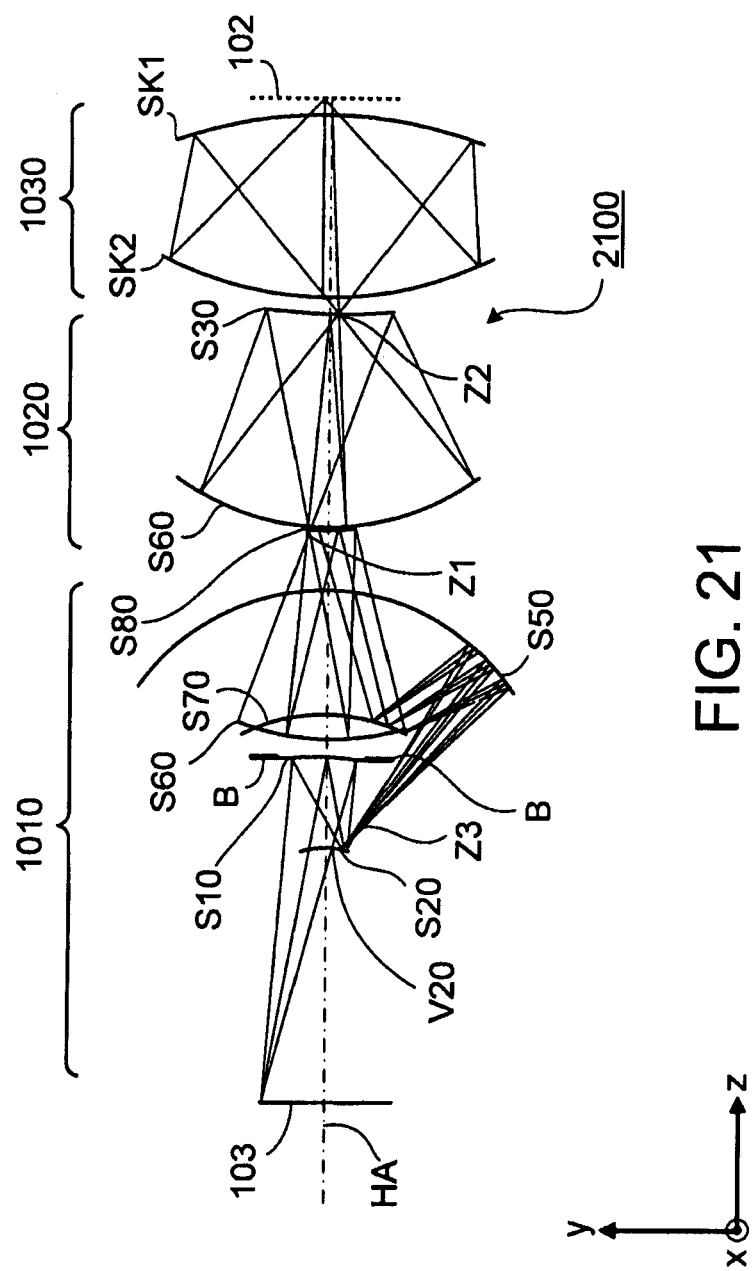
Figure 29:
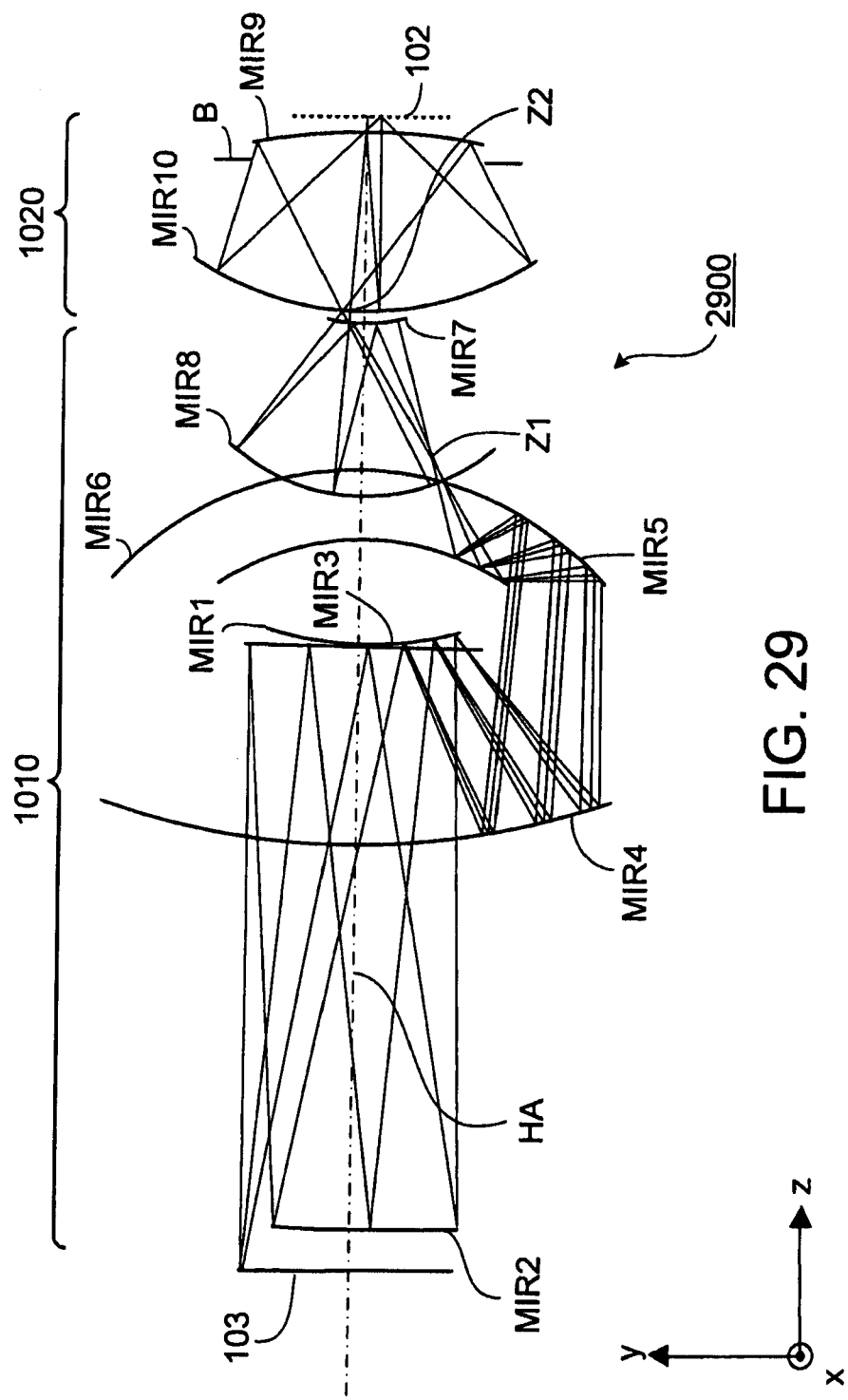
Figure 30:
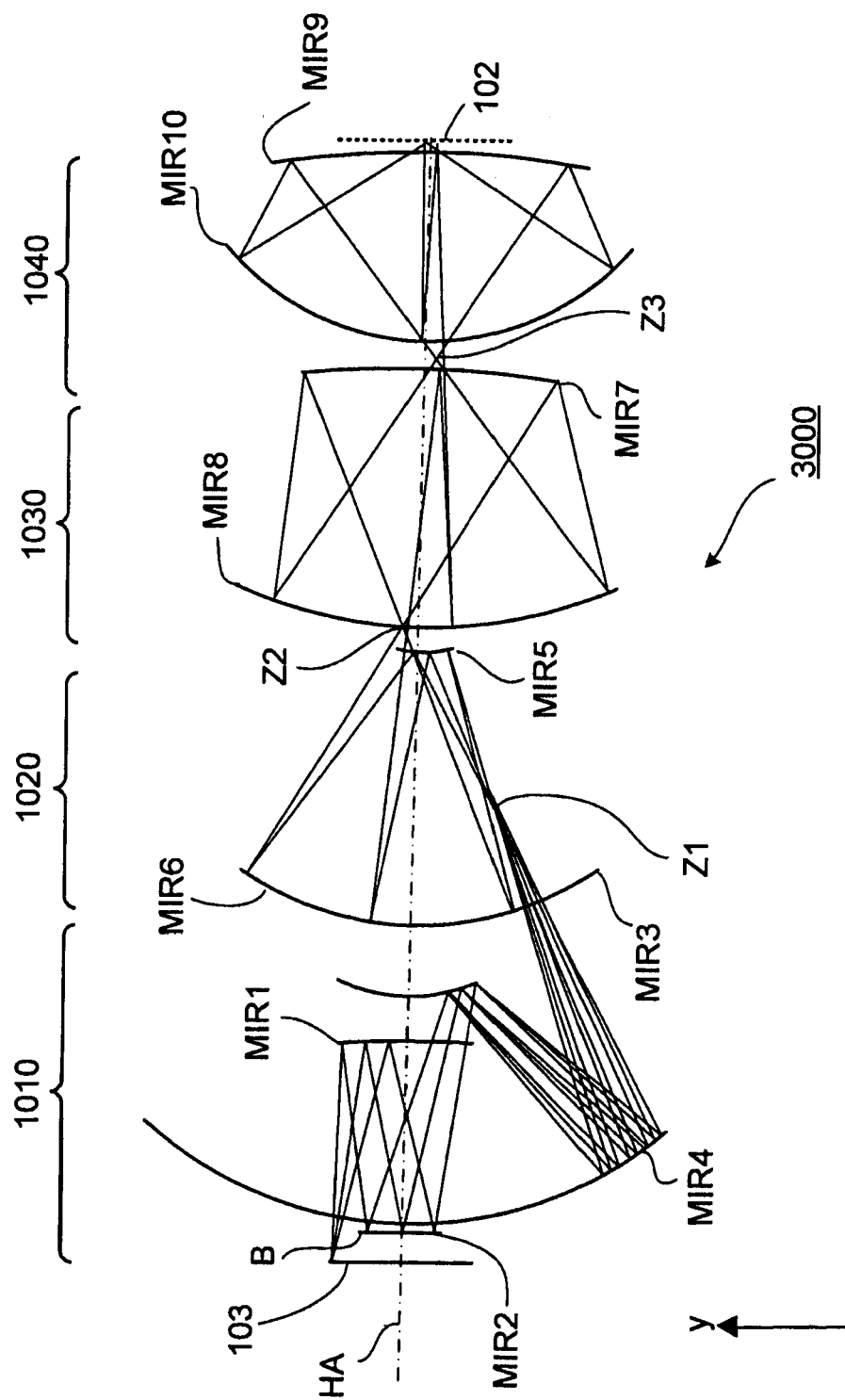

Referring to FIG. 33, an embodiment of a projection objective 3300 includes eight mirrors S1-S6, SK1, and SK2, and has an image-side numerical aperture of 0.7 at an operating wavelength of 100 nm. Mirrors S1-S6, SK1, and SK2 are all aspherical mirrors. Projection objective 3300 images radiation from object plane 103 to image plane 102 with a demagnification ratio of 8× and a resolution of about 50 nm. The optical axis in relation to which the projection objective is rotationally symmetric is identified as HA, and the overall length of the system from object plane 103 to the image plane 102, the lengthwise dimension, L, is 1,300 mm.

Projection objective 3300 has a ring-segment field. The image-side field width, $d_x$, is 13 mm. The image-side field radius, $d_r$, is 12.0 mm. The image-side field length, $d_y$, is 1 mm. Image-side $W_{rms}$ is 0.007 λ. Image-side field curvature is 8 nm.

The order and curvature of mirrors according to the path of radiation from object plane 103 to image plane 102 is as follows: mirror S1 is a convex mirror; mirror S2 is a concave mirror; mirror S3 is a concave mirror; mirror S4 is a convex mirror; mirror S5 is a convex mirror; mirror S6 is a concave mirror; mirror SK1 is a convex mirror; and mirror SK2 is a concave mirror.

Mirrors SK1 and SK2 include openings. The opening in mirror SK2 is labeled ASK2. Mirrors S1-S6 do not include openings. The resulting obscuration radius that provides a field-independent obscuration is 34% of the aperture radius.

The image-side free working distance, A, is 30 mm. The object-side free working distance is 103 mm.

The maximum angle of incidence on mirrors S1-S6, SK1, and SK2, of a chief ray of a central field point is 39.7°. The maximum angle of incidence of any ray on mirrors S1-S6, SK1, and SK2, is 52.2°. The maximum range of incident angles on any mirrors S1-S6, SK1, and SK2, is 23.6°.

The size of the largest mirror in meridional section is 693 mm. The size of the largest mirror in the x-direction is 706 mm.

The mirrors are arranged so that projection objective 3300 contains two partial objectives: a first partial objective 1010 and a second partial objective 1020. Accordingly, projection objective 3300 produces two pupil planes and one intermediate image. At least one of the pupil planes is accessible for positioning an aperture stop.

First partial objective 1010 has a total of six mirrors: mirrors S1-S6. First partial objective 1010 forms first intermediate image Z1 in a position at or near mirror SK2. Second partial objective 1020 has a total of two mirrors: mirrors SK1 and SK2. Second partial objective 1020 forms an image at or near the position of image plane 102.

An aperture stop B is positioned between mirrors SK1 and SK2. An aperture stop can also be located at a position within first partial objective 1010. For example, the aperture stop can be positioned close to or directly on one of the mirrors in first partial objective 1010, such as on mirror S2. The obscuration stop, which defines the pupil obscuration, can likewise be positioned on the same mirror and realized as an anti-reflection coating, for example.

Data for projection objective 3300 is presented in Table 24A and Table 24B below. Table 24A presents optical data, while Table 24B presents aspherical constants for each of the mirror surfaces. For the purposes of Table 24A and Table 24B, the mirror designations correlate as follows: mirror 1 corresponds to mirror S1; mirror 2 corresponds to mirror S2; mirror 3 corresponds to mirror S3; mirror 4 corresponds to mirror S4; mirror 5 corresponds to mirror S5; mirror 6 corresponds to mirror S6; mirror 7 corresponds to mirror SK1; and mirror 8 corresponds to mirror SK2.

Other embodiments are in the claims.

TABLE 24A

| Surface | Radius | Thickness | Mode |
|---|---|---|---|
| Object | INFINITY | 165.327 | |
| Mirror 1 | 249.504 | −62.783 | REFL |
| Mirror 2 | 343.765 | 670.215 | REFL |
| Mirror 3 | −828.212 | −218.641 | REFL |

TABLE 24A-continued

| Surface | Radius | Thickness | Mode |
|---|---|---|---|
| Mirror 4 | −1067.352 | 268.921 | REFL |
| Mirror 5 | 332.014 | −264.244 | REFL |
| Mirror 6 | 338.358 | 712.058 | REFL |
| Mirror 7 | 1159.033 | −164.051 | REFL |
| STOP | INFINITY | −283.661 | |
| Mirror 8 | 567.471 | 477.708 | REFL |
| Image | INFINITY | 0 | |

TABLE 24B

| Surface | K | A | B | C |
|---|---|---|---|---|
| Mirror 1 | 2.99269E−02 | 0.00000E+00 | −2.13755E−13 | 6.46731E−18 |
| Mirror 2 | −3.44285E−01 | 0.00000E+00 | 2.07475E−15 | −1.50695E−19 |
| Mirror 3 | 2.56188E−01 | 0.00000E+00 | 4.13017E−15 | −8.73809E−20 |
| Mirror 4 | 3.72134E+01 | 0.00000E+00 | 1.17208E−13 | −1.00755E−17 |
| Mirror 5 | −2.17361E+00 | 0.00000E+00 | −2.13347E−12 | −1.63109E−17 |
| Mirror 6 | 5.10592E−01 | 0.00000E+00 | 4.64944E−15 | 9.47577E−20 |
| Mirror 7 | 2.30009E+01 | 1.60457E−09 | 7.62848E−15 | 7.32194E−20 |
| Mirror 8 | 1.38025E−01 | −4.77315E−11 | −7.94863E−17 | −1.46539E−22 |

| Surface | D | E | F | G |
|---|---|---|---|---|
| Mirror 1 | −2.49480E−22 | 5.90564E−27 | −7.53450E−32 | 0.00000E+00 |
| Mirror 2 | 1.63388E−24 | −8.61503E−30 | 0.00000E+00 | 0.00000E+00 |
| Mirror 3 | 9.49612E−25 | −4.79993E−30 | 6.26043E−36 | 0.00000E+00 |
| Mirror 4 | 6.10952E−22 | −1.76184E−26 | 2.51233E−31 | 0.00000E+00 |
| Mirror 5 | −6.87493E−20 | 2.30226E−23 | −4.50171E−27 | 0.00000E+00 |
| Mirror 6 | −1.14614E−24 | 9.25629E−29 | 8.23956E−34 | 0.00000E+00 |
| Mirror 7 | 1.10925E−24 | −2.18661E−30 | 9.19421E−34 | 0.00000E+00 |
| Mirror 8 | −3.96589E−28 | −6.93749E−35 | −5.09345E−39 | 0.00000E+00 |

What is claimed is:

1. An objective arranged to image radiation from an object plane to an image plane, comprising:
 a plurality of elements arranged to direct the radiation from the object plane to the image plane,
 wherein the objective has an image side numerical aperture of more than 0.55 and a maximum image side field dimension of 5 mm or more, the objective is a catoptric objective, and the plurality of elements includes at least one element that does not have an opening.

2. The objective of claim 1, wherein the plurality of elements includes no more than six elements.

3. The objective of claim 1, wherein the plurality of elements includes more than six elements.

4. The objective of claim 3, wherein the plurality of elements includes eight elements.

5. The objective of claim 1, wherein the plurality of elements includes at least one element that has an opening for passage of the radiation from the object plane to the image plane.

6. The objective of claim 5, wherein the objective has a field independent obscuration related to the opening that is less than about 40% of an aperture radius at a pupil plane of the objective.

7. The objective of claim 5, wherein the plurality of elements includes two elements that have an opening for passage of the radiation from the object plane to the image plane.

8. The objective of claim 1, wherein the plurality of elements includes six elements that do not have an opening.

9. The objective of claim 1, wherein the plurality of elements includes at least one element that has a concave surface, where the element is arranged so that the radiation contacts the concave surface.

10. The objective of claim 1, wherein the plurality of elements includes four elements that each have a concave surface, where the four elements are arranged so that the radiation contacts each element's concave surface.

11. The objective of claim 1, wherein the plurality of elements includes at least one element that has a convex surface, where the element is arranged so that the radiation contacts the convex surface.

12. The objective of claim 1, wherein the plurality of elements includes four elements that each have a convex surface, where the four elements are arranged so that the radiation contacts each element's convex surface.

13. The objective of claim 1, wherein the plurality of elements comprises a first group of elements and a second group of elements, the first group of elements being arranged to image the radiation from the object plane to a first intermediate-image plane, and the second group of elements being arranged to image the radiation from the intermediate-image plane to the image plane.

14. The objective of claim 13, wherein none of the elements in the first group of elements includes an opening.

15. The objective of claim 13, wherein at least one of the elements in the second group of elements includes an opening for passage of the radiation from the object plane to the image plane.

16. The objective of claim 13, wherein the second group of elements comprises a first sub-group of elements and second sub-group of elements, the first sub-group of elements being arranged to image the radiation from the first intermediate-image plane to a second intermediate-image plane, and the second sub-group of elements being arranged to image the radiation from the second intermediate-image plane to the image plane.

17. The objective of claim 1, wherein the objective defines an optical axis and at least one of the elements is rotationally symmetric with respect to the optical axis.

18. The objective of claim 1, wherein the objective defines an optical axis and at least one of the elements is not rotationally symmetric with respect to the optical axis.

19. The objective of claim 18, wherein at least one element that is not rotationally symmetric with respect to the optical axis corresponds to a portion of a element that is rotationally symmetric about an axis.

20. The objective of claim 1, wherein the plurality of elements comprises at least one aspherical element.

21. The objective of claim 1, wherein each of the elements in the plurality of elements is an aspherical element.

22. The objective of claim 1, wherein, for a meridional section of the objective, the radiation has a maximum angle of incidence on a surface of each of the elements of about 20° or less.

23. The objective of claim 1, wherein, for a meridional section of the objective, the radiation has a maximum range of incident angles on a surface of each of the elements of about 20° or less.

24. The objective of claim 1, further comprising an aperture stop positioned substantially at a pupil plane of the objective.

25. The objective of claim 1, further comprising a stop element positioned substantially at a pupil plane of the objective, wherein the objective defines an optical axis that intersects the stop element.

26. The objective of claim 25, wherein the stop element obscures about 40% or less of an aperture radius at the pupil plane.

27. The objective of claim 25, wherein the stop element is a portion of one of the plurality of elements.

28. The objective of claim 25, wherein the stop element is remote from each of the plurality of elements.

29. The objective of claim 25, wherein the stop element reflects substantially no radiation directed by the elements from the object plane incident on the stop element.

30. The objective of claim 25, wherein the stop element comprises a substrate and a film on the substrate, the film being an anti-reflection film for radiation at $\lambda$.

31. The objective of claim 1, wherein the objective images the radiation to at least one intermediate-image plane in addition to the image plane.

32. The objective of claim 1, wherein a distance from the object plane to the image plane is about 2,000 mm or less.

33. The objective of claim 1, wherein the radiation has a wavelength $\lambda$ of about 200 nm or less.

34. The objective of claim 33, wherein $\lambda$ is in a range from about 10 nm to about 20 nm.

35. The objective of claim 1, wherein the objective has a maximum image side field radius of about 20 mm or less.

36. The objective of claim 1, wherein the objective has a demagnification of about 8× or less.

37. The objective of claim 1, wherein the objective has an image resolution of about 32 nm or less.

38. The objective of claim 1, wherein the objective has an image-side root-mean-square wavefront error of about $0.1\lambda$ or less, where $\lambda$ is a wavelength of the radiation.

39. The objective of claim 1, wherein the objective is telecentric with respect to the image plane.

40. The objective of claim 1, wherein a minimum distance between a surface of the elements and the image plane is about 20 mm or more.

41. The objective of claim 1, wherein each element reflects about 50% or more of the radiation normally incident on a surface of the element.

42. The objective of claim 1, wherein at least some of the elements comprise a plurality of layers of at least two different materials, wherein a thickness of each of the layers is about $\lambda$ or less, where $\lambda$ is a wavelength of the radiation.

43. The objective of claim 42, wherein one of the different materials comprises silicon and another of the different materials comprises molybdenum.

44. The objective of claim 42, wherein the thickness of each of the layers is about $\lambda/4$.

45. The objective of claim 42, wherein the plurality of layers includes about 20 or more layers.

46. A lithography tool, comprising the objective of claim 1.

47. The objective of claim 1, wherein the objective has an image side numerical aperture of about 0.6 or more.

48. The objective of claim 1, wherein the objective has an image side numerical aperture of about 0.65 or more.

49. The objective of claim 1, wherein the objective has an image side numerical aperture of about 0.7 or more.

* * * * *

UNITED STATES PATENT AND TRADEMARK OFFICE
CERTIFICATE OF CORRECTION

PATENT NO. : 7,682,031 B2 Page 1 of 1
APPLICATION NO. : 11/317851
DATED : March 23, 2010
INVENTOR(S) : Hans-Juergen Mann, David Shafer and Wilhelm Ulrich It is certified that error appears in the above-identified patent and that said Letters Patent is hereby corrected as shown below:

On the Title page, Item (56), Page 2, line 19, delete "EP 1093021 4/2001" (duplicate).

On the Title page, Item (56), Page 2, line 4, delete "EP 1450196 8/2004" (duplicate).

Column 18, line 31, delete "dx" insert --$d_x$--.

Column 33, line 54, delete "rayon" insert --ray on--.

Column 48, line 22, after "surface" insert --.--.

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,682,031 B2 Page 1 of 4
APPLICATION NO. : 11/317851
DATED : March 23, 2010
INVENTOR(S) : Hans-Juergen Mann, David Shafer and Wilhelm Ulrich It is certified that error appears in the above-identified patent and that said Letters Patent is hereby corrected as shown below:

Delete FIGS. 21, 29 and 30 and insert new FIGS. 21, 29 and 30.

Signed and Sealed this

Third Day of August, 2010

David J. Kappos
*Director of the United States Patent and Trademark Office*